United States Patent
Williams et al.

(10) Patent No.: US 7,075,145 B2
(45) Date of Patent: Jul. 11, 2006

(54) POLY-SEALED SILICIDE TRENCH GATE

(75) Inventors: Richard K. Williams, Cupertino, CA (US); Michael E. Cornell, Campbell, CA (US); Wai Tien Chan, New Territories (HK)

(73) Assignees: Advanced Analogic Technologies, Inc., Sunnyvale, CA (US); Advanced Analogic Technologies (Hong Kong) Limited, Kowloon (HK)

( * ) Notice: Subject to any disclaimer, the term of this patent is extended or adjusted under 35 U.S.C. 154(b) by 169 days.

(21) Appl. No.: 10/768,243

(22) Filed: Jan. 29, 2004

(65) Prior Publication Data

US 2004/0183129 A1 Sep. 23, 2004

Related U.S. Application Data

(62) Division of application No. 10/383,231, filed on Mar. 5, 2003.

(51) Int. Cl.
*H01L 29/76* (2006.01)

(52) U.S. Cl. .................. 257/329; 257/332; 257/328; 438/212

(58) Field of Classification Search .......... 257/328, 257/329, 332; 438/212
See application file for complete search history.

(56) References Cited

U.S. PATENT DOCUMENTS

| | | | |
|---|---|---|---|
| 6,180,979 B1 | 1/2001 | Hofmann et al. | |
| 6,291,298 B1 | 9/2001 | Williams et al. | |
| 6,303,436 B1 | 10/2001 | Sung | |
| 6,413,822 B1 | 7/2002 | Williams et al. | |
| 6,476,443 B1 | 11/2002 | Kinzer | |
| 6,661,053 B1 | 12/2003 | Willer et al. | |
| 6,673,680 B1 | 1/2004 | Calafut | |
| 6,717,210 B1 | 4/2004 | Takano et al. | |
| 2003/0080379 A1 | 5/2003 | Oikawa et al. | |
| 2003/0178873 A1 | 9/2003 | Bhalla et al. | |
| 2004/0058481 A1 | 3/2004 | Xu et al. | |

*Primary Examiner*—Fetsum Abraham
(74) *Attorney, Agent, or Firm*—David T. Millers

(57) ABSTRACT

Power MOSFETs and fabrication processes for power MOSFETs use a continuous conductive gate structure within trenches to avoid problems arising from device topology caused when a gate bus extends above a substrate surface. The gate bus trench and/or gate structures in the device trenches can contain a metal/silicide to reduce resistance, where polysilicon layers surround the metal/silicide to prevent metal atoms from penetrating the gate oxide in the device trenches. CMP process can remove excess polysilicon and metal and planarize the conductive gate structure and/or overlying insulating layers. The processes are compatible with processes forming self-aligned or conventional contacts in the active device region.

15 Claims, 36 Drawing Sheets

POLY-SEALED SILICIDE TRENCH GATE

CROSS-REFERENCE TO RELATED PATENT APPLICATION

This is a divisional and claims the priority of U.S. patent application Ser. No. 10/383,231, filed on Mar. 5, 2003.

BACKGROUND

The fabrication of trench-gated devices is common to many high performance power semiconductor devices today. Such devices include the trench-gated vertical power MOSFET (a.k.a. trench DMOS, trench FET, UMOS, etc.) and its many variants and derivatives, relying on vertical current flow through a semiconductor from a topside metal contact to a metalized backside contact whereby the potential on a trench-embedded gate electrode controls the current in said device. Such embedded trench gates actually include the gate electrode of a MOSFET whose channel is electrically induced on the sidewall of an etched silicon trench perpendicular to the wafers surface. Devices employing a trench-gated vertical channel differ dramatically from conventional MOSFETs whose gate is located above and parallel to the wafer's surface (rather than inside a trench etched into the silicon). The vertical channel allows more MOSFET gate width W to be formed in a given area of silicon real estate. The greater channel density in turn achieves a lower resistance MOSFET than devices having less gate perimeter in the same area. Such conventional trench-gated power MOSFETs are well known in the art, being manufactured since the early 1990's.

As shown in the fabrication sequence of FIGS. 1A to 1H, manufacturing a trench-gated vertical MOSFET requires a polysilicon trench gate electrode to be formed and embedded in an oxide-lined etched silicon trench. One complexity in the fabrication involves etching the trench, oxidizing it with a high quality oxide and filling the trench with a highly doped layer of polysilicon. For example, in FIG. 1A, silicon substrate having N-type epitaxial layer 10 is masked and patterned by mask layer 11 (e.g., photoresist or an etched oxide hard mask) to expose the silicon surface to etching in mask opening 12. The silicon is then etched using a reactive-ion-etch (RIE) to form a trench typically of dimensions approximately 1.5 to 2 μm in depth and 0.8 to 0.3 μm in width. The trench is then oxidized, and the oxide is removed (to eliminate crystal defects resulting from the etching process). The trench is then re-oxidized to form gate oxide 16, with a thickness between 100 Å to 1000 Å and typically around 250 Å to 500 Å. As shown in FIG. 1B, the trench is then filled with polysilicon layer 13 to a thickness sufficient to fill the trench in a void-free manner (having an embedded polysilicon portion 17A) and extend out of the trench and above the wafer's surface (so that the surface of polysilicon layer 13 becomes relatively flat).

Another challenge during wafer fabrication involves the steps of etching this gate polysilicon down into the trench and sealing it with an insulator so that it doesn't electrically short to a thick layer of source metal, said metal being formed subsequent to the trench gate and covering much of the wafer's surface. In FIG. 1C, this refill process sequence involves masking and etching back the polysilicon layer into the trench so that only the embedded portion 17A of the polysilicon gate remains in the active device array. After the polysilicon etch back, the polysilicon gate may be co-planer with the surface but typically is etched down into the trench (by less than about 0.4 μm) leaving depression 19 atop the trench. Then as shown in FIG. 1D, the silicon and polysilicon surfaces are thermally oxidized to form oxide layer 20 (having a thickness of 100 to 400 Å), followed by boron body implant 21A and 21B into all the active silicon mesa regions, typically having an implant dose of 8E12 cm$^{-2}$ to 3E14 cm$^{-2}$ at an energy of 80 to 120 keV to form a shallow implanted layer. This layer is subsequently diffused at a high temperature of 900° C. to 1150° C. for 3 to 15 hours to form the active channel region of the device P-type body region $P_B$ 20A and 20B, as shown in FIG. 1E. The depth of body regions 20A and 20B are typically 80 to 85% of the depth of the trench. Heavily doped N+ source regions 25A and 25B are then implanted typically with a dose of 5E15 cm$^{-2}$ (or greater) of arsenic at 80 to 120 keV. Glass layer 20, e.g., comprising BPSG (borophosphosilicate glass), is then deposited and masked by a contact mask to expose a portion of the N+ silicon mesa regions 25A and 25B as shown in FIG. 1F, followed by metallization with 1 to 4-μm thick aluminum, Al—Si, or Al—Cu—Si layer 31.

Although the metal is subsequently masked and etched to separate gate and source metal connections, in the active cell array shown in FIG. 1H, the entire array is metalized by source metal layer 31. In every cell, glass capping layer 30 must prevent electrical shorts between source metal 31 and all the embedded polysilicon gates 17A, 17B, and 17C. If any one cell out of millions of cells comprising a single device becomes shorted, the entire device is ruined.

To further complicate the structure and its manufacturing, MOSFET 50 in FIG. 2A has a polysilicon gate electrode 54A and 54B that extends beyond the confines of the trenches and overlap up and onto the silicon surface, typically upon a thick field oxide region 53. The portion 55 of the polysilicon gate extending outside the trench is needed at least in one location in a device to facilitate gate contact between the embedded portions 54A and 54B of polysilicon gate and a metalized gate bonding pad (not shown). The field oxide 53 helps minimize the gate to source capacitance.

Outside the trench and atop field oxide 53, the polysilicon region 55 may extend for significant distances on and along the die's surface (i.e., outside the trench) to aid in the propagation of gate signals, i.e., to "bus" a signal, across a large area power device. Such polysilicon gate bus regions may be shorted by the topside metal along their entire length. But, since most vertical power devices employ a single layer metal process (the metal generally being several microns thick), such gate bus regions can only be metalized by interrupting the source metal. Source metal ideally, however, should cover the die's surface to its maximum possible extent (for the lowest possible resistance device). The need for a metalized gate bus therefore conflicts with the need for uninterrupted top source metal, forcing an undesirable tradeoff between fast switching speeds and the lowest possible resistance device.

The requirement for a metalized gate bus originates from the high sheet resistance of the device's embedded polysilicon gate. Even in-situ doped N+ polysilicon exhibits a high sheet resistance of 30 ohms per square, preventing signals from being bussed over intra-chip dimensions at high speeds without the assistance of regularly-distributed metalized gate-bus structures.

Also, in vertical MOSFET 50 in FIG. 2A, embedded polysilicon 54B extends out of the trench as polysilicon portion 56 crossing active area 57 before stepping up onto field oxide 53. Since the polysilicon crosses over active area 57 and thin gate oxide 62B, deep P+ region 52 must be formed beneath region 57 to prevent the thin oxide from permitting high electric fields. To form the deep P+ region 52 beneath polysilicon 56 by conventional implant and diffusion methods, the implant must precede the deposition of the polysilicon layer, preventing deep P+ region from using the same implants used to form P-type body regions 60A and 60B. Moreover, deep P+ must also precede field oxide 53 if it is to extend beneath the field oxide 52.

A difficulty with manufacturing MOSFET 50 of FIG. 2A is the non-planar topography present during critical photolithography and planarization operations. The depression of the etch-back region 66, for example, is difficult to etch uniformly. The thicker the layer of polysilicon and the thicker the field oxide, the larger the step heights present in the topography of the wafer during subsequent processing. Extreme topography can create problems during photomasking, during etching, and during planarization operations, and virtually precludes the use of chemical mechanical polishing (CMP) techniques. Large step heights may also lead to step coverage problems for depositions and conformal coatings.

Other complications in trench MOSFET manufacturing may occur at any number of steps in the fabrication sequence, and may later exacerbate issues with trench filling, planarization, and topography. For example in FIG. 2B, device 70 includes an array of trenches 73A, 73B, and 73C spaced at regular intervals as defined by mask 72A, 72B, 72C and 72D. Trench 73C represents the last trench of the regular array, whereas trench 73D represents a more distant trench, either as part of a gate bus region or a termination region distinct from the repeated array. During processing, the last trench in the array and the isolated trench regions 73C and 73D may etch differently from the regular array. Non-symmetric features 75 in trench 73C and feature 76 in trench 73D may result from optical effects during photolithography and also from micro-loading effects during etching. The misshaped trenches become very difficult to planarize using polysilicon overfill and etch-back methods since the trench opening is wider than the other trenches within the device.

Even without misshaped trenches planarization using etch-back can be challenging. FIG. 2C illustrates trench 81 (etched into epitaxial layer 80), lined with gate oxide 82 and filled with polysilicon 83. Deposited oxide 84 is then deposited and etched back to protect the embedded gate from shorting to the top metal. After deposition the surface is relatively planar compared to the thickness of the deposited glass 84. After etch-back for time $t_1$ the depression over the trench remains constant even though the layer is now thinner. After another time $t_2$, the depressed array nearly extends into the trench, despite the fact that the silicon mesa is not yet clear of oxide. After an additional time $t_3$, the mesa has been cleared of the deposited glass but only a small amount of the deposited oxide remains atop the trench gate. The dielectric thickness is thinnest in the center of the trench and remains thicker adjacent to the trench sidewalls, resulting in much less planarization than might otherwise be expected using etch-back methods. This etch-back process results in all or part of top oxide 84 shown in FIG. 2D.

Later oxide 90 is deposited, masked and etched by a contact mask and subsequently flowed at a high temperature to round its shape. After completing contact mask metallization 87 completes the structure.

As shown in the drawing of FIG. 2D, several problem areas may occur in such a device. Curvature at the bottom of the trench in region 100, for example, may lead to gate oxide thinning and low gate breakdown voltages. Using only aluminum as the metallization, metal spike 102 may alloy through the N+ junction 86 and producing undesirable junction leakage. Furthermore, polysilicon gate 83 must vertically overlap the bottom of N+ source 86 in region 102 or the MOSFET will not operate properly (causing high on-resistance and possible loss of functionality).

In FIG. 2E, a TiN layer 88 is deposited after the contact mask but prior to deposition of metal layer 87. The titanium nitride layer blocks the aluminum metallization from alloying through the junction thereby eliminating metal spiking. If the step height of the oxide cap 90 atop the trench is too steep, the TiN layer 88 may crack, and spike 104 may result. In each case shown, poor planarization leads to defects, poor uniformity, and yield loss.

The problem of topography complicating planarization is further illustrated in FIG. 3A, which shows a cross section 120 of an active trench array of trenches 123A, 123B, and 123C along with gate bus area 124, just after polysilicon deposition and partial etch-back producing a polysilicon gate bus 131G of thickness x atop oxide 125. If thickness x is minimized to prevent step height related step coverage problems later, the depth of the surface depressions 135A, 135B, and 135C at the top of the active polysilicon trench gates will be extreme and may be difficult to fill later.

Cross section 160 shown in FIG. 3B illustrates the contrasting case where the polysilicon layer of thickness x is sufficiently thick to exhibit a more planar surface over the trenches, whereby depressions 162A, 162B, and 162C are at a minimum. FIG. 3C illustrates a benefit of using very thick polysilicon in device 160 is the relatively good planarization results and uniform etch-back of embedded polysilicon regions 166A and 166B. Thick polysilicon, e.g., over 1 to 1.5 µm thick, requires long processing time, adversely adding to wafer costs. More significantly, another problem with such a thick polysilicon layer is also revealed in FIG. 3C, where polysilicon gate bus 165 comprising embedded portion 166C and surface portion 167 produces two extreme steps in the wafer's topography: step 180A over active areas and step 180B on top of field oxide 181. Either location may later cause problems with glass depositions, TiN metallization, or metal breakage.

FIGS. 4A to 4J illustrate the fabrication sequence of a trench-gated MOSFET with a self-aligned contact as disclosed in U.S. Pat. No. 6,413,822, entitled "Super-Self-Aligned Fabrication Process Of Trench-Gate DMOS With Overlying Device Layer", which is hereby incorporated by reference in its entirety. The self-aligned contact method allows the contact feature to be opened over the entire active device array device without leading to gate-to-source shorts. This feature allows improved body contact and/or denser trench array cell features and smaller devices. In the fabrication sequence, FIG. 4A illustrates MOSFET trench cell region 200 in which a composite hard mask comprising oxide 205, silicon nitride 206, and top oxide 207 is patterned by photolithographic means and then used to act as a hard mask for silicon trench etching to produce trench feature 201. Gate oxide 204 is then formed after appropriate sacrificial oxidations. Unlike in other trench fabrication sequences, in the sequence beginning in FIG. 4A, the hard mask remains on the silicon during subsequent processing. In FIG. 4B, thick bottom oxide 211 is deposited directionally using CVD. Additional oxide 210 then forms atop the hard mask during said directional deposition with little or no deposition on the trench sidewall.

In FIG. 4C, polysilicon 215 is deposited to fill the trench to a thickness that overflows the trench and deposits above the silicon surface. The polysilicon overflow is then etched back to form embedded polysilicon 215 as shown in FIG. 4D, top oxides 210 and 207 are removed as shown in FIG. 4E, and a P-type body region is implanted through nitride 206 into the silicon mesa regions interposing the trenches as shown in FIG. 4F. The body may be implanted at a shallow depth with a low energy ion implant (i.e., with under 150-keV boron ions) then diffused to a depth of substantially 85% of the trench depth, or alternatively, the body may be entirely implanted using a chain-implant of multiple boron implantations of differing energies (ranging from up to 2 MeV for the deepest portions to 150 keV for the shallowest portions) all through a common mask opening.

After the body implant, in steps not shown, a second polysilicon layer is deposited, masked, and etched back to leave polysilicon only in the surface gate bus regions and where the trench polysilicon connects to the polysilicon gate bus. After the second polysilicon etch-back, thermal oxide 226A is grown followed by glass or BPSG deposition of dielectric 225A as shown in FIG. 4G. In FIG. 4H, dielectric 225A is etched back below the surface of original nitride hard mask 206. Thereafter, nitride hard mask 206 is removed to result in the structure of FIG. 4I where only a small portion of glass 225A remains above the trench. In device 240 of FIG. 2J which represents an array of active trench devices 220, the contact mask (needed to contact gate bus regions not shown in the cross section) opens all the active areas to the contact etch but removes minimal amounts of oxide so as to avoid shorts to embedded polysilicon 215. Thereafter, TiN 230 and top metal 231 are deposited, patterned, and etched.

In FIG. 5A, the gate bus region of the same device is illustrated after the second polysilicon deposition and masked etch back. Polysilicon gate bus 226B remains on the surface of the device while only a small portion of the second polysilicon 226A may survive etch back inside the trench itself. The final polysilicon etch back uniformity is critical since any polysilicon protruding from a trench will short the device's gate to its source metal. Only etch back methods may be employed to planarize the polysilicon since the surface of the device is not planar, having various steps, and topographic features above and below the wafer's surface. Such topography prevents the use of chemical mechanical polishing (CMP) techniques, since mechanical planarization of the trench polysilicon would remove the gate bus entirely from the device's surface.

With such uneven topography, the need for glass 225A (shown after its deposition in FIG. 5B) becomes tantamount for preventing step coverage problems. The glass 225A is flowed as illustrated in FIG. 5C using a short yet relatively high-temperature furnace operation (typically 900° C. for 15 minutes) and patterned as shown in FIG. 5D according to a contact mask. FIG. 5D illustrates the contact to the gate bus (above the silicon surface), and the large self-aligned contact open across the top of all the active trench cells. The contact masking operation is complicated by the two distinct heights of the active array and the gate bus regions, but since no critical feature is present within the cell array, the contact etch operation is possible provided across-the-wafer uniformity is not at issue.

In FIG. 5E, TiN barrier metal is deposited to a thickness sufficient to prevent metal spiking in the contact windows and to cover the topographical steps, but thin enough not to crack from film stress. In FIG. 5F the thick metal, typically Al—Cu or Al—Cu—Si is deposited to a thickness of about 3 μm, masked and etched. Metal 270A represents the source metal, where 270B is the gate contact or gate bus.

FIG. 6A illustrates a plan view of a trench gated power MOSFET having a source metal electrode 283, a metalized gate pad 280, and a gate bus 281. A gap 282 separates the two metals and prevents shorting. The drain contact is made to the wafer's backside. FIG. 6B illustrates another trench MOSFET, having three separate source metals 285A, 285B and 285C, broken into islands by gate metal comprising metal gate ring 286A and busses 286B and 286C connected to metalized bonding pad 284. In such a device the separate source regions are not electrically shorted until wire bonding and packaging.

Device areas can be substantial with dimensions spanning several millimeters across a die. Uniformity across a die and across a wafer can therefore be problematic in achieving highly manufacturable products. Typical uniformity issues can manifest themselves as irregular and random metal voids such as 300A and 300B in contact openings of a device 290 of FIG. 7A. Even in a MOSFET 310 having self-aligned contacts as shown in FIG. 7B, polysilicon deposition, oxidation and etch back can lead to "horns" and other irregular etch features like the top of polysilicon gate 314B and voids as shown in gate region 314C.

Topography can also lead to steps coverage and depth of focus problems for photolithography, including potential gate shorting in region 350, TiN cracking (region 351 and 353), and metal thinning and reentrant angles over steep steps 352 and 354 as shown in FIG. 7C. All these failures may compromise the performance, yield, or reliability of a trench MOSFET. The problems are greatly exaggerated by the non-planar surface of the device, requiring photolithographic-masking, etching, etch backs, planarization, and depositions to behave similarly (or identically) on different heights within a single device.

Not only does the extreme topography of today's vertical trench power MOSFET processes limit the device's cell density and performance, its high intrinsic gate resistance limits its switching speed, mandating the need for additional metalized gate bus regions. The schematic of FIG. 8A, representing an array of MOSFETs can be used to examine how distributed gate resistance affects the switching speed of large area power MOSFETs. The lumped element of a single three-terminal power MOSFET 360 comprises an array of identical MOSFETs 362, whereby transistors $M_1$ through $M_n$ are connected with their source-drain terminals in a parallel network configuration sharing a common source electrode 366 and a common drain electrode 368. Although the devices also share a common gate connection 365, the gate resistance is not constant for the various devices. Devices near a gate bus, e.g. $M_1$, conduct the gate signal through a small series gate resistance of $r_{g1}$ where device $M_2$ exhibits a higher series gate resistance of $(r_{g1}+r_{g2})$. With a higher gate resistance, the more remote device switches slower than those devices located nearest the gate bus. Cell $M_n$, farthest from the gate bus having a series gate resistance of $(r_{g1}+r_{g2}+ \ldots +r_{gn})$ can suffer serious gate propagation delays, even switching ten times slower than cells near the metalized gate bus. So the farthest device from the metalized gate bus is slowest in both turn-on and turn-off transients, being the last device to turn on during a turn-on transient and the last device to turn off during a turn-off transient. As illustrated in plot 370 of FIG. 8B, driving gate input signal 371 from "on" to "off", and then to "on" again causes drain current through a resistive load to roughly "follow" the input waveform after some time delay. In ideal case 373, the drain current changes quickly after the input transition. In drain current waveform 372, which includes distributed gate resistance, the device experiences a turn-off delay $t_d(off)$ followed by a slow fall in current $I_D$ for duration $t_{fall}$, the fall time of the device. Turn on has a similar response with a delay $T_d$(on) followed by a slow ramp up in current for duration $t_{rise}$, the rise time of the device. During slow transients, the simultaneous presence of both voltage across the device and current through the device greatly increases power losses in the device and lowers the efficiency of using such a switch in many applications. The effective gate resistance can be reduced by including gate busses regularly and more frequently throughout the device, but only by sacrificing area from active device arrays for gate bussing. More gate bussing and less active cells increases the switch's on-resistance or die size, and therefore cost. Moreover the gate bus regions exacerbate the non-planar topography issues that further limit device density and performance improvements.

What is needed is a vertical trench-gated power MOSFET capable of integrating large arrays of active vertical MOSFETs at high densities with integral gate bus and gate contact structures in an area efficient device having a relatively flat or planar surface topography. Ideally, the device should offer the lowest possible series gate resistance for fast switching capability, and exhibit low drain-to-source area-specific on-resistance. Finally, the fabrication of such a device should accommodate processes for achieving better film planarization uniformity than that of standard etch back methods.

SUMMARY OF INVENTION

A trench-gated vertical power MOSFET and fabrication processes for such power MOSFETs use a continuous conductive gate structure within trenches to avoid problems that topology causes when a gate bus extends above a substrate surface. The conductive gate structure forms gates in device trenches in an active device region of the power MOSFET and forms a gate bus in a gate bus trench. The gate bus trench that connects to the device trenches can be wide to facilitate forming a gate contact to the gate bus, while the device trenches are narrow to maximize device density. CMP processes can be used to planarize the conductive gate structure and/or overlying insulating layers, and the processes are compatible with processes forming self-aligned or conventional contacts in the active device region.

In one specific embodiment of the invention, a power MOSFET includes a substrate having a gate bus trench and one or more device trenches and extending from a top surface of the substrate. In each mesa adjacent and/or between the device trenches, a source region, a channel region, and a drain region are arranged vertically along at least a portion of a wall of the device trench next to the mesa. A gate structure extends continuously in the device and gate bus trenches, and the top surface of the gate structure does not extend above the top surface of the substrate. Portions of the gate structure in the device trenches act as a gate of vertical devices in the wall of the trench, and a portion of the gate structure in the gate bus trench forms a gate bus. A gate contact contacts the gate bus in the gate bus trench. The gate bus trench is generally made wider than the device trenches to facilitate creation of the gate contact while still maximizing the density of vertical devices. Also, the device trenches can be deeper than the gate bus trench and the substrate under the gate bus trench can be doped to reduce gate-to-drain or gate-to-source capacitance.

Power MOSFETs in accordance with alternative embodiments of the invention can employ a variety of contact structures. Conventional non-self-aligned gate and source contacts can be formed through a planarized insulating layer to the gate bus in the second trench and source regions in the substrate. The planar topology provided by CMP processes that the in-trench gate structure allows facilitates accurate etching of contact openings.

In an architecture having self-aligned source contacts, an insulating material residing in the trenches above the gate structure, has a top surface of the insulating material that is coplanar with the top surface of the substrate. A metal contact layer formed on the planar surface of the substrate and the insulating material includes a source contact region that contacts the source region of the vertical device formed in the substrate's mesa. The insulating material in the trenches prevents the source contact region from shorting to the gate structure. A gate contact region of the metal layer contacts the gate bus through an opening formed through the insulating material in the gate bus trench.

In another self-aligned contact structure, insulating regions extend above the trenches. These insulating regions remain from a CMP planarization that removes insulating material down to a hardmask that was used to define the boundaries of the trenches. After the planarization and removal of the hardmask, insulating regions remain and can be flowed to improve insulation between an overlying metal source contact region and the gate structure in the device trenches.

The conductive gate structure generally includes a continuous polysilicon region that extends from the device trenches into the gate bus trench. Additionally, metal or silicide can be deposited in the gate bus trench, the device trenches, or both. Deposition of a first polysilicon layer before and after deposition of a high-temperature metal can enclose the metal or silicide to prevent metal diffusion into the gate oxide in the device trenches. Alternatively, the metal or silicide can directly contact oxide in the trenches if only lower temperature processes are employed after deposition of the metal.

Another specific embodiment of the invention is a fabrication process for a power MOSFET. Generally, the fabrication process includes device and gate bus trenches in a substrate, which may include an epitaxial layer. A conductive gate structure is then formed that extends continuously from the device trenches into the gate bus trench. Doping of a mesa in the substrate adjacent to a device trench forms a vertical device including a source region, a channel region, and a drain region that are vertically aligned along a wall of the device trench. The process creates a structure including the conductive gate structure in the trenches and permits a chemical mechanical polishing (CMP) of the structure. Thus, formation of a contact layer is after the CMP process, which improves the reliability of the source contact to the vertical devices and the gate contact to the gate structure in the gate bus trench. The gate bus trench is generally shallower and wider than the device trenches.

A variety of processes for trench formation are available. One embodiment of the invention uses LOCOS to oxidize the substrate in the area of gate bus trench, and the gate bus trench remains after removing an oxide region formed by LOCOS in the substrate. Alternatively, the device and gate bus trenches can be formed via separate mask and etch processes.

The process of forming contacts generally includes forming an insulating layer overlying the conductive gate structure. A contact etch can create an opening through the insulating layer to expose a portion of the conductive gate structure in the gate bus trench, and a gate contact region filling the opening contacts the exposed portion of the gate structure in the second trench. The contact etch can also form a second opening through the insulating layer that exposes the mesa, so that a source contact region filling the second opening contacts the sources of the vertical devices. In an alternative embodiment the CMP removes the insulating layer from above the mesa, so that depositing a metal contact layer on the planarized surface creates self-align source contacts.

In yet another embodiment of the invention, a hardmask having openings that define boundaries of the first and second trenches provides an etch stop for the CMP process. The CMP process exposes regions of the hardmask overlying the mesas in the active device region and leaves the regions of the insulating layer in the openings in the hardmask. Removing the hardmask without removing the regions of the insulating layer left after the CMP process exposes the mesa while leaving additional insulating material protecting the gate structure in the device trenches. The contact layer thus contacts the mesa where the regions of the hardmask were removed and the regions of the insulating layer separate the gate structure in the device trenches from the contact layer.

BRIEF DESCRIPTION OF THE DRAWINGS

FIGS. 1A to 1H are cross-sectional views illustrating a fabrication sequence of a conventional vertical trench-gated power MOSFET (active device array only), in which FIG. 1A illustrates a trench mask, FIG. 1B illustrates post trench polysilicon fill, FIG. 1C illustrates polysilicon etch back, FIG. 1D illustrates shallow body ion implantation, FIG. 1E illustrates body diffusion and source ion implantation, FIG. 1F illustrates glass deposition and contact mask, FIG. 1G illustrates post-metallization (for a single cell), and FIG. 1H illustrates post metallization (array of cells).

FIG. 2A shows the complexity of gate bus topography and polysilicon etch back into trench, FIG. 2B illustrates trench uniformity issues, FIG. 2C illustrates trench top oxide etch back uniformity issues, FIG. 2D illustrates contact metal spiking and oxide defects, and FIG. 2E illustrates titanium nitride cracking and metal spiking.

FIG. 3A illustrates poor trench fill resulting from inadequate polysilicon trench fill process, FIG. 3B illustrates improved trench fill using thick polysilicon deposition, and FIG. 3C illustrates step-height problem of thick polysilicon trench refill.

FIGS. 4A to 4J illustrate a fabrication sequence for a high-density-capable vertical trench-gated power MOSFET with self-aligned contact (active device array only), in which FIG. 4A illustrates a trench etch with a hard-mask, FIG. 4B illustrates directional deposition of a thick bottom oxide, FIG. 4C illustrates a first polysilicon trench fill, FIG. 4D illustrates a first polysilicon etch-back, FIG. 4E thick bottom oxide top oxide removal, FIG. 4F thick bottom oxide a diffusion-less chained body implant using multiple high-energy ion implantations, FIG. 4G illustrates a source implant and glass deposition, FIG. 4H illustrates a glass etch-back, FIG. 4I illustrates removal of the top nitride hard-mask, and FIG. 4J illustrates contact and metallization in the active array of devices.

FIG. 5A illustrates an N+ implant after a second polysilicon deposition and masked etch-back, FIG. 5B illustrates glass deposition, FIG. 5C shows the result glass flow, FIG. 5D shows the result of a contact mask etch, FIG. 5E illustrates a nitride strip and TiN barrier deposition, and FIG. 5F illustrates metal deposition, masking, and etching.

DETAILED DESCRIPTION OF INVENTION

Figure 1A:
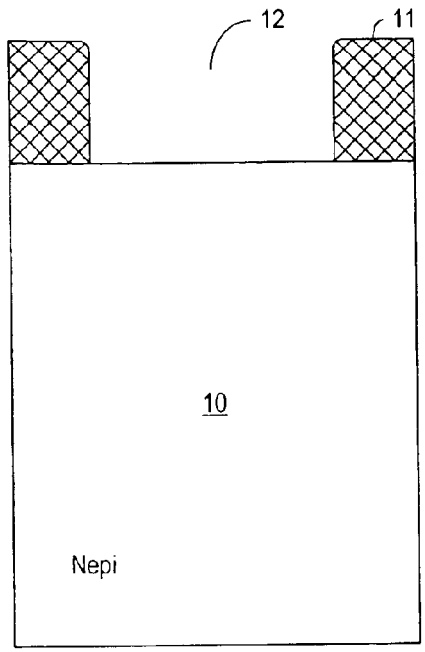
Figure 1B:
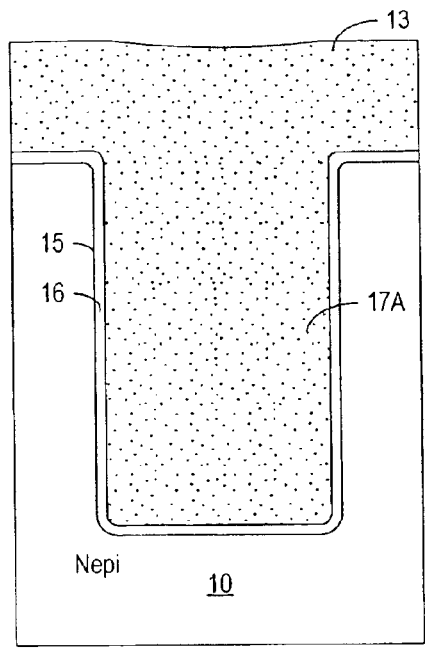
Figure 1C:
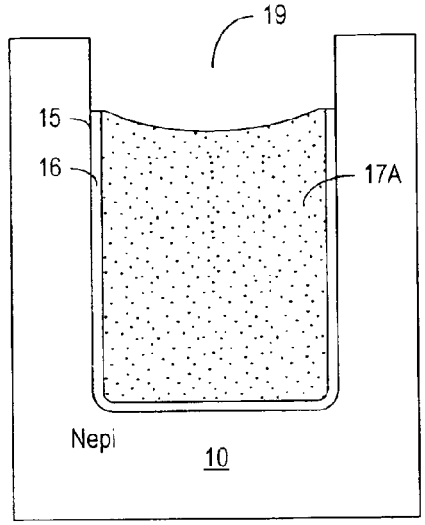
Figure 1D:
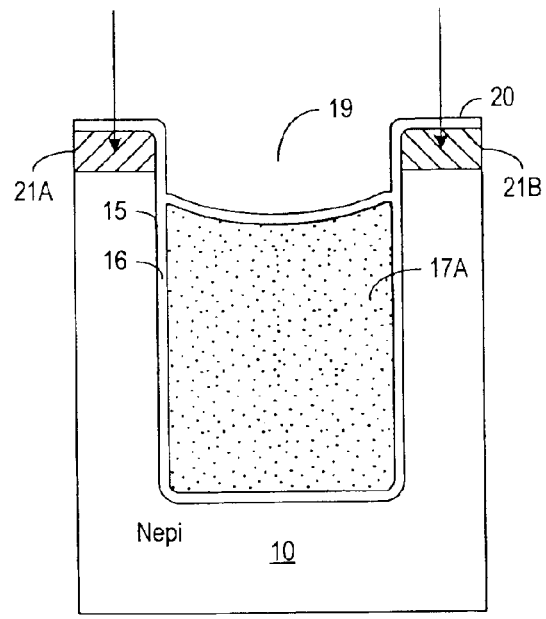
Figure 1E:
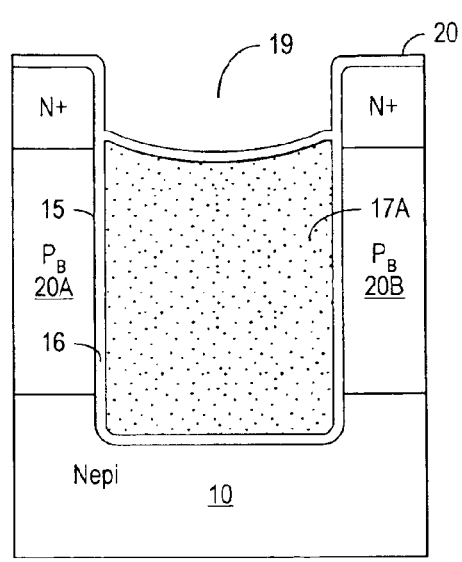
Figure 1F:
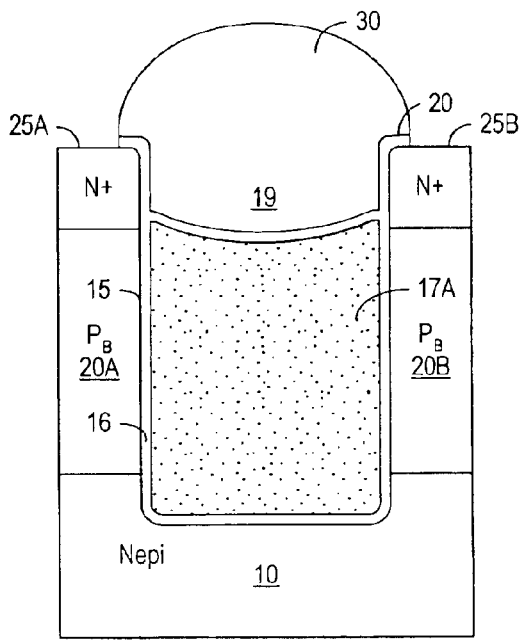
Figure 1G:
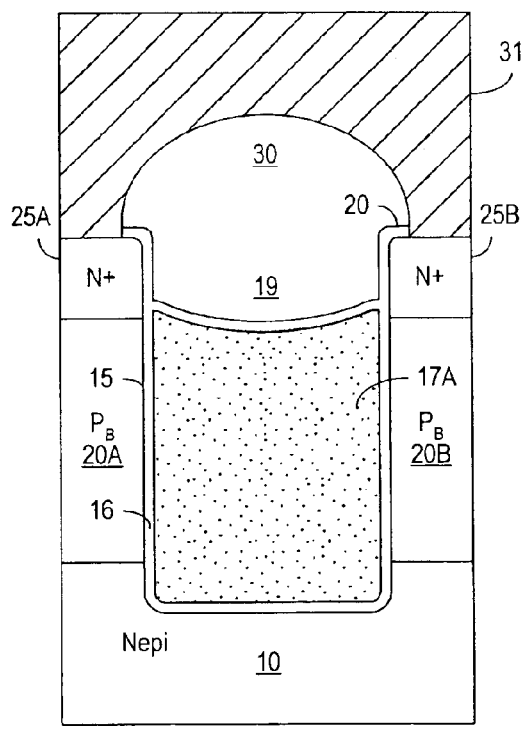
Figure 1H:
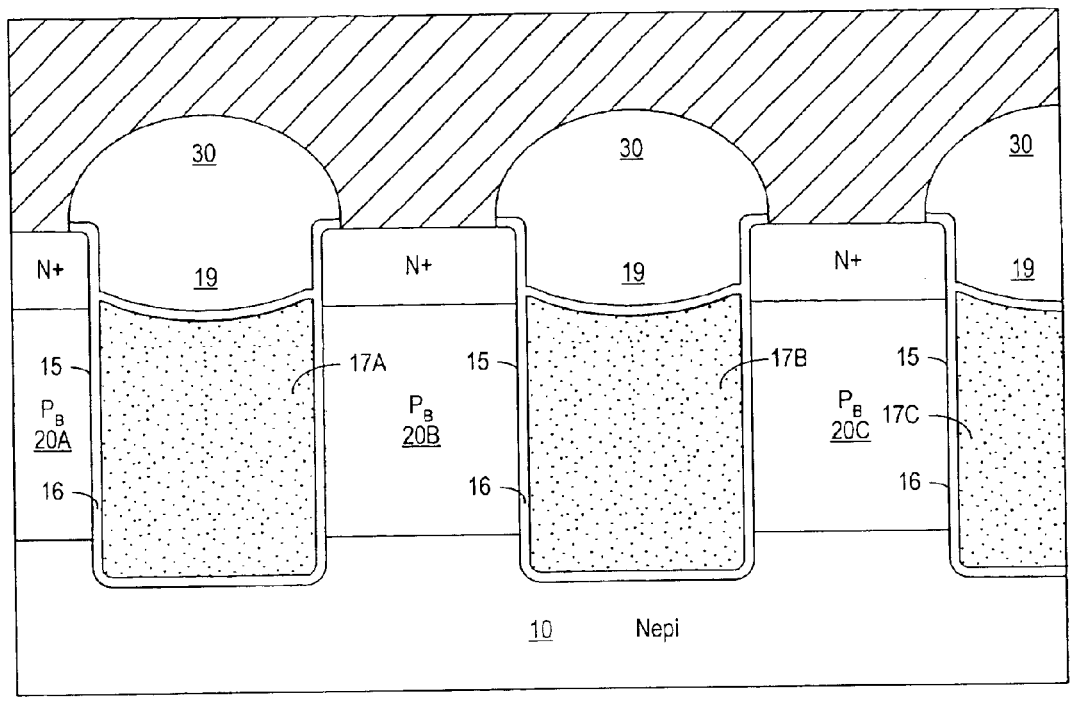
Figure 2A:
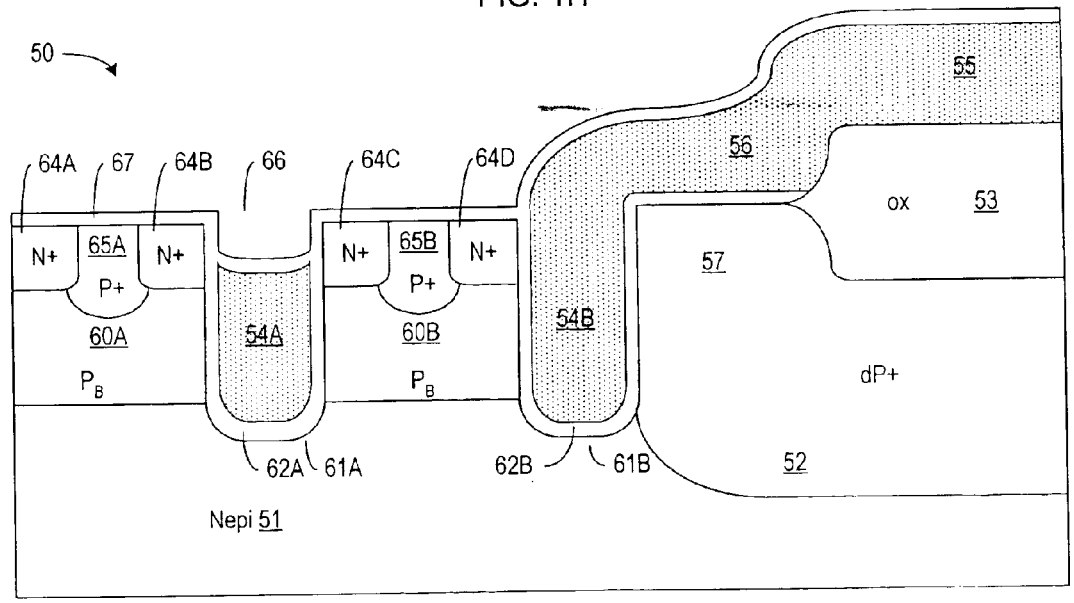
FIGS. 2A to 2E are cross-sectional views illustrating complications in manufacturing trench gated power MOSFETs, in particular
Figure 2B:
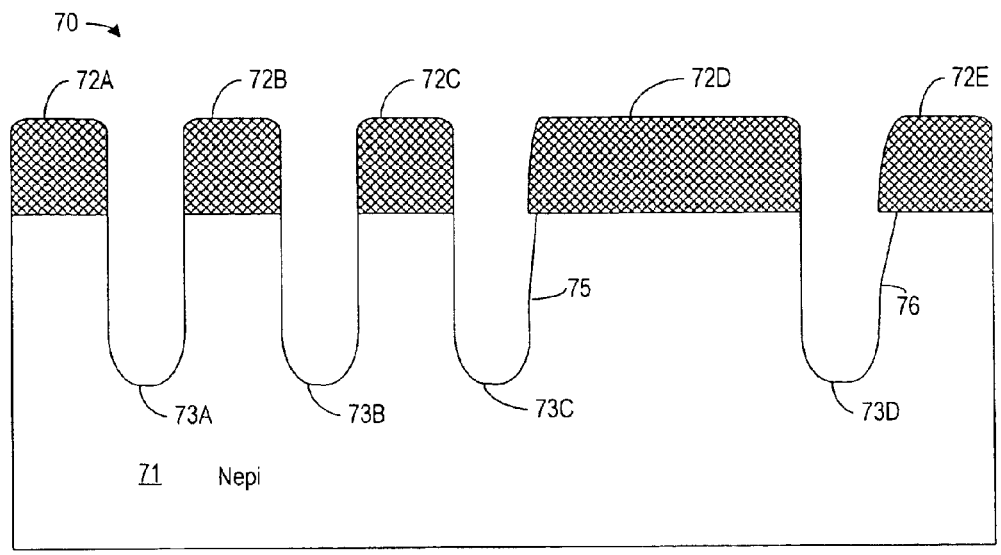
Figures 2C, 2D, 2E:
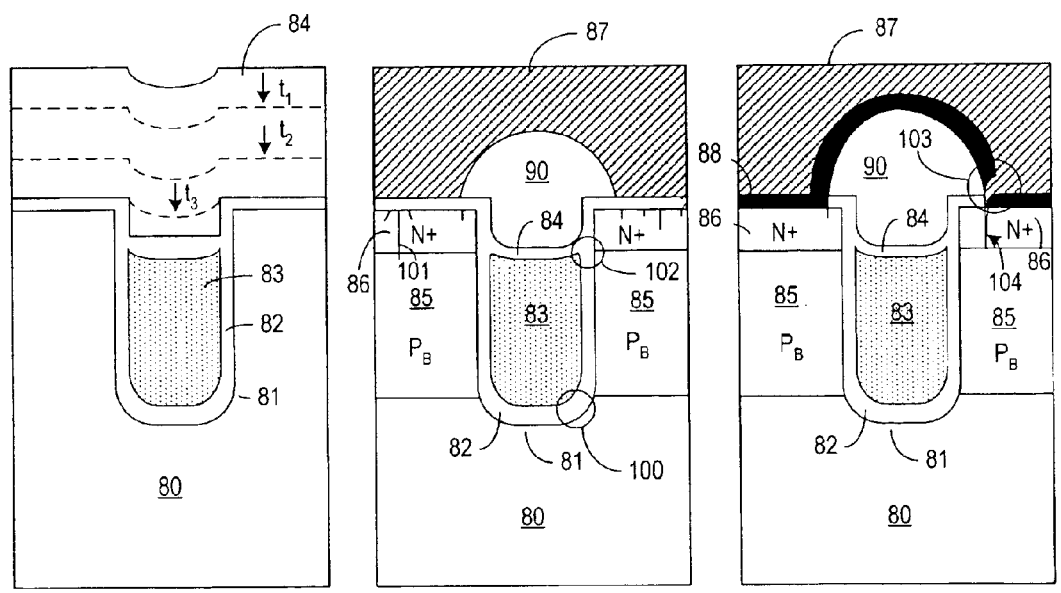
Figure 3A:
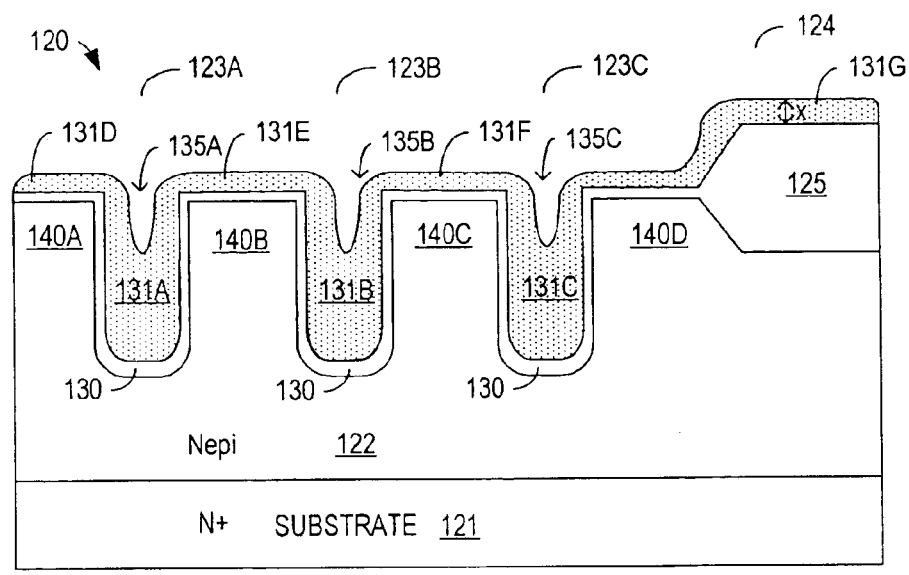
FIGS. 3A to 3C illustrate issues in planarization of both active and gate bus regions in conventional trench gated power MOSFETs, in particular
Figure 3B:
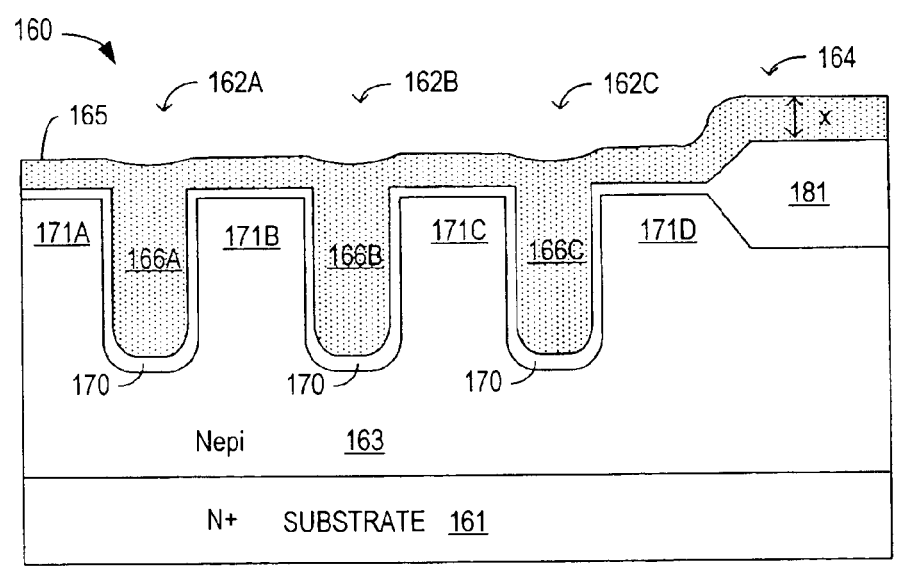
Figure 3C:
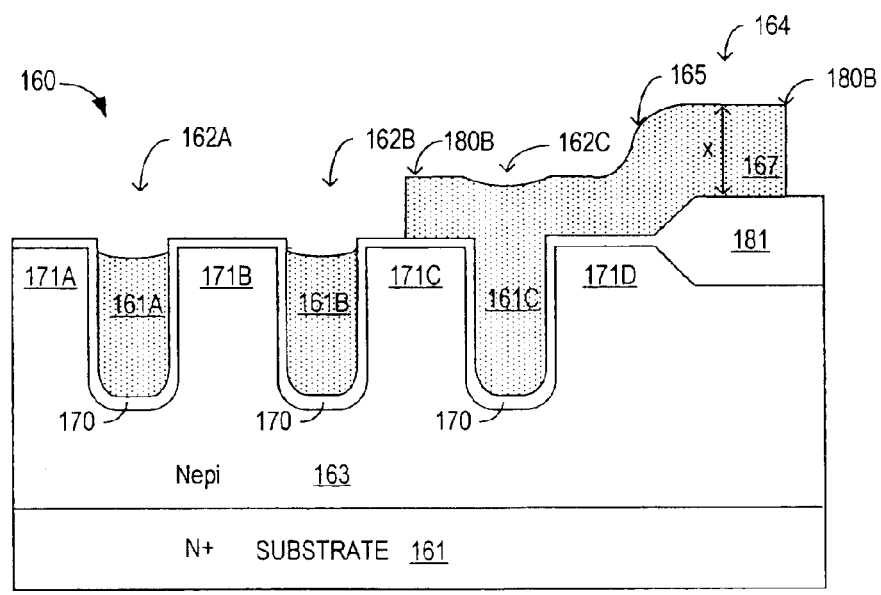
Figures 4A, 4B, 4C:
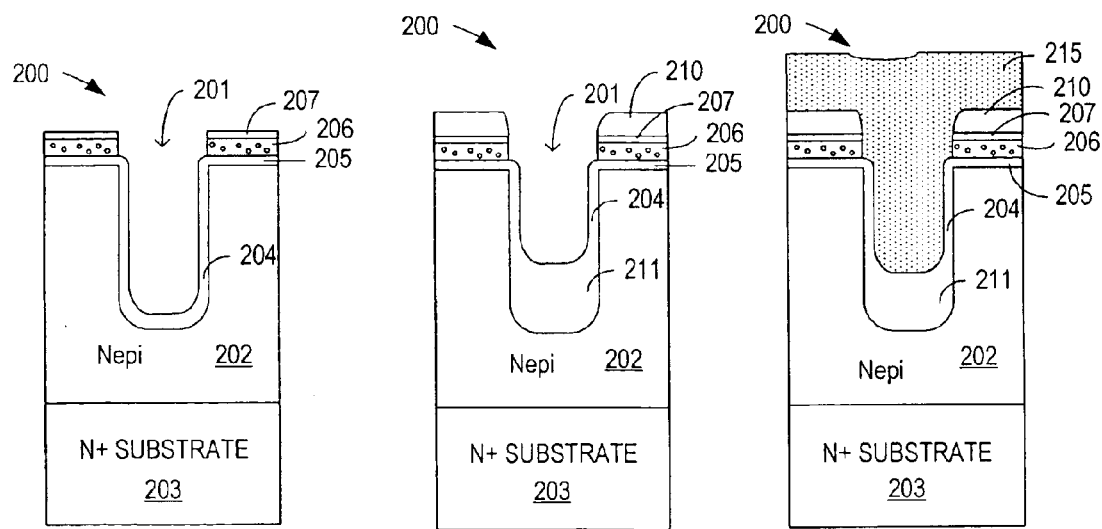
Figure 4D:
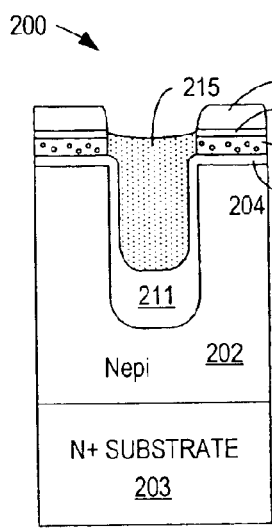
Figure 4E:
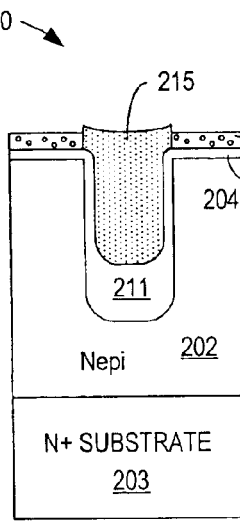
Figure 4F:
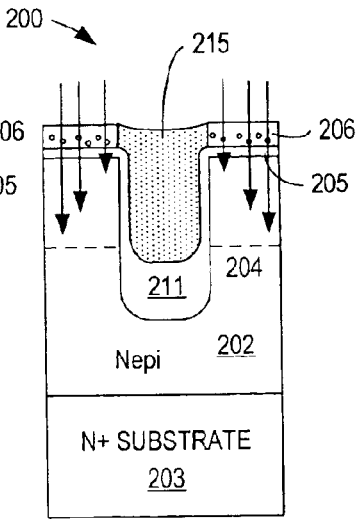
Figure 4G:
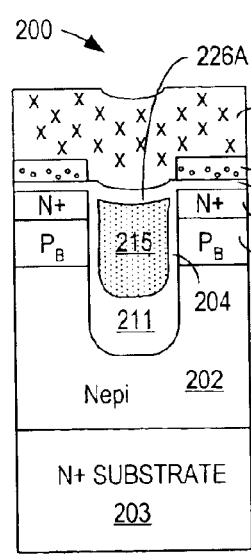
Figure 4H:
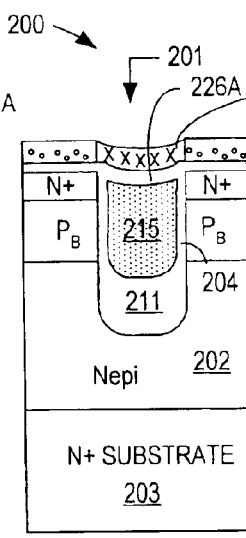
Figure 4I:
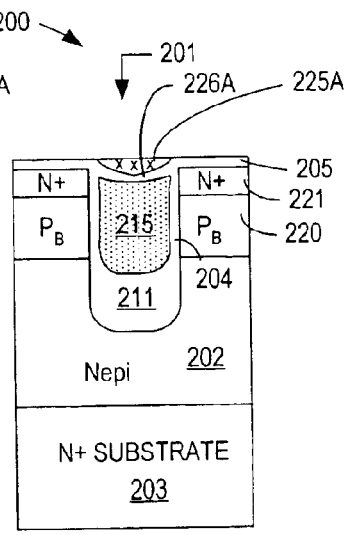
Figure 4J:
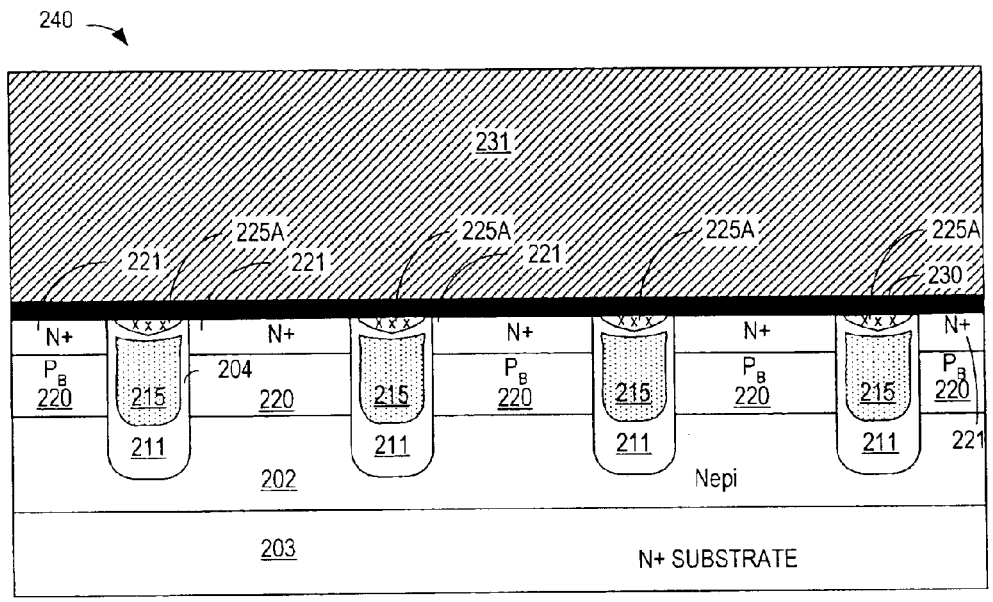
Figure 5A:
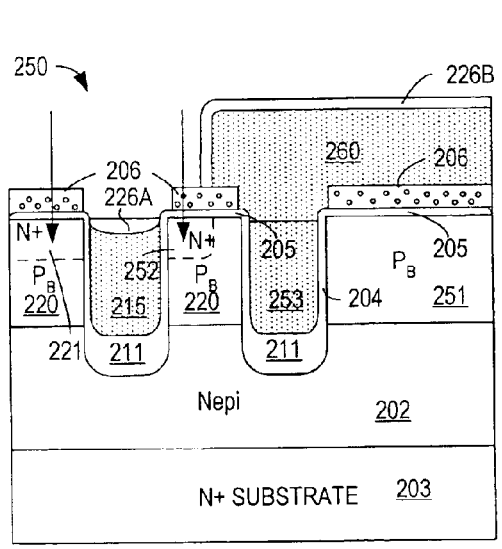
FIGS. 5A to 5F illustrate the fabrication of a gate bus region in a self-aligned-contact version of a trench gated power MOSFET, in particular
Figure 5B:
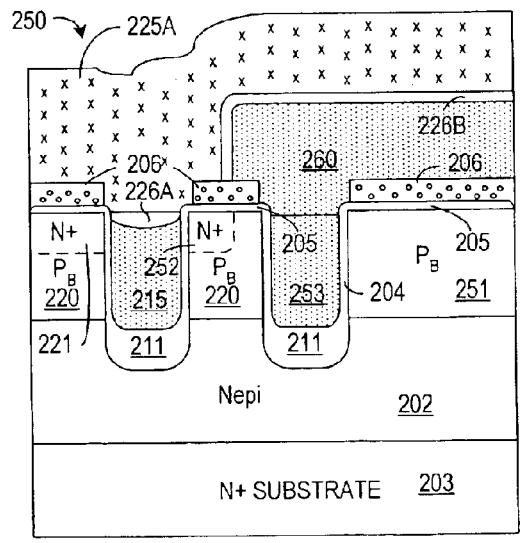
Figure 5C:
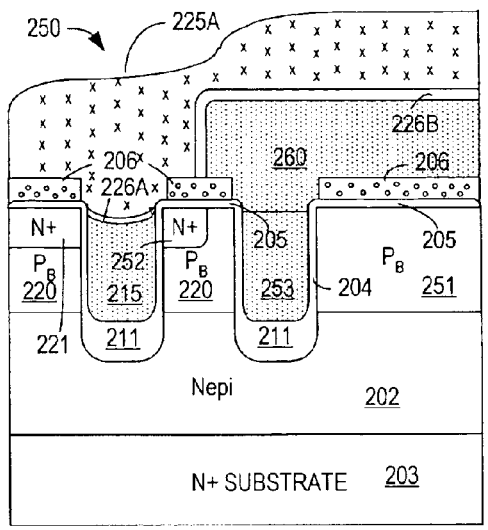
Figure 5D:
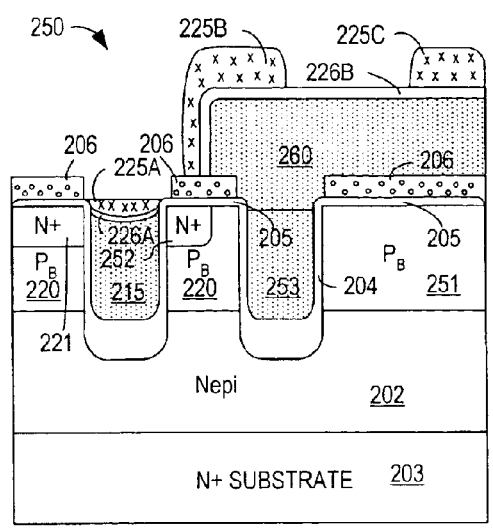
Figure 5E:
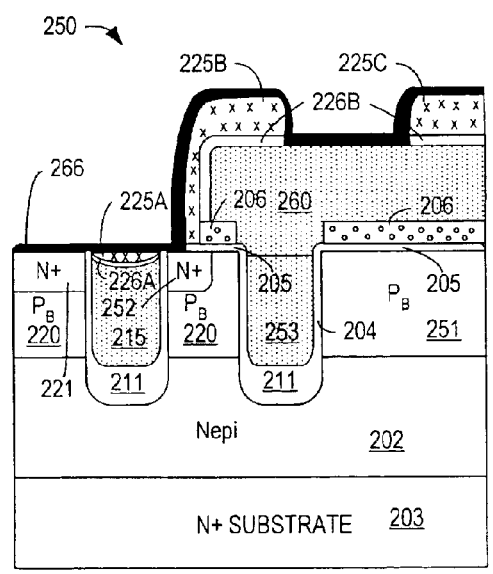
Figure 5F:
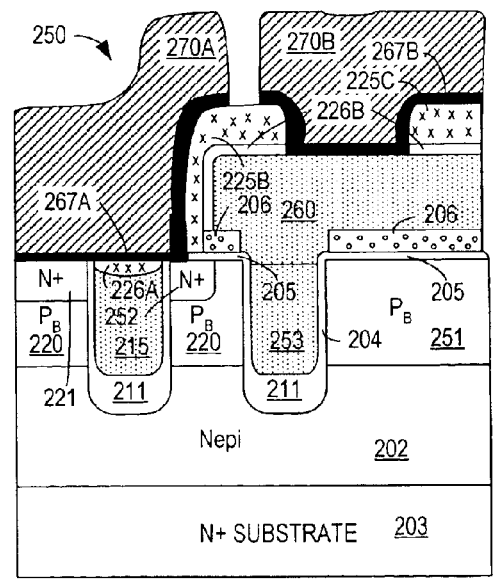
Figure 6A:
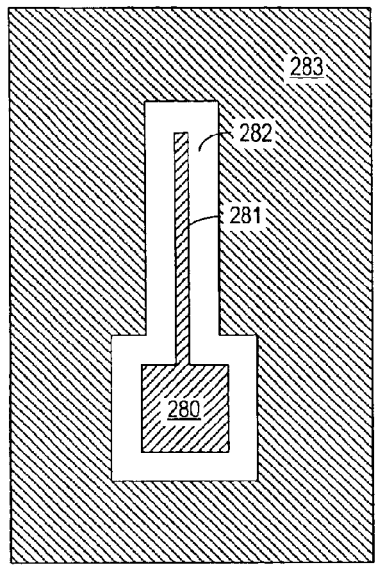
FIGS. 6A and 6B respectively show plan views of a vertical power MOSFET having a single gate finger device and gate bonding pad and a vertical power MOSFET having multi-source islands with a gate bus grid surrounding the source islands.
Figure 6B:
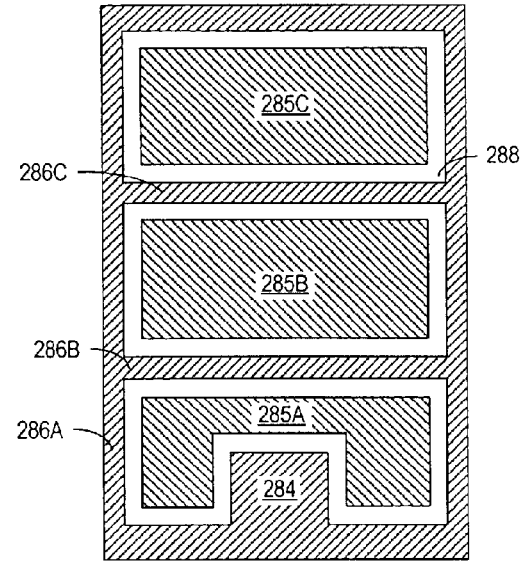
Figure 7A:
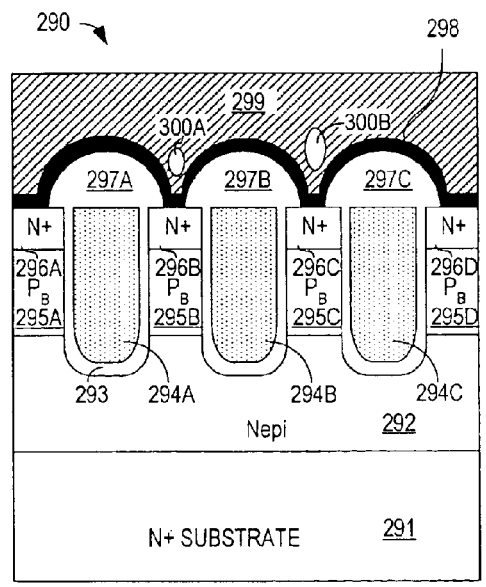
FIGS. 7A to 7C illustrate uniformity issues in trench gate MOSFET production, FIG. 7A showing metal voiding in active array contact windows, FIG. 7B illustrating polysilicon deposition voids and etch-back uniformity issues, and FIG. 7C illustrating metal step coverage and breakage issues
Figure 7B:
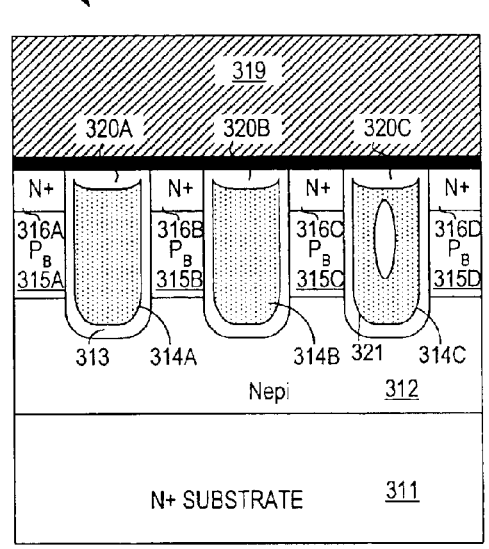
Figure 7C:
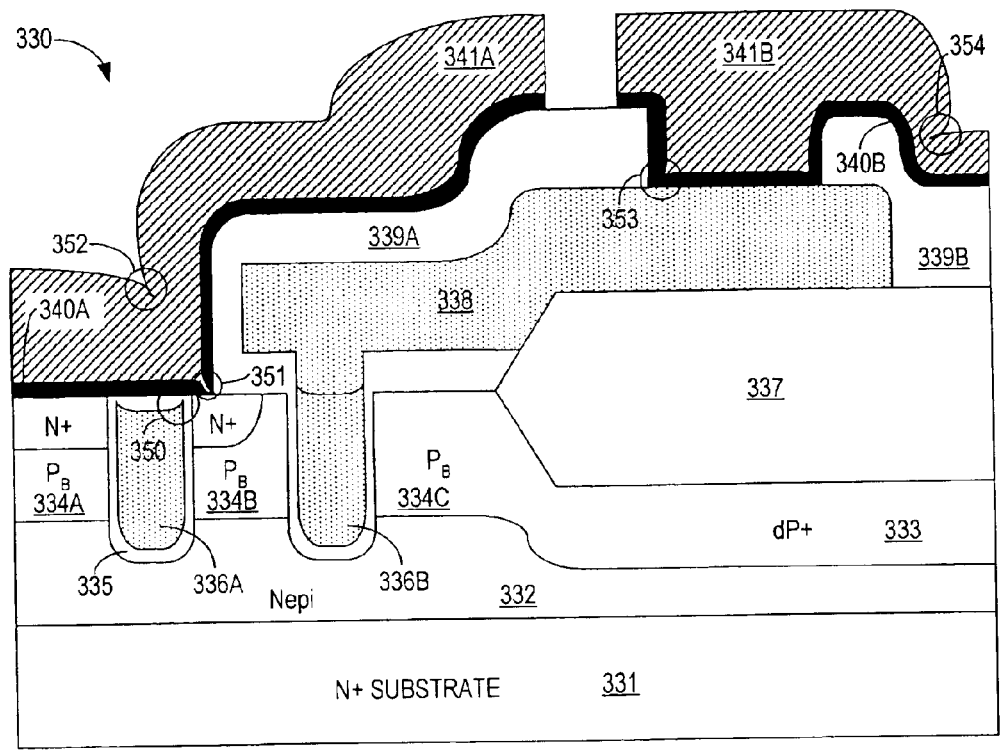
Figure 8A:
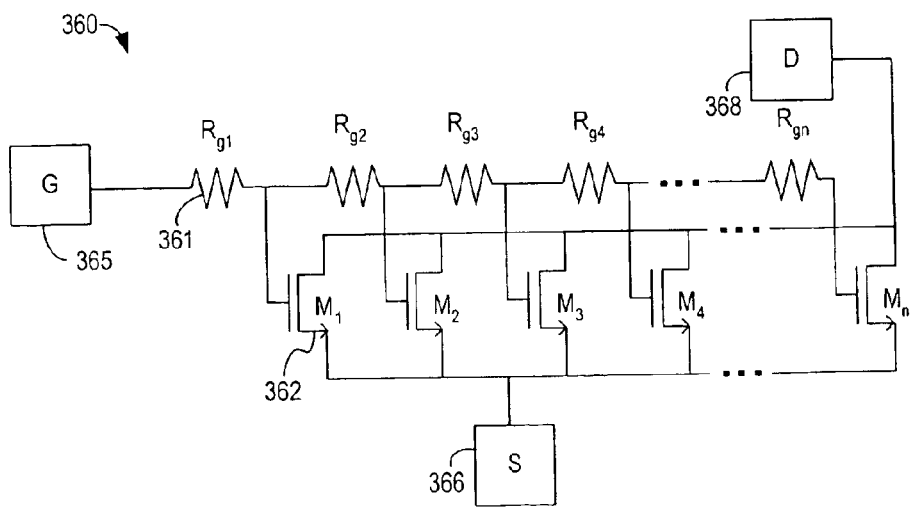
FIGS. 8A and 8B illustrate gate propagation issues in vertical power MOSFETs, FIG. 8A showing equivalent schematic of a vertical MOSFET array with distributed gate resistance, and FIG. 8B showing a slow switching waveform of device with high gate resistance.
Figure 8B:
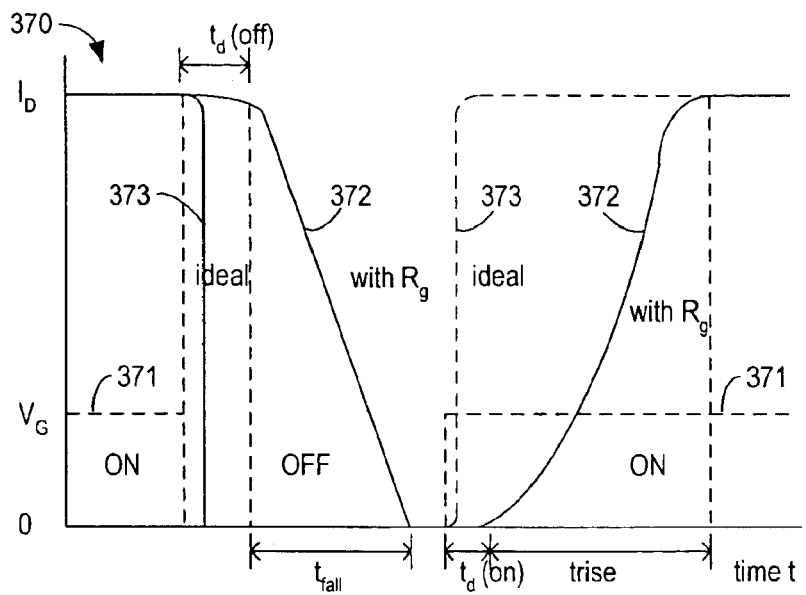
Figure 9A:
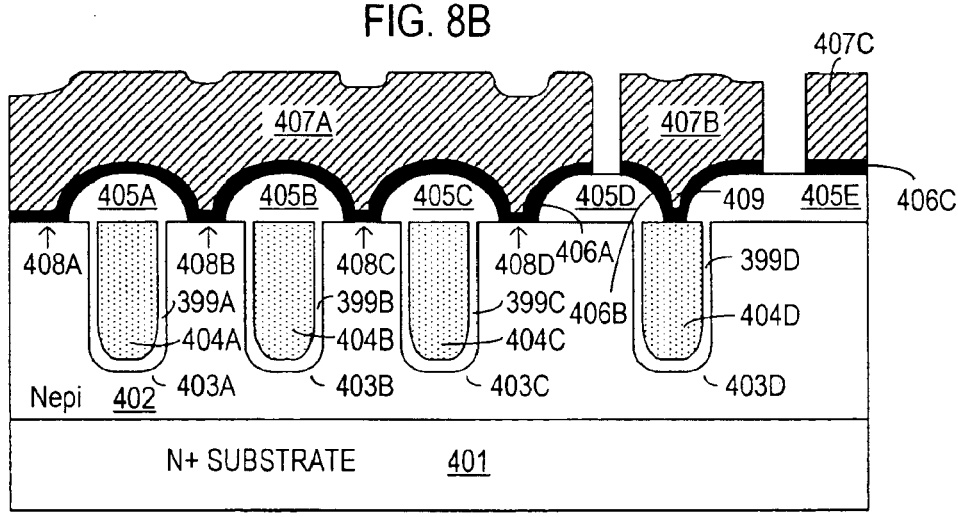
FIGS. 9A and 9B are cross sectional views of vertical trench-gated power MOSFET with co-planar gate bus requiring "ideal" contact placement respectively in a vertical trench-gated MOSFET with contact mask feature in the active cell array and a vertical trench-gated power MOSFET with self-aligned contact across active cell array.

As shown in FIG. 9A, a trench-gated vertical power MOSFET (also known as a trench DMOS device) associated with this invention comprises an array of tightly packed devices in an array of stripes or polygonal cells (the portion located beneath metal 407A in the drawing) having a series of trenches 403A, 403B, 403C etched into the silicon surface, lined with a thin gate oxide 399A, 399B, 399C in all (or along some portion) of the trenches, and filled with a conductor such as heavily-doped polysilicon 404A, 404B, 404C. The embedded polysilicon is not contacted within this "active cell array", but instead is contacted by extending the trench with its embedded polysilicon into another region to contact the trench polysilicon with metal. Between trenches lies a mesa region typically used to integrate the MOSFET's source, body (channel), and body contact features. Within the active array, the mesa region includes contact windows 408A, 408B, 408C, and 408D to facilitate electrical contact with the MOSFET's source and body elements without shorting to the embedded gates. These contacts form where the silicon surface comes in contact with the thick Al—Cu Si metallization 407A. The interface of the contact may also include barrier metal 406A comprising TiN to reduce contact resistance and prevent aluminum diffusion into the silicon (contact spiking). In the cross section shown, additional dielectric regions 405A, 405B, 405C sit atop the active trench array to prevent accidental shorting between the top metal 407A and the embedded polysilicon gates.

In another region of the device, a trench 403D is used to implement a contact between the gate metal 407B and the embedded polysilicon array 404D. As described in the background section of this disclosure, such a contact is normally facilitated by extending the polysilicon beyond the trench and up onto a dielectric layer covering the silicon surface. Such a multi-level structure suffers from many process and structural limitations as enumerated in the aforementioned background section of this application.

In the cross section of FIG. 9A, contact to the gate is not implemented by extending the polysilicon outside of the trench as in conventional vertical power MOSFETs, but instead by extending the contact down into trench 403D, which is dedicated for gate contact. In such a structure, contact 409 must be perfectly placed atop gate polysilicon 404D, so that etching through the oxides 405D and 405E will contact the polysilicon without shorting to any silicon mesa region outside the trench. The alignment and size of the contact (with all manufacturing variations considered) cannot allow the contact mask to fall off the polysilicon 404D and overlap onto gate oxide 399D or the gate oxide will be attacked by the etch and a short to the mesa will unfortunately result.

Topographically, however, the contact to polysilicon 404D is ideal since this layer is coplanar, i.e. at the same vertical height, as the surface of the contacts to the various silicon mesa regions. Put another way, the gate bus is substantially coplanar with the active array because gate contact 409 and mesa contacts 408A, 408B, 408C, and 408D geometrically lie in the same plane.

To implement the "ideal" gate contact 409, its alignment and feature size require much greater precision than do the mesa contacts 408. If contact dedicated trench 403D is etched to the same size as the active array trenches 403A, 403B, and 403C, making gate contact 409 is extremely difficult using processing equipment commonly available in 0.25 μm wafer fabs. Contact features smaller than 0.1 μm may be required. Such ultra-advanced fabs are unfortunately too expensive to manufacture such discrete power devices in a cost effective manner.

One remedy to this problem is to widen trench 403D to a width wider than active array trenches 403A, 403B, and 403C. For example, if active trenches are patterned to a width of 0.2 μm or 0.35 μm, and gate contact trench 403D is patterned to a width of 0.9 μm, then contact 409 could theoretically employ a 0.25 μm feature size. Beyond about 1 μm of width the contact trench 409 becomes much more difficult to fill and planarize. Even so it remains difficult to produce trenches of widely differing widths in a single photolithographic step. To improve matters, a trench used for gate contact (or gate bussing) may be masked and etched at a different time than those of the active array so that patterning, etching, filling, and planarization may be independently optimized.

Figure 9B:
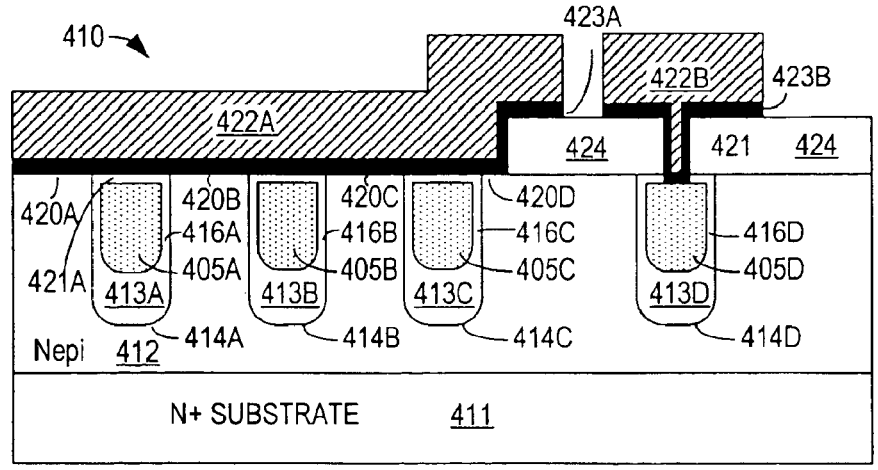

Aside from the need for a small-sized perfectly-aligned gate contact, the vertical trench-gated MOSFET of FIG. 9A illustrates that coplanar contacts for gate and active cells are compatible with devices employing a contact feature in the active cell array. In a similar fashion, FIG. 9B illustrates a vertical trench-gated power MOSFET with a self-aligned contact 420 (comprising mesa contacts 420A, 420B, 420C, and 420D) which may be implemented using a process as described in U.S. Pat. No. 6,413,822, which was incorporated by reference herein above. Such devices with a self-aligned contact running across the top of the active cell array can still benefit from a coplanar gate contact 421. In this example, the top of gate polysilicon 405D is located slightly below the surface of (but still substantially co-planar to) the silicon mesa contacts 420.

In both examples shown, using a trench for gate contact (or gate bussing) that is masked and etched independently from the processing of the active trench array allows complete flexibility in optimization of gate and active trenches. Since gate busses (or trench-gate contacts) do not determine the conduction characteristics of the device, their associated trench depth need not match that of active device array trenches.

Accordingly, many variants of improved vertical trench gated MOSFETs with a planarized gate bus can be fabricated using two (or more) trench-etching processing operations (instead of one homogeneous trench throughout). As it will be shown, the key process steps in fabricating an improved trench MOSFET with a planarized gate bus involve methods to form two distinct trenches and to fill and planarize these trenches. The formation of doped areas by ion implantation and their associated diffusions (when applicable) to create the MOSFET's body, source, and body contact regions may be combined with these multi-trench structures in a myriad of combinational sequences, many resulting in similar final structures. Some examples of vertical trench gated MOS-FETs combining both trench formation and junction formation are included for clarity. Otherwise, the numerous process sequences shown herein often skip the steps of dopant introduction in the cross-sectional diagrams of the devices, such steps being well known to those skilled in the art.

Figure 10:
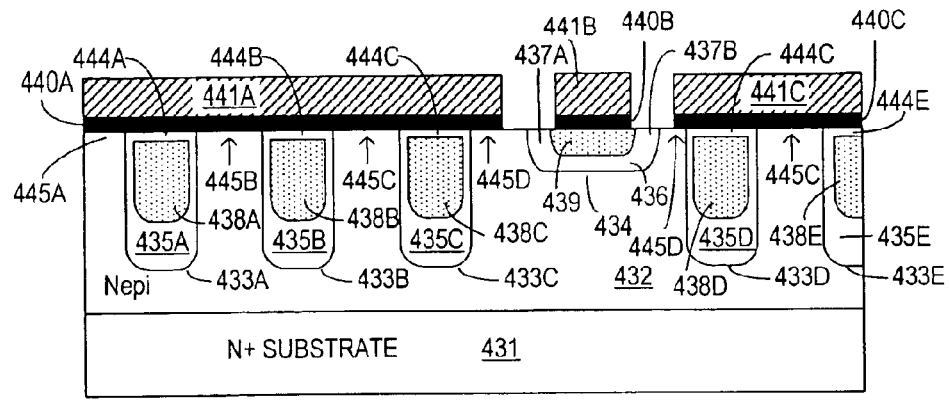
FIG. 10 is a cross sectional view of a vertical trench-gated MOSFET with a co-planar buried gate bus and self-aligned contacts within the active cell array

FIG. 10 illustrates a cross section of a vertical trench-gated MOSFET 430 in accordance with an embodiment of the invention comprising a co-planar wide (buried) gate bus 439 and self-aligned contacts 445A to 445E within the active cell array of narrow trench devices. The surface of the contacts is planarized flat using chemical mechanical polishing (CMP) or other means during the device fabrication so that virtually no topography exists when contact and metallization steps are performed. As shown, device 430 comprises a series of narrow trench gate structures 433A, 433B, 433C, 433D and 433E in the active array region of the device (i.e., the portions of the device where the vertical MOSFET source, body, and channel are formed) including embedded polysilicon gates 438A, 438B, 438C, 438D and 438E, thick bottom oxide 435A, 435B, 435C, 435D and 435E located at the bottom of each narrow trench, and top oxide 444A, 444B, 444C, 444D and 444E protecting the top of each trench embedded polysilicon from shorting to the overlying source metal 441A or 441C. Source metal 441A contacts silicon mesa regions 445A, 445B, 445C and 445D via barrier metal 440A which may contain a variety of P-type and N-type doped regions (not shown), including N+ source, P-body, and P+ contact region to the P-body. These doped regions may be formed by ion implantation (or ion implantations combined with high-temperature thermal diffusions). The doped regions, along with the gate bus and the active trench array are formed within N epitaxial layer 432 atop heavily doped N+ substrate 431. Similarly, source metal 441C contacts silicon mesa regions 445E and 445F via barrier metal 440C. Source metals 441A and 441C are typically electrically shorted by aluminum metallization or by one or more bond wires.

In wide trench 434, metal layer 441B contacts polysilicon gate bus 439, which is isolated from epitaxial layer 432 (or any other doped regions) by thick oxide 436. Gate bus polysilicon 439 forms a continuous grid of polysilicon with narrow trench embedded polysilicon 438A through 438E. The purpose of the polysilicon contact and metal region 441B is to facilitate electrical connections to the MOSFET's gate (via bond wire) and to provide a means to distribute electrical signals to the gate of the device across a chip's surface without significant propagation delays. Signals travel from the metal gate connection 441B into the gate bus polysilicon 439 and then into the array of narrow trench-enclosed polysilicon gate 438. The gate bus structure may be repeated at regular intervals if high switching speed devices are required.

What is noteworthy of this device structure is its extremely planar surface making photolithography and formation of contacts and metallization 441A, 441B, and 441C much easier. With no oxide steps or topography above the silicon surface, there is no risk of metal breakage, step coverage induced metal thinning, metal voiding, or electromigration at sensitive locations within the device. In particular, at no location in the device is it necessary for polysilicon to emerge from a trench onto the silicon surface, either in the active cell array (beneath metal 441A and 441C) or in the gate bus or gate-contact area itself (beneath metal 441B).

Another distinctive characteristic of this device is the co-planarity of the gate bus polysilicon 439 and the polysilicon 438 (i.e., 438A through 438E) embedded within the trenches. The top of both polysilicon regions 439 and 438 are substantially planar, and do not extend outside of the confines of a trench. Even more unique is the presence of two distinctly different shaped trenches, one (433) shallow and wide, the other (435) narrow and deeper. The shallow-wide trench 433 comprises the gate bus and gate contact area of the device, having a minimum width that is easily contacted (e.g., greater than 1 µm wide). In a gate bus, however, more than a simple electrical contact to the gate is needed since the gate bus carries signals across the chip. To avoid propagation delays, the series resistance of the gate bus must be held to a minimum. Accordingly, the width of the gate bus may be expanded to facilitate a low resistance metal trace, e.g., a metal bus 10 µm to 25 µm wide. The depth of the gate bus may be roughly half that of the active gate trench, e.g. 0.5 µm to 0.7 µm deep.

The active trenches 435 (i.e., 435A through 435E) are deeper, ranging from 1 µm to 2 µm in depth (with 1.5 µm being preferred). Unlike the ideal gate bus, these active array trenches are narrow, ranging from 1 µm down to 0.35 µm (and preferably 0.4 µm) using 0.35-µm class wafer fabs. In advanced deep-submicron wafer fabs, structures could further be reduced down to 0.1 µm (so long as it is cost effective). Considering the fiscal impact of equipment and facilities depreciation on wafer manufacturing costs, 0.25-µm-class fabs will likely constitute the successor to the 0.35 µm power MOSFET wafer production manufacturing now ramping up. In such fabs, trenches 0.25 µm wide can be employed.

Additional depth may be added to the gate bus trench to compensate for the thickness of oxide 435. Furthermore, active trenches 433D can be etched to a greater depth (e.g., 0.3 µm) when thick bottom oxide 435 (i.e., 435A through 435E) is included in device fabrication.

Figure 11A:
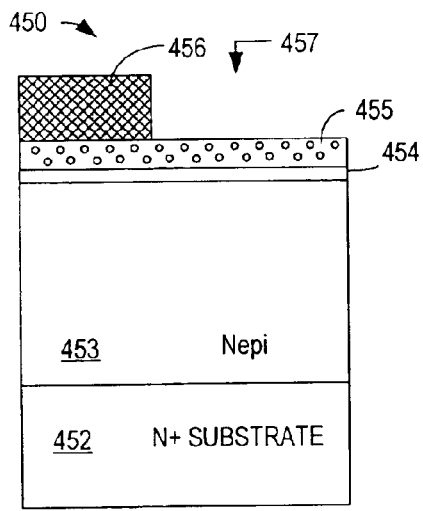
FIGS. 11A to 11Q are cross sectional views illustrating fabrication of a vertical power MOSFET with a co-planar gate bus and self-aligned contacts across the active cell array, FIG. 11A illustrating buried-gate-bus hard mask definition, FIG. 11B illustrating a buried-gate-bus shallow trench etch, FIG. 11C illustrating active-area trench mask definition, FIG. 11D illustrating an active-area trench etch, FIG. 11E showing trench sacrificial oxide, FIG. 11F illustrating thick bottom oxide formation, FIG. 11G illustrating a first polysilicon deposition, FIG. 11H illustrating the results of chemical mechanical polishing or a polysilicon etch-back, FIG. 11I illustrating a polysilicon over etch, FIG. 11J illustrating thin top oxidation, FIG. 11K illustrating CVD oxide formation, FIG. 11L illustrating CMP dielectric planarization, FIG. 11M illustrating a gate contact mask, FIG. 11N illustrating a gate contact etch, FIG. 11O illustrating an active (mesa) nitride strip, FIG. 11P illustrating an oxide etch (or dip), and FIG. 11Q illustrating metallization and a metal mask.
Figure 11B:
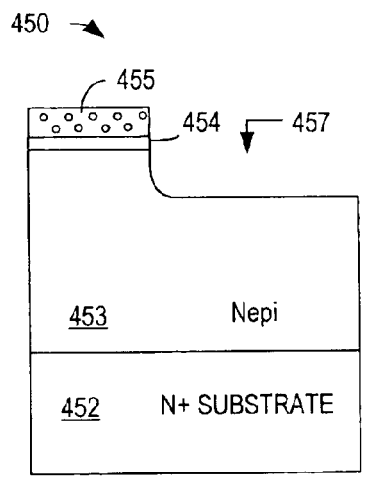
Figure 11C:
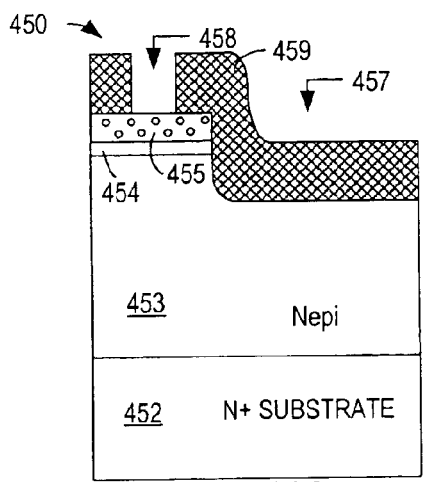
Figure 11D:
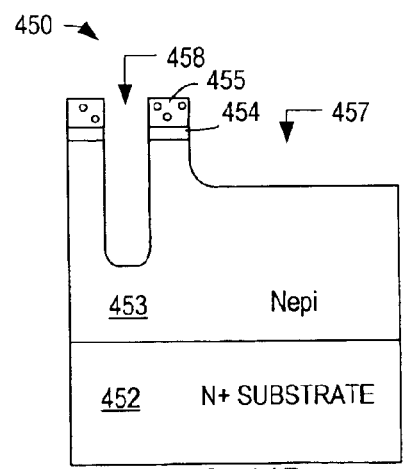
Figure 11E:
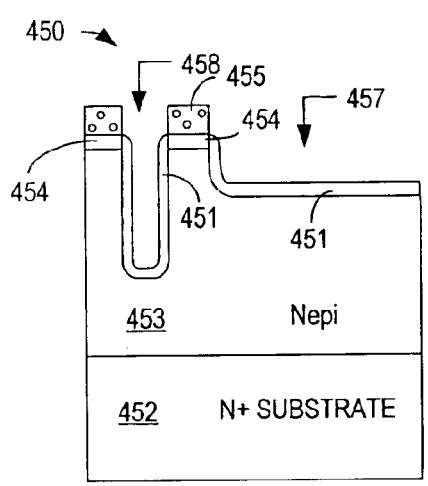
Figure 11F:
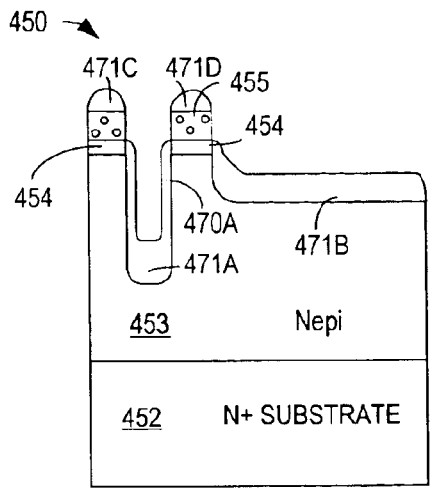
Figure 11G:
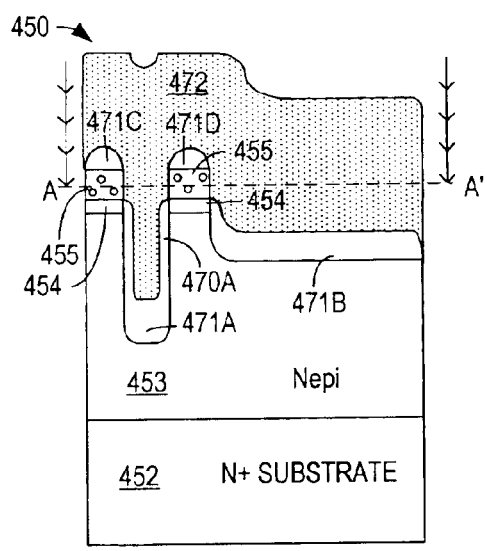
Figure 11H:
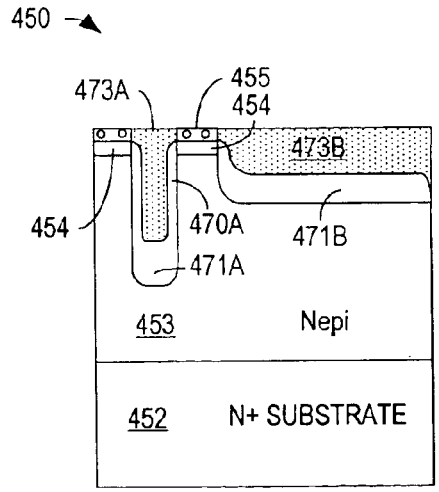
Figure 11I:
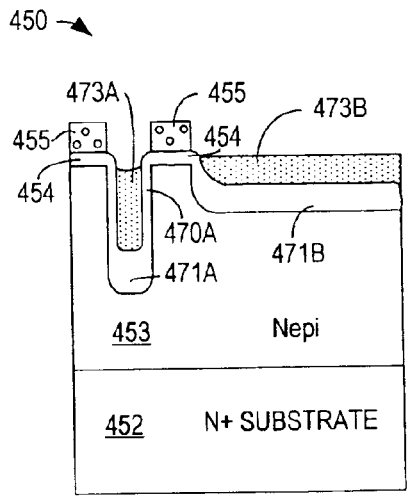
Figure 11J:
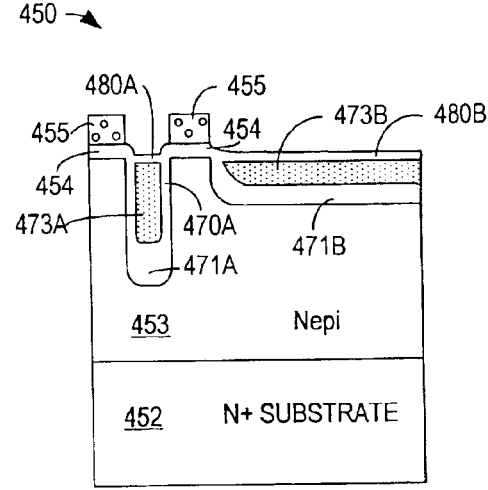
Figure 11K:
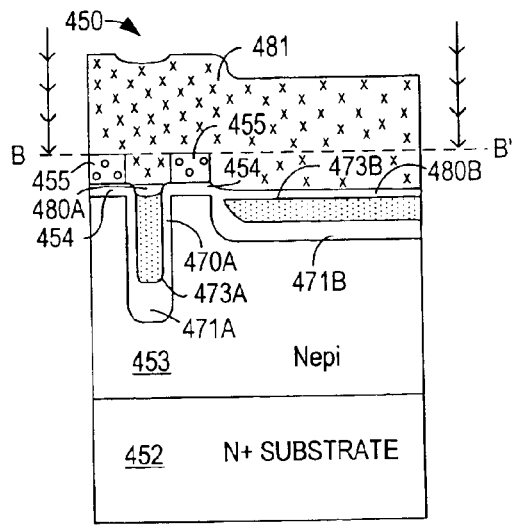
Figure 11L:
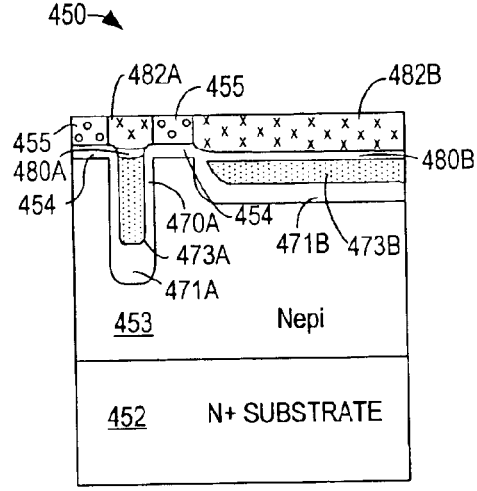
Figure 11M:
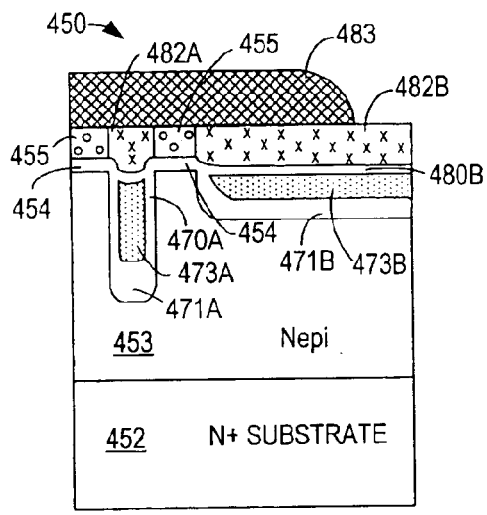
Figure 11N:
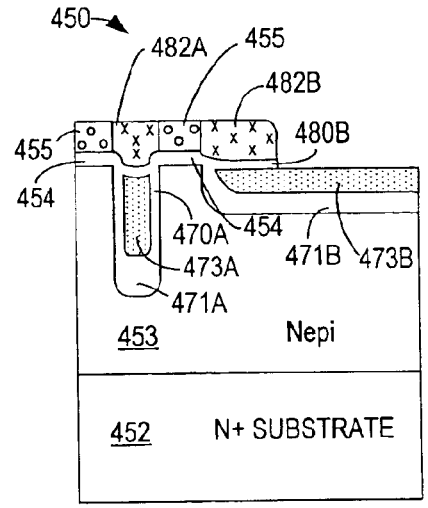
Figure 11O:
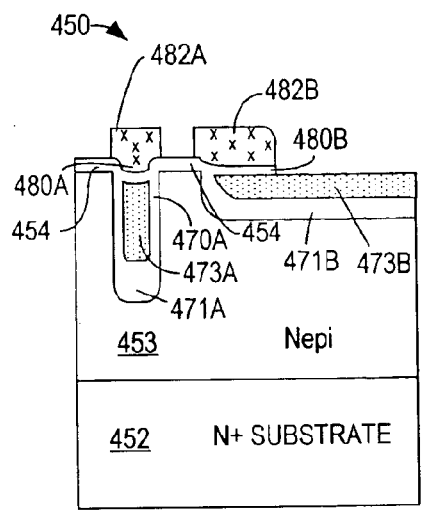
Figure 11P:
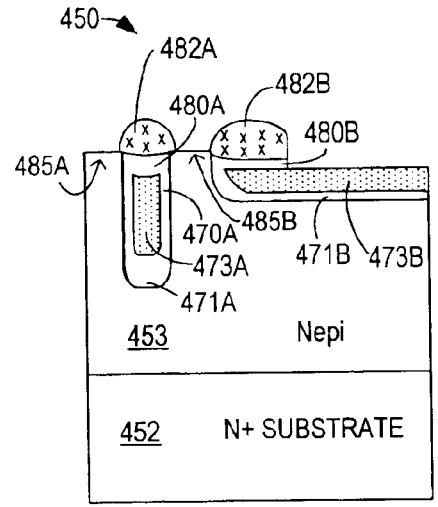
Figure 11Q:
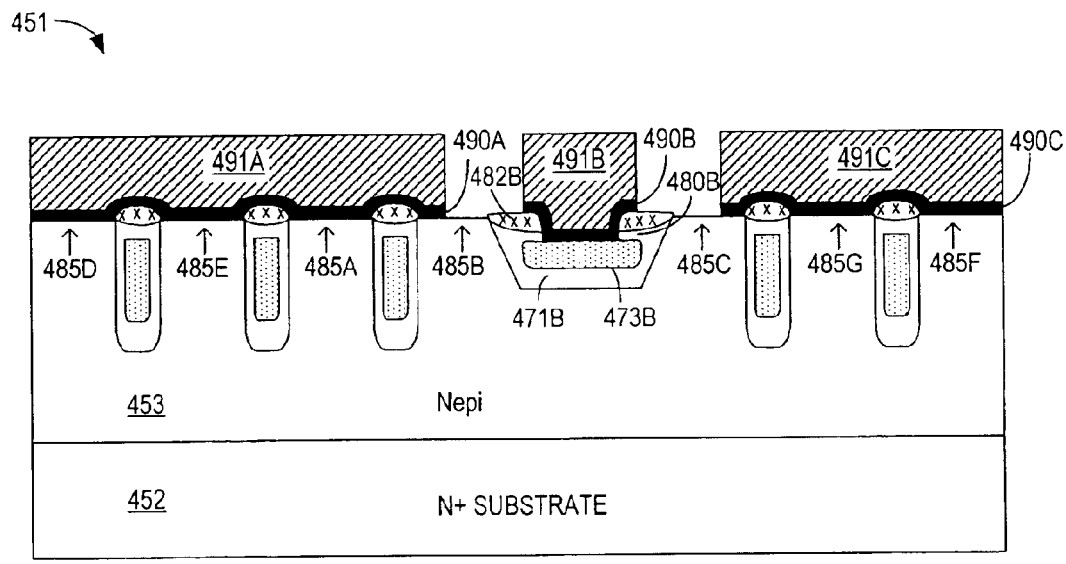

FIGS. 11A to 11Q illustrate an exemplary fabrication process for a trench gated MOSFET with a planarized gate bus in accordance with an embodiment of this invention. In device 450 of FIG. 11A, an N-type epitaxial layer 453 is grown atop N+ substrate 452. Silicon dioxide layer 454 is grown by thermal oxidation of epitaxial layer 453 to a thickness of 200 A to 1000 A at a temperature of 800 to 1050° C. Using chemical vapor deposition (CVD), silicon nitride ($Si_3N_4$) 455 is deposited to a thickness of 600 A to 1500 A. The oxide-nitride sandwich is then patterned by photolithography and an etch process using photoresist mask 456 to produce opening 457. After etching silicon nitride layer 455 and underlying oxide 454, wide silicon trench 457 is etched as shown in FIG. 11B using reactive ion etching (RIE) techniques well known to those skilled in the art.

Narrow trench 458 is then photolithographically defined using a photoresist layer 459 as shown in FIG. 11C to control the etching of silicon nitride 455, silicon dioxide 454, and epitaxial layer 453 to form silicon trench 458. After photoresist strip, the resulting structure shown in FIG. 11D has two trench features: deep and narrow (active transistor array) trench 458 and shallow and wide (gate bus) trench 457. The patterned nitride/oxide sandwich, or hardmask used to define the two trench types remains at this step. Further fabrication can be subdivided into two categories: process flows in which the nitride/oxide hardmask is removed, and process flows in which the nitride/oxide hardmask remains during subsequent steps. In the integrated process flow of FIGS. 11A to 11Q, the hardmask persists throughout much of device fabrication.

FIG. 11E, the exposed silicon trench sidewalls are then exposed to a sacrificial oxidation at a temperature between 900° C. and 1100° C. with 1000° C. being preferred. Sacrificial oxidation 451, typically 100 Å to 700 Å (but preferably 250 Å) is used to remove crystal defects created during the etch process.

The sacrificial oxide 451 is then removed by etching, commonly with HF acid. At this juncture, two process options exist. In the "thin gate" option, gate oxide is grown uniformly in all narrow and wide trenches and polysilicon is deposited. This thin gate version suffers from higher electric fields and increased capacitance compared to the alternate option incorporating thick bottom oxide (TBOX) into the process sequence. In the TBOX process flow, a thin lining oxide and a thick bottom oxide 471A and 471B are formed before any gate oxide is grown. As shown in FIG. 11F, the thin lining oxide is grown on the same silicon surfaces and under similar process conditions to the sacrificial oxide. Lining oxides may range in thickness from 100 Å to 1000 Å. Thick bottom oxide 471 (i.e., 471A and 471B) is then deposited by directional deposition using high-pressure CVD. U.S. Pat. No. 6,291,298, entitled "Process of Manufacturing Trench Gate Semiconductor Device Having Gate Oxide Layer with Multiple Thicknesses" and U.S. Pat. No. 6,413,822, entitled "Super-Self-Aligned Fabrication Process of Trench-Gate DMOS with Overlying Device Layer" further describe processes for formation of oxide layers in trenches and are incorporated by reference in their entirety. The sidewall oxide on the vertical sidewalls (comprising both the thermally oxidized lining oxide and any sidewall oxide residue) is etched off and gate oxide 470A regrown (also under similar processing conditions to the sacrificial and lining oxides). Final gate oxide thicknesses range from 100 Å to 1300 Å with 500 Å being common for 20 V gate operation, 300 Å common for 12 V gate operation, and 200 Å common for 8 V gate operation. During directional deposition, thick oxide 471A accumulates at the bottom of narrow trench 458 and thick oxide 471B accumulates at the bottom and on the sidewall of wide trench 457. The vertical sidewall of narrow trench 458 prevents significant oxide deposition during directional deposition, but in a wide trench, the deposition is more conformal and graded. The thick oxide 471C and 471D also accumulates on the top of the silicon nitride 455 on the silicon mesas between trenches 458 and 457.

In FIG. 11G, polysilicon 472 is deposited onto device 450, filling narrow trenches 458 and wide gate bus trenches 457. The polysilicon is deposited using CVD to a thickness of 0.7 μm to 3 μm so long as the trenches are filled. The polysilicon may be deposited undoped and later implanted (or doped via predeposition from a gaseous or solid dopant source like $POCl_3$ or BN). Preferably the polysilicon can be doped in-situ, i.e., as it is being deposited, with phosphorus (for N+ poly) or boron (for P-type poly). Depositing the polysilicon into trenches of differing shapes, e.g., wide shallow trenches 457 for gate bussing and narrow deeper trenches 458 for active arrays of vertical MOSFETs, offers unique advantages since a single polysilicon deposition produces both structures simultaneously. Using a single deposition followed by a planarization step also insures good co-planarity between the two polysilicon surfaces, avoiding unwanted topography and potential gate shorts.

The surface of the device is then planarized using chemical mechanical polishing (CMP). Unlike etch-back, CMP is highly planar, removing layers parallel to the silicon's surface. In the cross section of device 450 in FIG. 11G, the CMP planarization is performed down to the cut line labeled A–A', grinding back through polysilicon 472, completely removing thick oxide residues 471C and 471D from atop the silicon mesas, and finally stopping either at the silicon surface, or (as shown in FIG. 11H), stopping after the silicon nitride hard mask layer 455 becomes exposed and partially removed. The slower etch rate of the mechanically harder silicon nitride naturally acts as an etch stop.

The resulting structure is shown in FIG. 11H. Using CMP planarization, polysilicon 472 is split into two pieces (in this cross sectional view), one being gate polysilicon 473A inside narrow trench 458 (and similarly in all active area trenches across the device), the other being gate bus polysilicon 473B located in wide trench 457. The gate and gate bus polysilicon pieces 473A and 472B still remain electrically shorted (despite their appearance in the cross section of FIG. 11H) because they are physically connected in a different three-dimensional cross section than the one shown.

The planarity of the surface of device 450 in FIG. 11H is extremely difficult to achieve using chemical etch-back techniques since most chemical etchants (such as $HF+HNO_3+H_2O_2$) are generally isotropic, etching all portions of a common material at a single rate. Isotropic etching is especially characteristic of polysilicon etching since polysilicon has no single crystalline orientation. Using isotropic etching, thicker areas therefore etch longer and clear (i.e., are removed from the surface) later than thinner regions, causing unwanted topography to remain even if an unreasonably thick (and therefore expensive) polysilicon layer is deposited prior to etch-back. It is possible, however, to combine chemical etch-back and CMP steps in sequence, e.g., first thinning and planarizing by CMP then (after the surface is planar) to continue thinning using etch-back the rest of the way. Alternatively using etch-back thinning first, followed by a shorter duration CMP planarization may reduce the process time without compromising planarity.

After planarization, a short chemical etch-back of polysilicon is needed to recess the polysilicon below the surface of epitaxial layer 453 to accommodate an oxide cap atop the polysilicon (see FIG. 11I). This etch-back may range from 0.1 μm to 0.5 μm, but should not result in the surface of the gate polysilicon 473A being deeper than the junction depth of the transistor's source region. In FIG. 11J, an optional oxidation of exposed gate polysilicon 473A and gate bus polysilicon 473B is performed to seal the polysilicon in high quality thermal oxides 480A and 480B respectively. The top oxide also acts as a diffusion barrier against any subsequently deposited glasses that may contain dopants such as boron or phosphorus. Dopants may be introduced into the silicon mesas at this step of the process (not shown), preferably by ion implantation. Either chained high-energy ion implantations or a shallow implant followed a high-temperature diffusion may be used to form the body of the MOSFET. The source may also be implanted at this time or at a later step.

FIG. 11K, a glass or dielectric layer 481 such as TEOS (tellurium doped glass), PSG (phosphosilicate glass), BPSG (borophosphosilicate glass) or SOG (spin-on glass) is deposited and then planarized and thinned using CMP, etch-back, or a combination thereof. Planarization and thinning continues until nitride 455 is exposed beyond cut-line B–B' as shown in FIG. 11L, whereby dielectric layer 481 separates into two islands, region 482A sitting atop the embedded gate in narrow trench 457, and region 482B sitting atop the wide trench gate bus 458. Intervening thermal oxides 480A and 480B prevent dopant contamination into polysilicon 473A and 473B from doped glass 482A and 482B.

In FIG. 11M, a contact mask is used to define an opening in photoresist 483 open only atop the wide gate bus polysilicon structure 458 but not atop the active array of trenches. In FIG. 11N, the contact is subsequently etched using dry etching techniques to expose gate bus polysilicon layer 473B. Oxide etching is preferably performed using dry etch techniques such as reactive ion etching (RIE) or plasma etching, which are well known to those skilled in the art.

In FIG. 11O, silicon nitride 455 is stripped using an etchant or a dry etch chemistry that selectively etches nitride layers faster than oxide. In this manner, capping oxides 482A and 482B suffer little erosion from the nitride's removal. This operation clears the silicon mesas except for thin oxide 454. Dopants may be introduced at this step rather than earlier in the process if so desired. In FIG. 11P, a short thermal cycle (e.g. 10 minutes at 850° C. to 900° C.) is used to flow glass island 482A and 482B (smoothing their shape) followed by a short oxide etch or HF acid dip to remove thin mesa oxide 454.

FIG. 11Q illustrates the final cross section of a device fabricated in accordance with this invention whereby TiN barrier metal 490 (including regions 490A, 490B, and 490C) is deposited. Thereafter, thick metal 491 (including regions 491A, 491B, and 491C) typically comprising Al—Cu—Si is deposited using sputtering or evaporation methods. Finally a metal mask is used to define and etch the metal and barrier metal into source electrodes 491A and 491C and gate bus electrodes 491B. The resulting device 451 has a high cell density, a large active contact area (extending from trench to trench edge), a fully planarized gate bus and virtually no topography.

Figure 12:
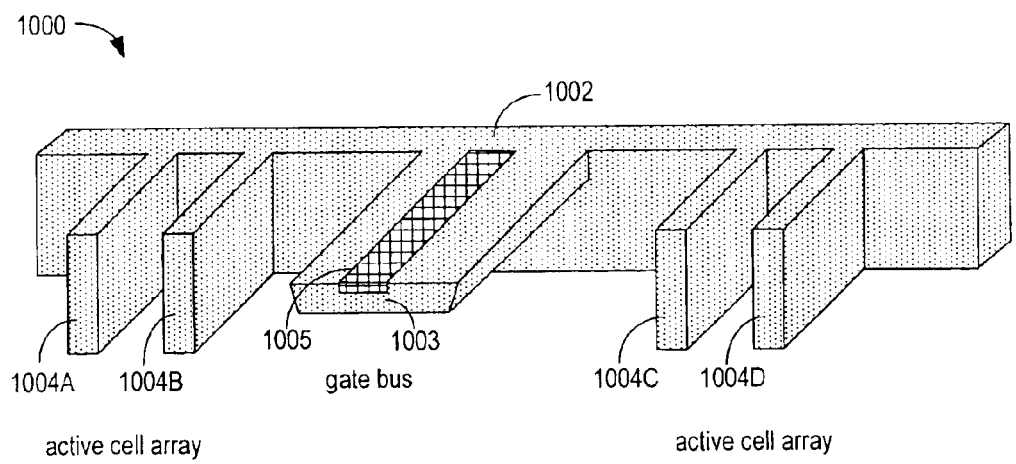
FIG. 12 shows a three-dimensional projection of coplanar polysilicon structure forming trench gates and a buried-gate bus.

FIG. 12 illustrates the three-dimensional construction of polysilicon 1000 comprising wide shallow gate bus 1003 and active-cell-array embedded gates 1004A, 1004B, 1004C, and 1004D of a trench-gated MOSFET with a planarized gate bus made in accordance with an embodiment of this invention. The surrounding silicon has been removed to reveal the 3-D structure of the polysilicon 1000. Gate bus 1003 includes stripe contact 1005 to provide continuous shorting of the gate bus by its overlying metal strapping (metal not shown). The parallel array of trench gates and gate busses is connected by the transverse polysilicon element 1002 which may be constructed using a narrow deep trench (as shown) or as a shallow trench similar to the gate bus 1003B. The surface of transverse bus 1002, wide gate bus 1003, and active cell array trench gates 1004A through 1004D as shown all share a substantially planar surface, a characteristically unique structural aspect of this invention.

FIG. 12 also illustrates how the embedded gates abut transverse bus 102 as a T-shape. In conventional trench MOSFETs using etch-back methods, the "T" shaped corner suffers from a depression or dimple in the top of the polysilicon due to the larger dimension of the trench opening (on the diagonal), making etch-back difficult to control. Using CMP planarization, the over-etching at the "T" shaped polysilicon junction is not a problem. Wide gate bus 1003 abuts transverse polysilicon bus 102 illustrating that the wide and the narrow trenches do in fact abut. Alternate layouts may also have narrow and wide trenches cross one another forming a "+" shaped junction, which would be even more difficult to manufacture using etch-back processes.

Figure 13A:
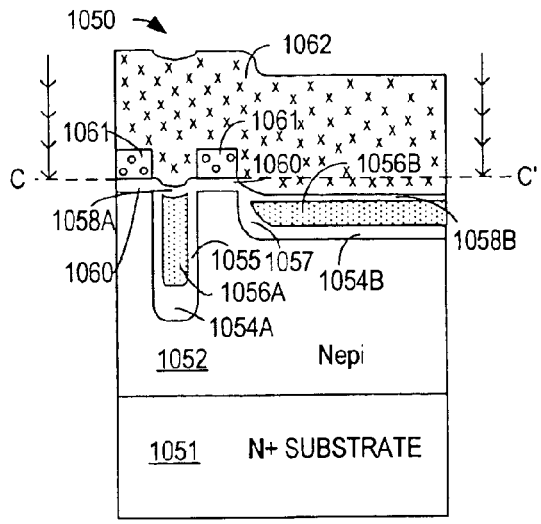
FIGS. 13A to 13G are cross sectional views illustrating of an optional process flow with CMP removing all dielectrics located above the silicon surface, FIG. 13A showing a structure after glass deposition, FIG. 13B showing the structure after a planarizing CMP, FIG. 13C illustrating oxide deposition, FIG. 13D illustrating a gate contact mask, FIG. 13E illustrating a contact etch, FIG. 13F illustrating CMP and/or etch-back planarization, and FIG. 13G illustrating the metallization.
Figure 13B:
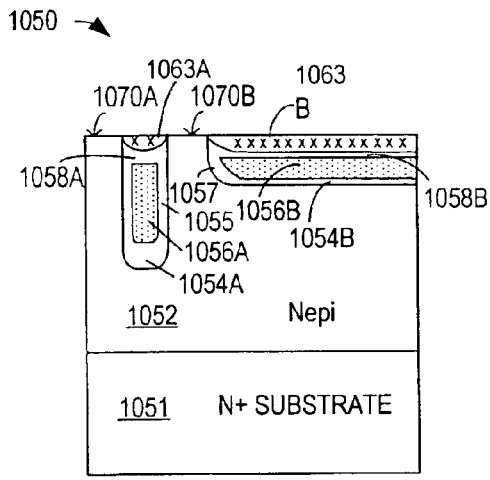
Figure 13C:
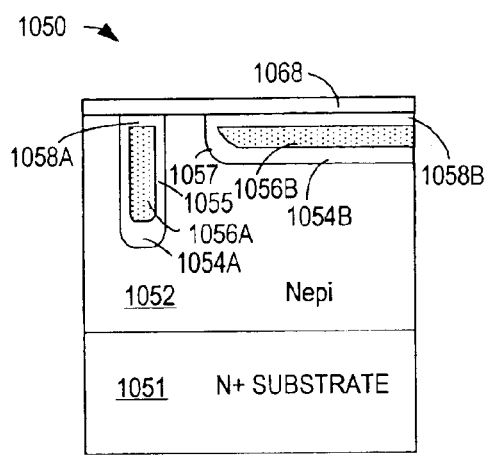
Figure 13D:
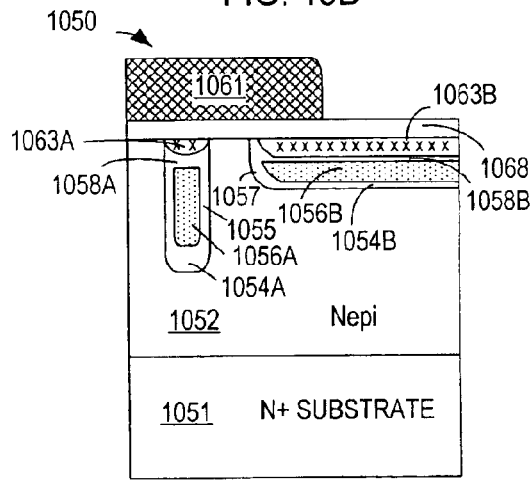
Figure 13E:
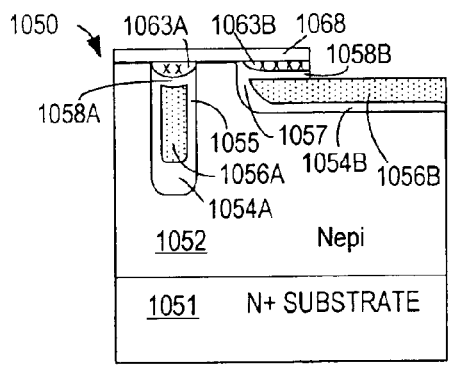
Figure 13F:
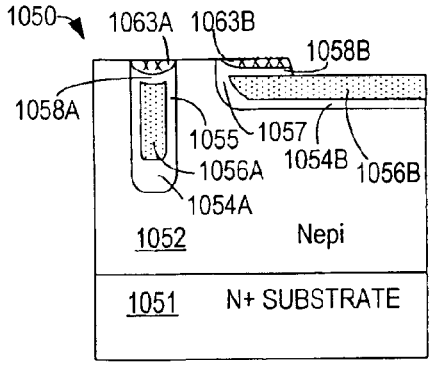

FIG. 13A illustrates device 1050 fabricated in steps similar to that of the device 450 of FIG. 11K, except that the planarization of the top dielectric or glass 1062 utilizes a CMP planarization down to cut line C–C', essentially down to the silicon surface itself. In this flow, the material located above the silicon surface is removed by the CMP planarization step, including the deposited glass 1062, nitride 1061, and all or part of thin mesa oxide 1060. The resulting structure is shown in FIG. 13B where only the portion of the deposited glass 1062 remaining after planarization are cap oxides 1063A and 1063B over the narrow and wide trenches, respectively. The structure of FIG. 13B can be contacted by masking and etching a contact window for the gate bus polysilicon 1056B. Alternatively, an additional planarization step can be added by depositing glass, silicon nitride, or other dielectric 1068, then performing an optional CMP or planarizing etch-back as shown in FIG. 13C. A contact window can then be defined photolithographically using photoresist 1061 as shown in FIG. 13D, exposing only the gate bus region (or optionally exposing portions of active areas but not exposing the top of the trenches in the active array). Etching the gate bus contact window is next performed using a plasma etch, reactive ion etch, or even a wet chemical to sequentially remove dielectric 1068, glass layer 1063B, oxide layer 1058, finally stopping on gate-bus polysilicon layer 1056B. After stripping photoresist 1061, the resulting structure is shown in FIG. 13E. Next, dielectric 1068 is stripped or removed using a plasma etch process as shown in FIG. 13F, preferably using a selective etch that etches dielectric layer 1068 at a much faster than glass layers 1063A and 1063B. In this way, the final etch used to expose the active area mesa regions does not erode or damage the dielectric cap 1063A located atop the active array trench.

Figure 13G:
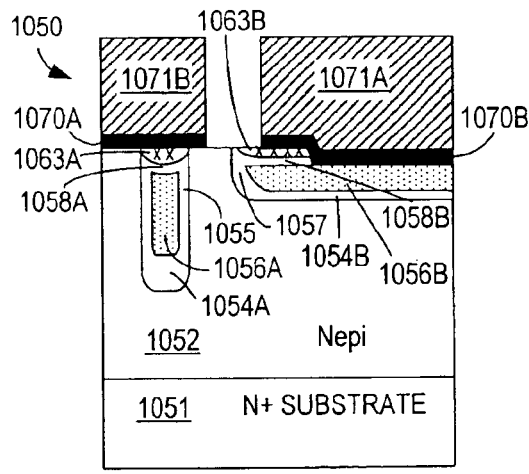

Thereafter, a barrier metal 1070A and 1070B such as TiN is formed, followed by a deposition of a thick metal 1071A and 1071B such as aluminum-silicon, Al—Si—Cu, or copper, and mask and etch process for the metal then completes fabrication of trench-gated MOSFET 1050 as shown in FIG. 13G.

To enhance the dielectric thickness atop the trench gates further, MOSFET 1056 of FIG. 13D can be masked and etched using patterned photoresist 1061 with contact windows open to the silicon mesas and the gate bus but not over the trench gates themselves. Such a device comprises a non-self-aligned contact mask version of a vertical trench-gated power MOSFET with a planarized gate bus.

Figure 14A:
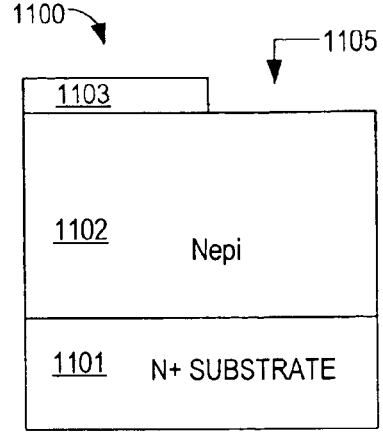
FIGS. 14A to 14P are cross sectional views illustrating an alternate process flow for fabrication of a vertical trench gated MOSFET, FIG. 14A illustrating buried gate bus mask definition, FIG. 14B illustrating wide trench etch and trench gate mask definition, FIG. 14C showing the structure after narrow trench etch and mask removal, FIG. 14D illustrating sacrificial oxide, oxide strip, and gate oxidation, FIG. 14E illustrating a polysilicon fill process, FIG. 14F illustrating CMP planarization, FIG. 14G illustrating polysilicon over-etch, FIG. 14H illustrating thin top oxidation, FIG. 14I illustrating glass deposition, FIG. 14J illustrating CMP and/or etch-back for dielectric planarization, FIG. 14K illustrating a contact mask having a single contact for both gate and active mesa regions, FIG. 14L illustrating a contact etch and optional glass flow (for a single contact process), FIG. 14M illustrating TiN (barrier metal) and Al—Cu—Si thick metal deposition, mask and etch (for a single contact process), FIG. 14N illustrating a gate contact mask and etch (for a dual contact mask sequence), FIG. 14O illustrating an active array contact mask and etch (for a dual contact mask sequence), and FIG. 14P illustrating TiN (barrier metal) and Al—Cu—Si thick metal deposition, masking, and etching (for a dual contact mask sequence).
Figure 14B:
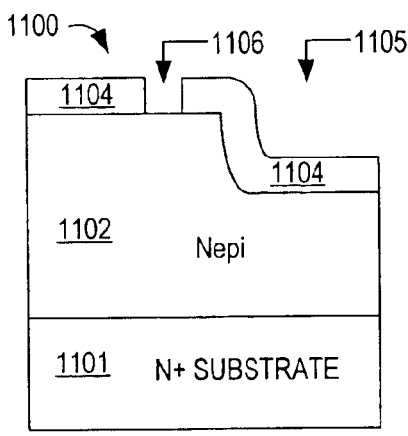
Figure 14C:
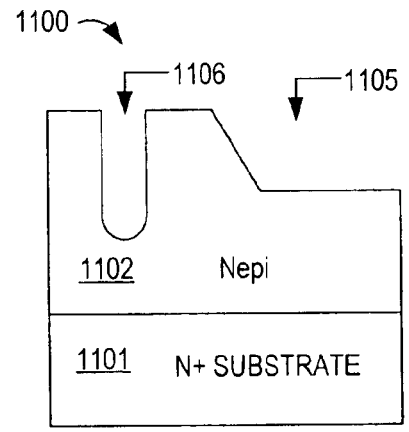
Figure 14D:
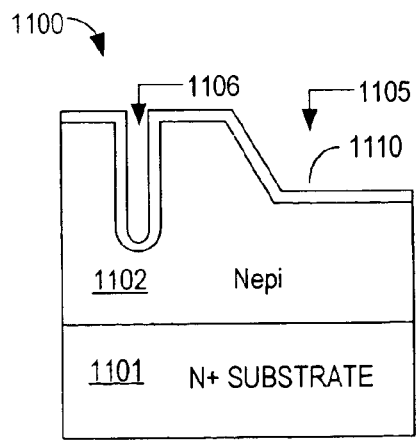
Figure 14E:
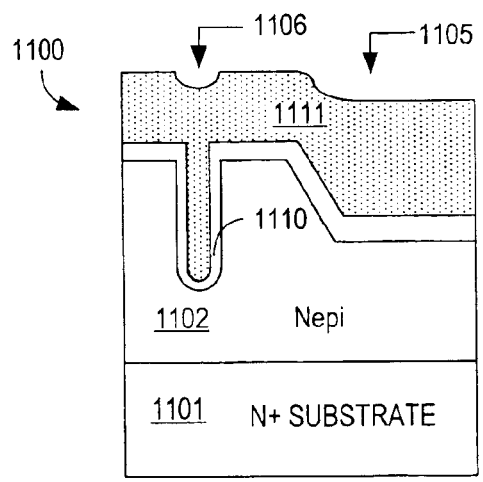
Figure 14F:
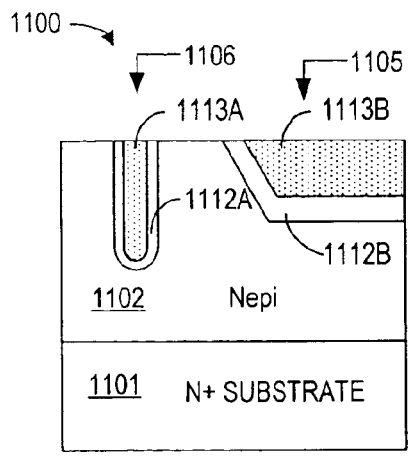
Figure 14G:
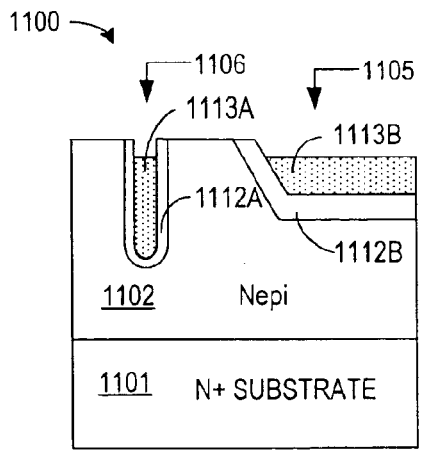
Figure 14H:
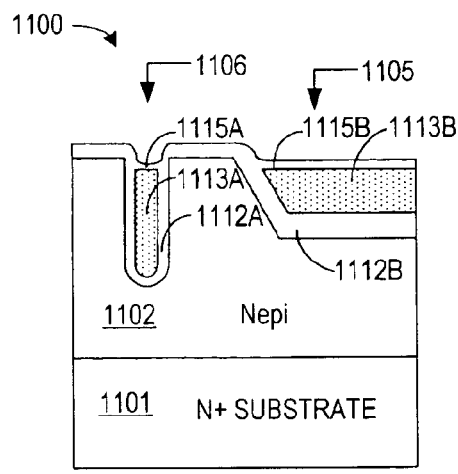
Figure 14I:
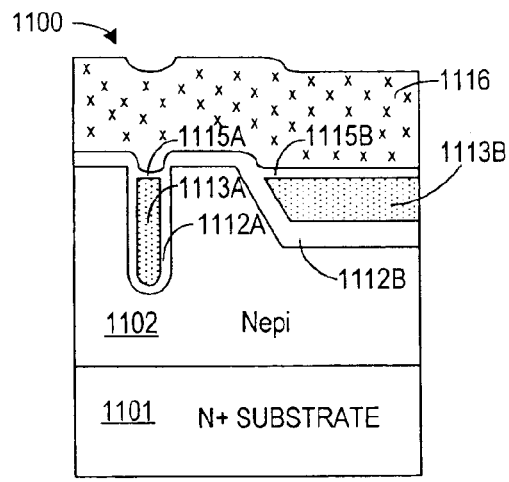
Figure 14J:
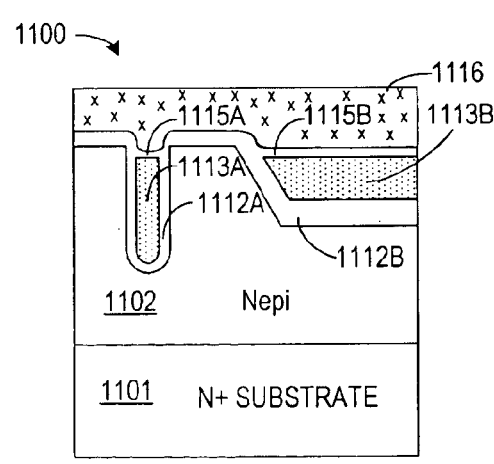
Figure 14K:
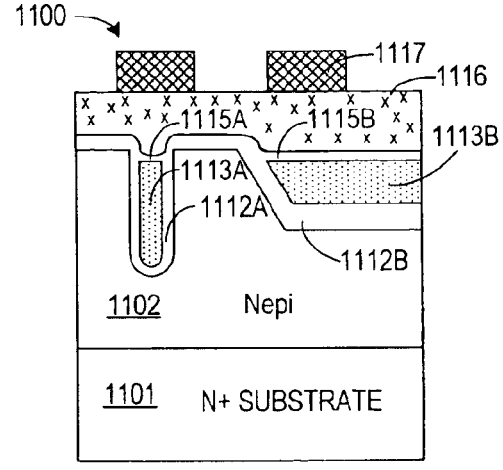
Figure 14L:
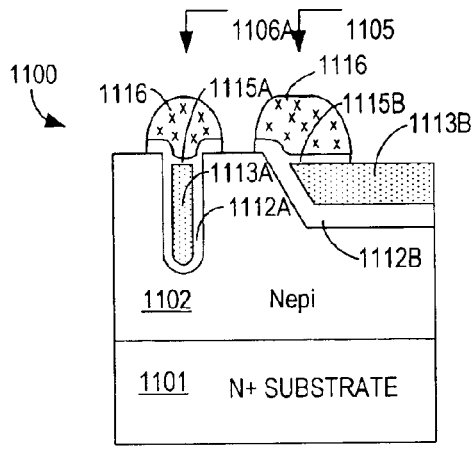
Figure 14M:
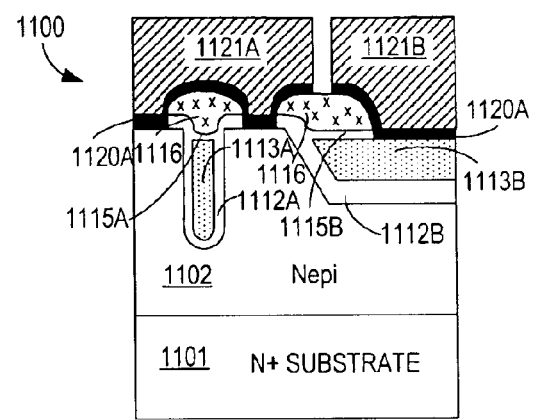
Figure 14N:
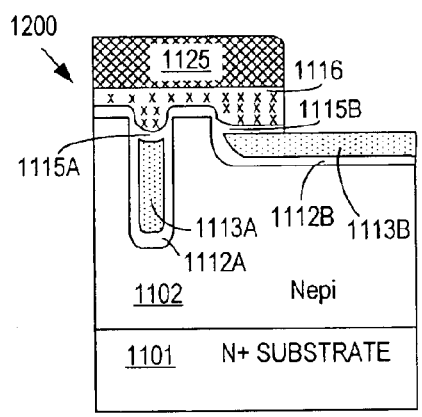
Figure 14O:
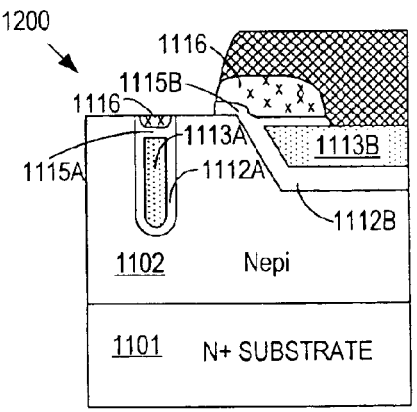
Figure 14P:
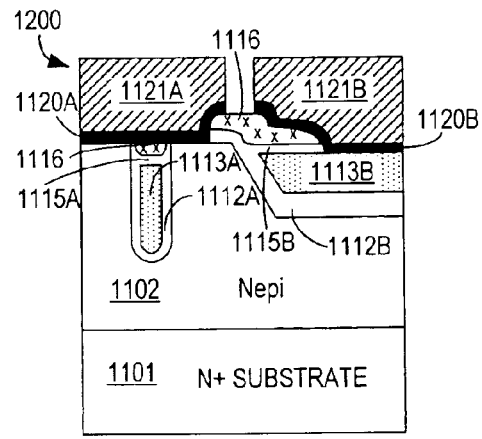

FIGS. 14A to 14P illustrate an alternate fabrication sequence for a trench-gated vertical power MOSFET 1100 having a planarized gate bus in accordance with an embodiment of the invention.

In FIG. 14A, mask 1103 is applied and patterned on epitaxial layer 1102, grown atop substrate 1101. Photomasking and optional etching techniques open a wide window and then a shallow trench to form gate-bus trench region 1105. Optionally, an implanted layer of dopant (not shown) may be introduced into the etched trench area while mask 1103 is still in place. In such an event the energy of such an implant must not penetrate the blocking mask 1103 except in the wide trench etched area.

In FIG. 14B, a second mask 1104 is applied and patterned to form narrow opening 1106. Mask 1104 must step down into trench 1105 without cracking or breaking while crossing the step formed at the edge of trench 1105. This goal may be accomplished by slightly edge-rounding the trench etch used to form gate bus trench 1105, using thick photoresist, having a thickness greater than 1 µm, or using a conformal dielectric, either thermally grown oxide or a conformally deposited material such as silicon nitride to form mask 1104. After the narrow trench 1106 is etched, mask 1104 is removed as shown in FIG. 14C. The silicon may then be oxidized, and etched to remove defects using any sacrificial oxidation process, well known to those skilled in the art. Thereafter, gate oxide 1110 is grown uniformly across the silicon surface and along the etched sidewalls and bottom portions of gate bus trench 1105 and active trench 1106 as shown in FIG. 14D. Polysilicon 1111 is then deposited with optional in-situ doping in FIG. 14E, followed by a planarization using CMP with or without a planarizing etch-back step.

During the planarization step, the exposed surface becomes separated into three regions including wide planarized gate bus region 1105, active-array narrow trenches 1106, and intervening silicon mesas. The resulting structure is shown in FIG. 14F. During the planarization process, polysilicon 1111 and gate oxide 1110 are split along the illustrated cross-section into active-array embedded gate polysilicon 1113A and gate oxide 112A (located within narrow trench 1116); and gate bus polysilicon 1113B and lining oxide 112B in wide trench 1105. Ideally, gate bus lining oxide 1112B should be thicker than gate oxide 1112A to reduce parasitic capacitance, but this feature requires extra processing steps not shown in this sequence. Oxidizing the wide trench prior to forming the narrow gate trench is, however, compatible with the process to form device 1100.

In FIG. 14G, the gate and gate-bus polysilicon regions, respectively 1113A and 1113B are over-etched into the respective trenches to facilitate embedding the trench gates below the surface. In FIG. 14H, a thin oxide 1115B, typically 100 Å to 700 Å is grown by thermal oxidation. During this operation, the embedded polysilicon gates 1113A and gate bus 1113B become partially consumed to grow oxide 1115A and 1115B. Likewise, unprotected by silicon nitride, the silicon mesa portions of epitaxial layer 1102 also become oxidized. Next glass 1116 is deposited, as shown in FIG. 14I and subsequently planarized using CMP or etch-back methods to produce the cross section of FIG. 14J. Unlike in other illustrated embodiments in accordance with this invention, in FIG. 14J, the glass layer 1116 is not etched all the way back to the surface of the silicon mesas.

In FIG. 14K, photolithographically patterned photoresist 1117 forms a contact mask protecting regions of glass layer 1116 over the active area trenches 1106 and the edge of the wide trench gate bus region 1105. The creation of contact mask 1117, however, requires alignment to the trenches, thereby limiting the maximum density of trenches in the device. In FIG. 14L, the glass layer 1116 is etched and optionally flowed, i.e., heated slightly (e.g., at 900° C. for 10 minutes) so the glass redistributes to produce smooth edges, especially atop trenches 1106 where metal voiding between the trenches is a potential risk (as described in the background of this disclosure). The smooth edges of post-flow glass 1116 covering the gate bus 1105 edge also prevent metal breakage and step coverage issues.

Lastly, barrier metal 1120A and 1120B (such as TiN), is then deposited, followed by thick metal 1121A and 1121B (such as Al—Cu—Si), and subsequently patterned into source metal and gate bus metal regions as shown in FIG. 14M.

FIGS. 14N to 14P illustrate an alternate process flow that involves performing the contact opening using a two-step, two-mask process to etch glass 1116 when forming a device 1200. Starting with a first contact mask and photoresist 1125, this first contact mask permits etching glass 1116 only atop the gate bus region 1105 while contact mask 1125 protects the remainder of the device from etching as shown in FIG. 14N. A second contact mask is then defined in photoresist layer in FIG. 14O that protects the gate bus region and exposes only the active array of trenches to etching. After contact etching, metallization is performed, followed by patterning and etching, resulting in the device shown in FIG. 14P, where glass 1116 covers the silicon surface between metal regions 1121A and 1121B.

FIGS. 15A to 15I illustrate the fabrication steps of an alternate process for forming a trench-gated MOSFET with a planarized gate bus, employing a thick bottom oxide process to form thick oxides at the bottom of narrow active trenches and a thick oxide lining of the wide trench gate bus structure.

Figure 15A:
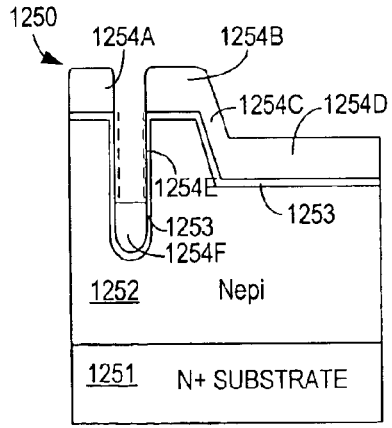
FIGS. 15A to 15I are cross sectional view illustrating of an alternative process flow for fabrication of a vertical trench gated MOSFET with capping dielectric, FIG. 15A illustrating wide and narrow trenches after thick bottom oxide deposition, FIG. 15B showing the structure after sacrificial sidewall oxide removal and gate oxidation, FIG. 15C illustrating polysilicon fill, FIG. 15D illustrating a CMP planarization, FIG. 15E illustrating capping dielectric deposition (e.g., of $Si_3N_4$), FIG. 15F illustrating a planarizing etch-back and/or CMP of the capping dielectric, FIG. 15G illustrating a gate contact mask, FIG. 15H showing the structure after a gate contact etch (and photoresist strip), and FIG. 15I illustrating TiN (barrier metal) and Al—Cu—Si thick metal deposition, masking and etching.

In FIG. 15A, device 1250 includes a silicon substrate 1251 and epitaxial layer 1252 in which already completed fabrication steps have formed a wide trench and a narrow trench in accordance with this invention. Subsequently the surface of the mesas and trenches is thermally oxidized to form lining oxide 1253, preferably to a thickness of 200 Å to 1000 Å. Thereafter, thick bottom oxide 1254F is deposited using directional deposition in accordance with U.S. Pat. No. 6,291,298, which was incorporated by reference herein above. The directionally deposited thick bottom oxide, or TBOX, is formed through high-density plasma CVD to a thickness of 1000 Å to 4000 Å at the trench bottoms. During the TBOX deposition some oxide 1254E forms on the narrow vertical trench sidewall, which may easily be removed by a short acid dip in dilute HF acid. To minimize the sidewall deposition during TBOX processing, the narrow trench's sidewall must form an angle (relative to the mesa surface) greater than 90% and ideally over 94%, which also facilitates planarizing refills. The TBOX process also produces thick oxide regions 1254A and 1354B atop the silicon mesas and 1254D in the bottom of the wide trench. Also shown in FIG. 15A, oxide 1254C is deposited along wide trench sidewall, which is significantly thicker than vertical sidewall oxide 1254E. The angle of the wide trench's sidewall must be greater (more-sloped) than that of the narrow trenches, and ideally should form an angle of around 30° to 50°.

The thick sidewall oxide 1254C along with the TBOX bottom oxide 1254D formed in the wide gate bus trench benefits device 1250 by reducing electric fields and substantially lowering gate-to-source capacitance associated with the gate bus structure. The capacitance of a planarized gate bus having a 3000 Å oxide formed using the TBOX process is one-fifth to one-tenth that of a device employing only a gate oxide to line the wide trench.

Figure 15B:
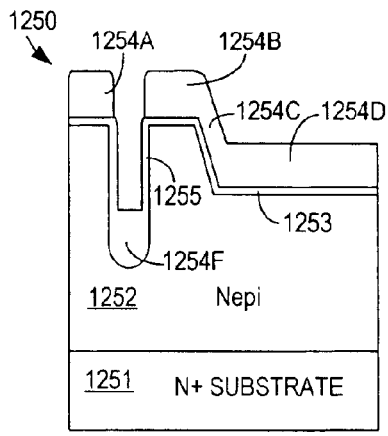
Figure 15C:
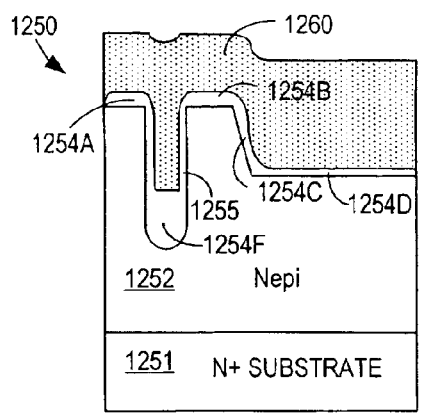
Figure 15D:
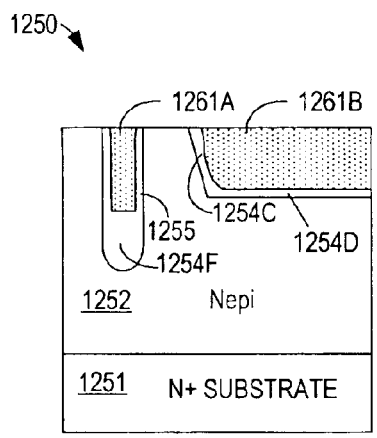
Figure 15E:
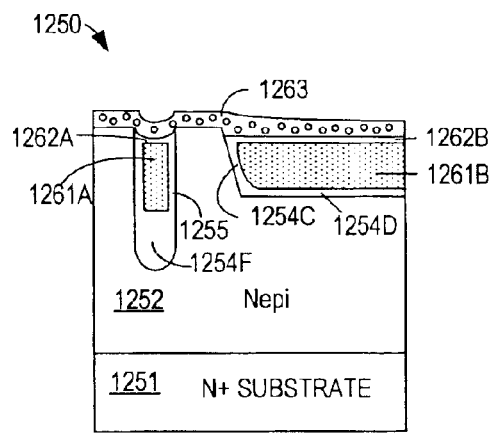
Figure 15F:
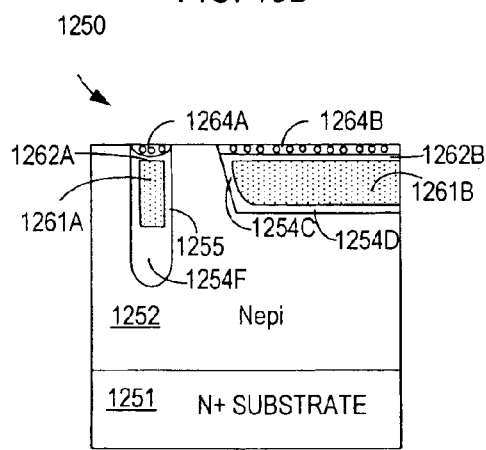
Figure 15G:
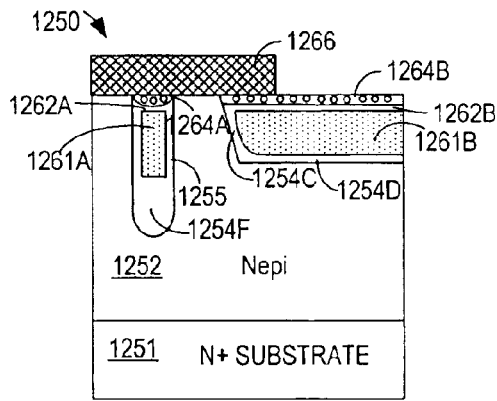
Figure 15H:
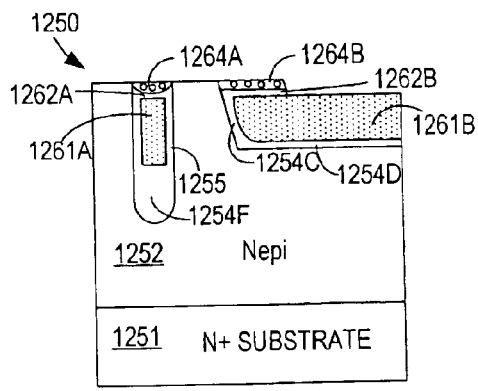
Figure 15I:
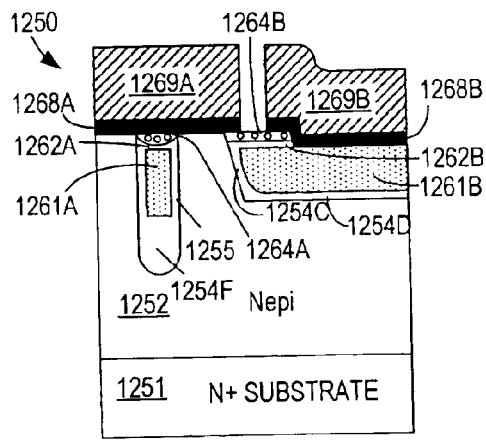

After the short acid dip (to remove the vertical sidewall oxide in the narrow trench), gate oxide 1255 is thermally grown as shown in FIG. 15B. Since thick oxide 1254 covers the rest of the device, the amount of oxidation in the wide trench and atop the silicon mesas is not substantial. The two trenches are then simultaneously filled with a single polysilicon CVD operation as shown in FIG. 15C. Beyond this step, the process flow is similar to the other flows previously described in this disclosure, including planarizing etch-back or CMP shown in FIG. 15D, polysilicon over-etch followed by thermal oxidation 1262A and 1262B, and dielectric or glass deposition 1263 in FIG. 15E, second planarizing CMP or etch-back in FIG. 15F, followed by any contact mask sequence described in accordance with this invention. In FIG. 15G, for example, a contact mask is performed to contact trench gate bus 1261B, followed by resist stripping and cleaning to clear the mesa regions shown in FIG. 15H, and finally by metallization and metal etching in FIG. 15I.

In the exemplary devices and process described thus far, no provision has been included to reduce the signal propagation delay through the array of active trench gates (aside from heavily doping the polysilicon), nor to eliminate the need for strapping the thick metal along the length of the gate bus. FIGS. 16A to 16H, however, illustrate a modification to the aforementioned devices and processes to form a trench-gated MOSFET with a planarized gate bus in accordance with an embodiment of the invention that introduces a high-conductivity metal into the trench devices and into the gate bus, thereby enabling higher speed or higher frequency device operation.

Figure 16A:
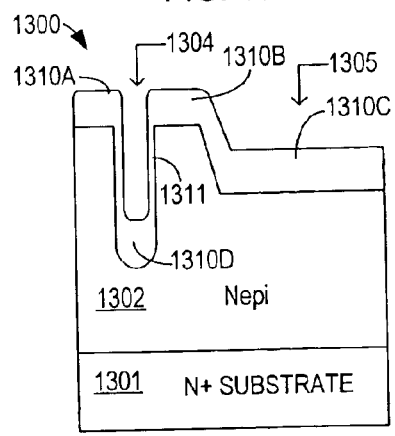
FIGS. 16A to 16H are cross sectional view illustrating a process flow for fabrication of a vertical trench gated MOSFET with buried silicided gate, FIG. 16A illustrating gate oxidation after thick bottom oxide directional CVD in wide and narrow trench structures, FIG. 16B illustrating a first polysilicon (lining) deposition, FIG. 16C illustrating a high-temperature metal deposition (e.g., of titanium or tungsten), FIG. 16D illustrating a metal etch-back, FIG. 16E illustrating a second polysilicon (sealer) deposition, FIG. 16F illustrating CMP planarization and silicide reaction, FIG. 16G illustrating polysilicon etch-back, top oxide formation and planarization, and FIG. 16H illustrating gate contact masking and barrier metal and Al—Cu—Si thick metal deposition and masking.

Starting with device 1300 shown in FIG. 16A, previously described processes form narrow and wide trench regions 1304 and 1305 respectively in an epitaxial layer 1302 atop substrate 1301. Thick bottom oxide 1301D has been formed in narrow trench 1304, and trench 1305 contains thick oxide 1310C (including a thick sidewall oxide). Gate oxide 1311 lines the vertical sidewall of narrow trench 1304.

Figure 16B:
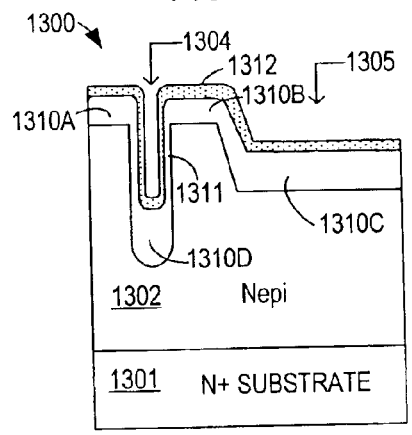

In FIG. 16B, a thin polysilicon layer 1312, from 200 Å to 2000 Å but preferably around 400 Å to 900 Å is deposited. Since the deposition produces a thin layer, polysilicon 1312 is relatively conformal and should not fill or overfill narrow trench 1304. This step is significantly different from prior trench process described herein or in the industry since the polysilicon intentionally should and must not fill the narrow trench 1304.

Figure 16C:
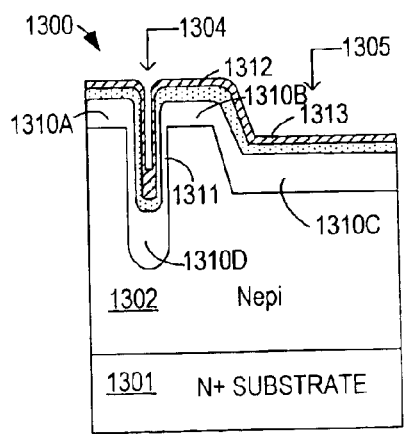

In FIG. 16C, a high-temperature refractory metal 1313 such as tungsten, platinum, titanium, chromium, or cobalt is deposited by sputtering, chemical vapor deposition, or chemical decomposition using methods well known to those skilled in the art. Evaporation is not a preferred means of deposition for high temperature metal since their melting point can be well over 1100° C. The deposited metal may be 100 Å to 2000 Å in thickness but is preferably in the range of 500 Å to 1500 Å. The thickness of the deposited metal should be chosen such that twice the combined thickness of gate oxide 1311, sidewall polysilicon 1312, and high-temperature metal 1313, should not significantly exceed the width of narrow trench 1305. In other words, significant overgrowth of metal 1313 outside and over the top of narrow trench 1305 is not desirable since it can make subsequent processing and planarization difficult and prone to gate shorts.

Figure 16D:
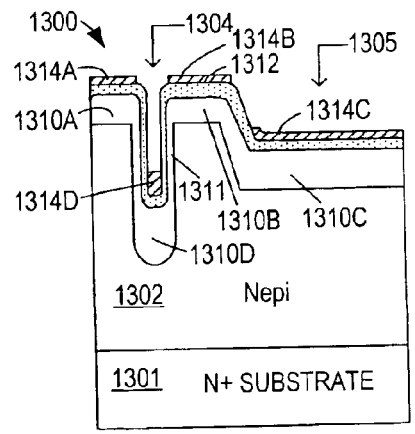

A short acid dip or etch is performed in FIG. 16D to clear any metal or metal residue from the trench sidewalls, especially in the narrow trench active array regions. High temperature metal 1313 is thereby divided into pieces 1314A and 1314B on top of the silicon mesas and into pieces 1314D and 1314C located at the bottom of the trenches.

Figure 16E:
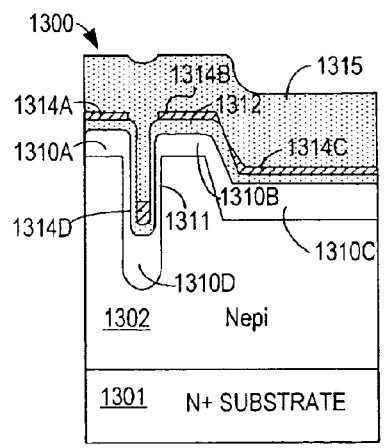

In FIG. 16E, a second polysilicon 1315 is deposited to a substantial thickness, ideally over 4000 Å, to fill and overflow the trenches and in so doing, planarize the structure. Moreover, second polysilicon layer 1315 seals the high temperature metal 1314D inside a lining of polysilicon comprising polysilicon layer 1312 underneath and 1315 on its top, all contained within narrow active array trenches. Polysilicon 1315 also seals high temperature metal 1315C inside the wide gate-bus trench, surrounded by first polysilicon 1312 underneath and second polysilicon 1315 atop high temperature metal 1314D. On the silicon surface (i.e., atop the mesa regions), second polysilicon 1315 covers high temperature metal regions 1314A and 1314B.

Figure 16F:
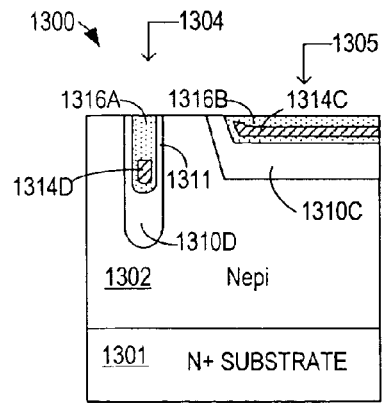

Next the wafer is planarized, preferably with CMP, to remove the overlying polysilicon, high temperature metal, and dielectrics lying above the mesa silicon surface. The result is shown in FIG. 16F, illustrating the complete removal of the surface layers, now separated and contained entirely within narrow trench 1304 and wide gate-bus trench 1305. Specifically, narrow trench 1304 now contains the following elements: thick bottom oxide 1310D, gate oxide 1311, polysilicon 1316A (comprising both first and second polysilicon depositions), and embedded high temperature metal or silicide 1314D. Wide trench 1305 is filled with thick lining oxide 1319C, polysilicon 1316B, and embedded, high temperature metal or silicide 1314C.

Figure 16G:
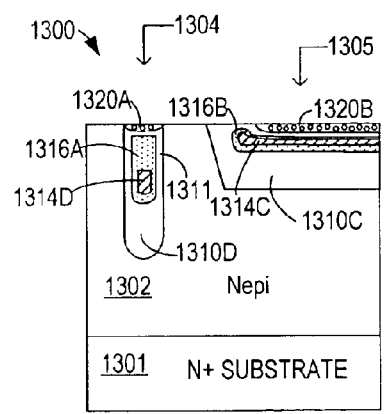
Figure 16H:
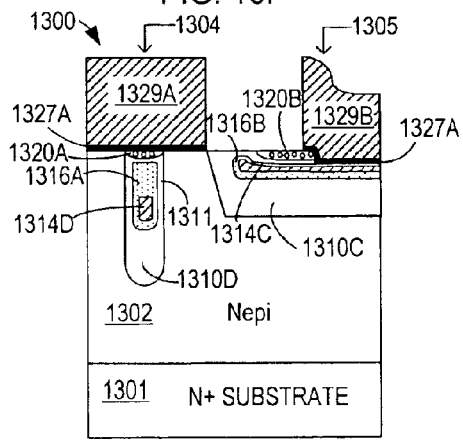

At this step, dopant (not shown) may easily be introduced into the silicon mesa regions to form the DMOS body and source regions, either by chained ion implantation or by ion implantation and subsequent diffusion. In FIG. 16G, the top portions of polysilicon regions 1316A and 1316B are etched back, oxidized to form thin oxide 1321A and 1321B. Dielectric deposition (e.g., using glass, silicon nitride, or another dielectric) and etch-back or CMP then form top dielectrics 1320A and 1320B. In FIG. 16H, etching of a contact opening for the gate bus and then metallization is completed to form barrier metal 1327A and 1327B, and thick metal 1329A (source) and 1329B (gate bus).

Regions may also be formed containing wide trench 1305 where the gate contact and gate metal 1327B are excluded. Such regions may in fact be covered with source metal 1327A yet still serve to propagate gate signals quickly along its embedded gate metal 1314C.

In every process shown with high temperature metal, the metal may receive a heat treatment, such as 30 minutes at 950° C. to react the metal and the polysilicon layers to form a metal-silicide such as platinum-silicide, tungsten-silicide, etc. Without annealing, the metal and polysilicon layers remain separate and distinct, and the intermetalic combination phase of metal-rich silicon is not formed at their interface.

Figure 17:
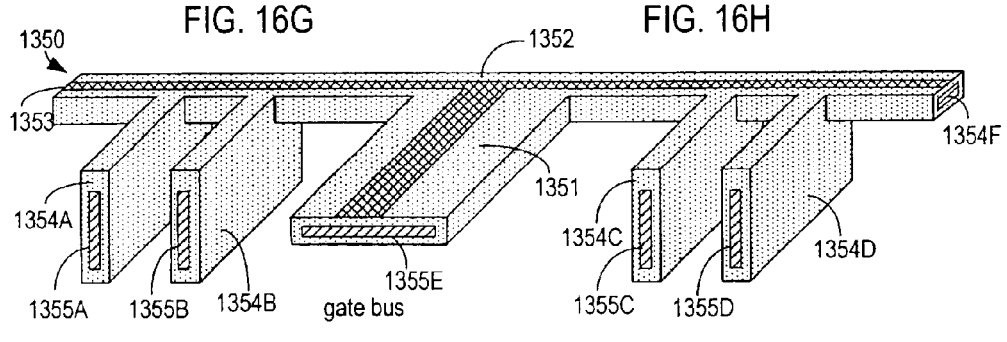
FIG. 17 is a perspective view of a polysilicon trench gate and buried gate bus with embedded silicide.

FIG. 17 illustrates the polysilicon portion of the device in 3D projection made in accordance with this invention with the silicon and dielectrics portions removed. The device contains active-array polysilicon gate portions 1354A, 1354B, 1354C, and 1354D with embedded high temperature metal or silicide portions 1355A, 1355B, 1355C and 1355D, respectively. A polysilicon gate bus contains parallel portions 1351 and transverse portions 1352 with embedded high temperature metal or silicide 1355E and 1355F respectively. Gate bus also includes optional contact area 1353 running along the top of the gate bus regions and shorted by top metal (not shown). Such a polysilicon gate facilitates rapid propagation of signals across a large area device, while offering the benefit of co-planarity with the top of gate bus and active polysilicon regions.

Figure 18A:
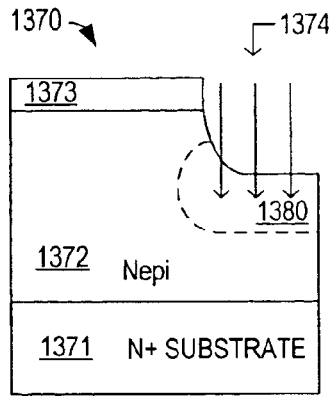
FIGS. 18A to 18D are cross sectional views illustrating dopant introduction steps compatible with a fabrication process for a trench gated MOSFET having buried gate bus, FIG. 18A illustrating a P-type well implanted into wide trench (below a gate bus), FIG. 18B illustrating active mesa P-type body formation using masked chained implant method, FIG. 18C illustrating source mask and N+ ion implantation, and FIG. 18D illustrating a shallow P+ mask and implant process.

In another aspect of this invention, dopant atoms may be introduced into the portion of silicon below the wide trench gate bus. In a preferred embodiment 1370 shown in FIG. 18A, dopant is introduced into wide trench 1374 by ion implantation to form doped region 1380, whose depth may be determined by ion implantation energy, or by an optional subsequent diffusion. The implant may comprise a single implant or chain implant and is generally preferable to be of the opposite conductivity type to epitaxial layer 1372. If for example, epitaxial layer 1372 is N-type, then region 1380 may be P-type, doped with boron to a concentration ranging from slightly higher than the epitaxial doping to a concentration as high as 5E19 $cm^{-3}$ but preferably in the range of 1e17 $cm^{-3}$ to 4E18 $cm^{-3}$.

Figure 18B:
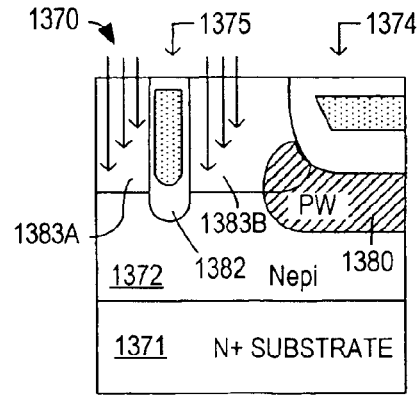

The depth of doped region 1380 may extend from 0.1 μm to several μm, but generally should not extend substantially deeper than the depth of a narrow trench gate 1375 as shown in FIG. 18B. Ideally, if thick bottom oxide is employed, the depth of region 1380 should extend deeper than the polysilicon gate, but more shallow than the narrow active-array trench 1375 itself. For example, if the active narrow trench 1375 is 1.6 μm deep containing a thick bottom 1382 oxide 3000 Å thick, then the depth of region 1380 may be targeted for 1.4 μm relative to the silicon (mesa) surface, deeper than the polysilicon gate but shallower than the narrow trench 1375. If the wide trench 1374 is etched to a depth of 0.7 μm, the implant or diffusion of region 1380 would result in a depth 0.7 μm below the bottom of the wide trench 1374 after etching.

Implants may range from 50 keV to 2 MeV but the deepest implant preferably will have maximum implant energy of 400 keV. Implant doses may range from 2E12 to 3E15 cm$^{-2}$ but typically will be in the range of 5E13 to 7E14 cm$^{-2}$. After the gate and gate bus trenches are formed in accordance with this invention, the DMOS body regions 1383A and 1383B may be introduced by ion implantation and diffusion, or by chained ion implantation as described previously. Since the body region and the PW region are of the same conductivity type, the two P-type regions merge to form a complete enclosure of dopant surrounding wide trench 1374, shielding the gate bus from high drain potentials.

Figure 18C:
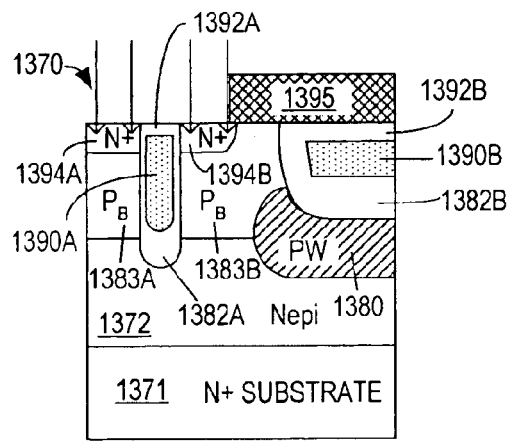
Figure 18D:
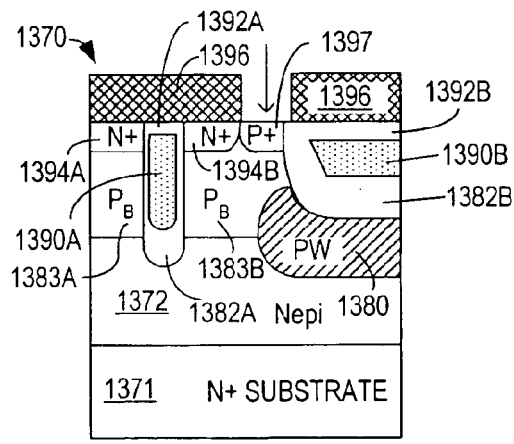

In FIG. 18C, shallow N+ source regions are introduced in accordance with this invention, having concentrations in the range of 4E19 to 7E19 cm$^{-3}$ and a depth of 0.2 μm to 0.5 μm. Implant doses may range from 3E15 cm$^{-2}$ to 7E15 cm$^{-2}$ and implant energies may range from 20 to 80 keV for phosphorus or 60 to 139 keV for arsenic. N+ source 1394A and 1394B may be masked by photoresist 1395 but otherwise self align to trench gates 1375, just as P-type body 1383A and 1383B does. The channel length of the vertical DMOS device is set by the difference of the P-type body 1383 junction depth and the N+ source 1394 junction depth. Shallow P+ regions 1397 are then introduced to improve contact to the P-type body regions 1383, as shown in FIG. 18D. The shallow implants may be masked by photoresist 1396 or performed as a blanket implant. Boron implantation to form P+ 1397 may be in the range of 7E14 cm$^{-2}$ to 7E15 cm$^{-2}$ but should not substantially counter-dope N+ 1394, especially in the case where a blanket P+ implant is used. Implant energies may range from 30 keV to 120 keV but should not result in a P+ depth substantially deeper than N+ 1394 in the event of a blanket P+ implant, otherwise the channel concentration of P-type body region 1383 along the sidewall of active trench 1375 may be disturbed.

FIGS. 18A to 18D are not meant to be limiting in process sequence, but to exemplify that dopants may be introduced into the structures formed in accordance with this invention (combining narrow active trenches and wide shallow trenches) to produce trench-gated vertical DMOS devices.

Figure 19A:
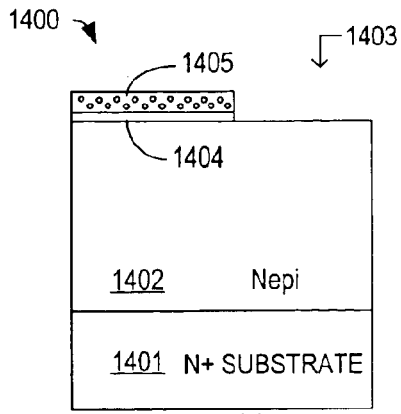
FIGS. 19A to 19D illustrate wide trench formation using an etched LOCOS technique, FIG. 19A illustrating a wide trench mask and $Si_3N_4$ etch, FIG. 19B illustrating a thick field LOCOS, FIG. 19C illustrating narrow trench mask definition and etching, and FIG. 19D illustrating a nitride and oxide strip.
Figure 19B:
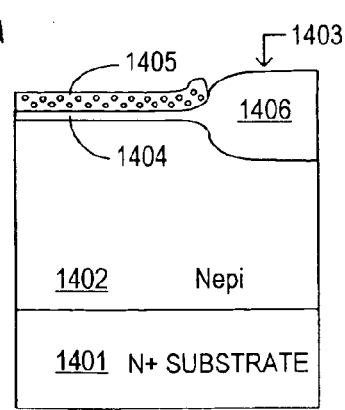

FIGS. 19A to 19D illustrate the cross sections of an alternate process to form a trench-gated MOSFET with a planarized gate bus. In this example, the wide trench is not formed by trench etching but by LOCOS oxidation and oxide removal. FIG. 19A starts with a patterned oxide (1404) nitride (1405) hard mask similar to prior descriptions herein. Next, wide gate bus region 1403 is exposed to oxidation, typically to form an oxide 1406 having a thickness of 3000 Å to 7000 Å as shown in FIG. 19B. A portion of oxide 1406 lifts silicon nitride layer 1405 to form the familiar "birds beak" shape common to LOCOS field oxidation processes. The field oxidation process may be performed from 800° C. to 1100° C. but typically at 950° C. for a time of 30 min to several hours. The encroachment of oxide under the silicon nitride layer 1405 can cause stress, which is relieved by oxide 1404, already used previously as part of the trench hard mask.

Figure 19C:
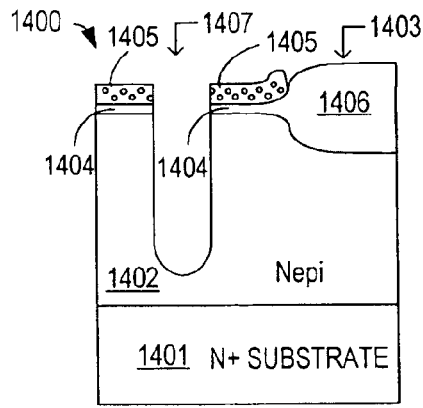
Figure 19D:
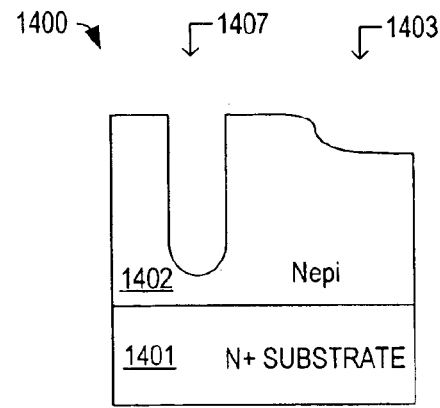

In FIG. 19C, narrow trench 1407 is formed by masking and etching while oxide 1406 remains protected. Alternatively, if an etch chemistry of the plasma etching has good selectivity between silicon and oxide, then layer 1406 can remain exposed during the silicon trench etch. Even if it is partially removed, it does not affect subsequent device fabrication so long as the dry etch does not penetrate through oxide 1406 (an unlikely event). In FIG. 19D the silicon nitride and all oxide regions are stripped, leaving silicon epitaxial layer 1402 containing a wide sloped trench region 1403 (formed by oxidation) and narrow active trenches 1407. The depth of wide gate bus trench 1403 is roughly half that of the oxide thickness grown. Accordingly, this method is not practical for wide trench regions deeper than approximately 0.4 μm, since the very thick oxidation would require excessive time and produce too much stress at the nitride edge.

After wide and narrow trenches have been formed, fabrication of a trench gated DMOS with a planarized gate bus may proceed using previously described methods in accordance with this invention.

Figure 20A:
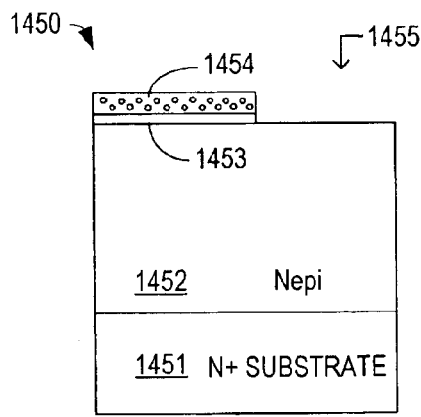
FIGS. 20A to 20E illustrate alternative wide trench formation processes using etched LOCOS technique, FIG. 20A illustrating a wide trench mask and $Si_3N_4$ etch, FIG. 20B illustrating a thick field LOCOS, FIG. 20C illustrating a LOCOS oxide strip, FIG. 20D illustrating nitride overhang etch and P-type well masked and implanted into a wide trench, and FIG. 20E illustrating a narrow trench mask definition and etching.
Figure 20B:
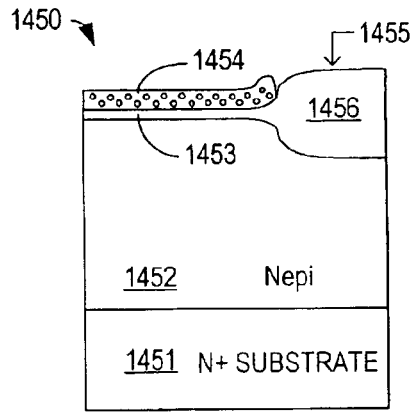
Figure 20C:
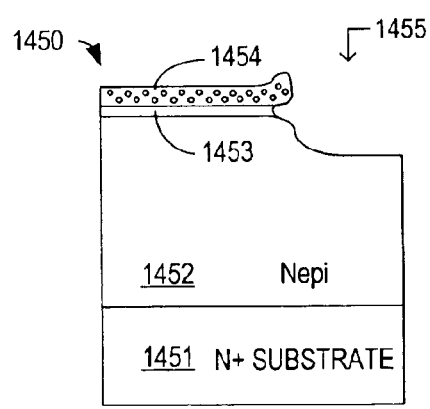
Figure 20D:
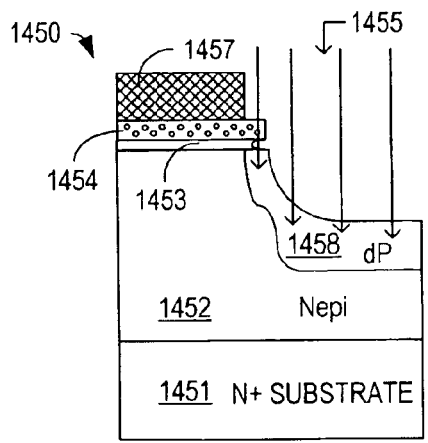
Figure 20E:
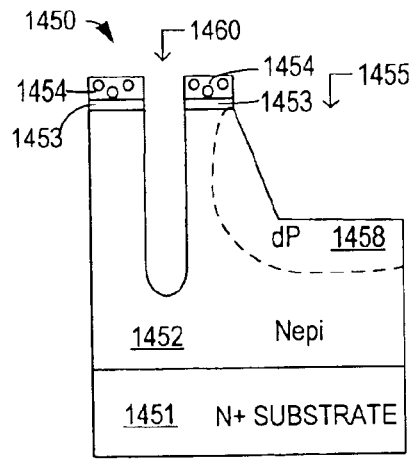

An alternate process used to form a trench gate MOSFET 1450 in accordance with this invention is shown in FIGS. 20A to 20E. Starting with a hard mask in FIG. 20A, followed by a thick oxidation in FIG. 20B, an oxide etch is next performed to remove field oxide 1456 while leaving nitride 1454 and oxide 1455 hard-mask in place. As shown in FIG. 20C, some nitride overhang may result which can be dipped off in a short acid etch. In FIG. 20D, gate bus boron implant 1458 is next introduced into wide trench 1455, while the hard mask layers 1453 and 1454 and optional photoresist 1457 layers block the implant from penetrating the mesa regions. In FIG. 20E, narrow trench 1460 is defined and etched, leaving portions of nitride 1454 and oxide 1453 intact. Fabrication then may proceed in accordance with this invention.

Figure 21A:
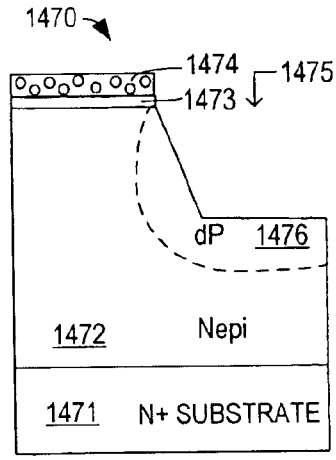
FIGS. 21A to 21I are cross sectional views illustrating process steps for wide trench fill and buried polysilicon gate bus formation, FIG. 21A illustrating a wide trench after P-type well formation, FIG. 21B illustrating wide trench oxidation, FIG. 21C illustrating polysilicon deposition, FIG. 21D illustrating CMP planarization, FIG. 21E illustrating narrow trench mask definition and etching, FIG. 21F illustrating narrow trench polysilicon fill with optional embedded silicide comprising a first polysilicon (lining) deposition, a high temperature metal deposition, and a second polysilicon (sealant) deposition, FIG. 21G illustrating CMP planarization, FIG. 21H illustrating trench fill etch-back and top dielectric deposition, and FIG. 21I illustrating CMP planarization.
Figure 21B:
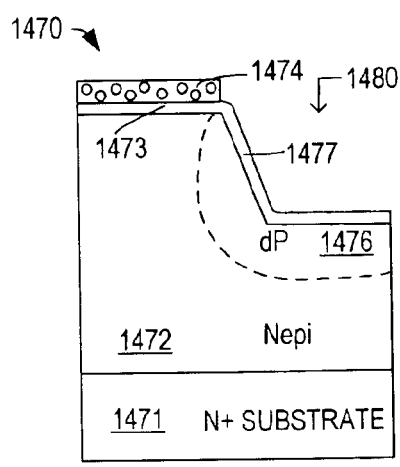
Figure 21C:
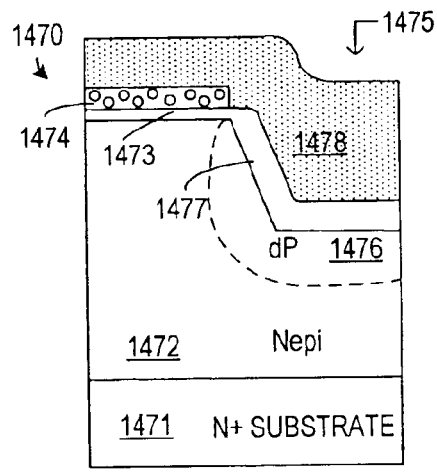
Figure 21D:
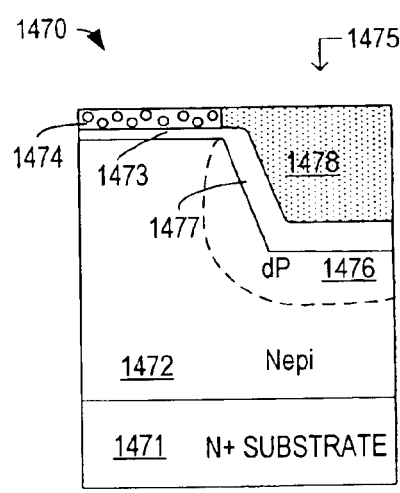
Figure 21E:
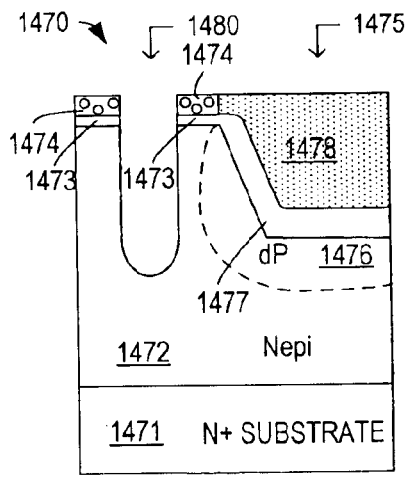
Figure 21F:
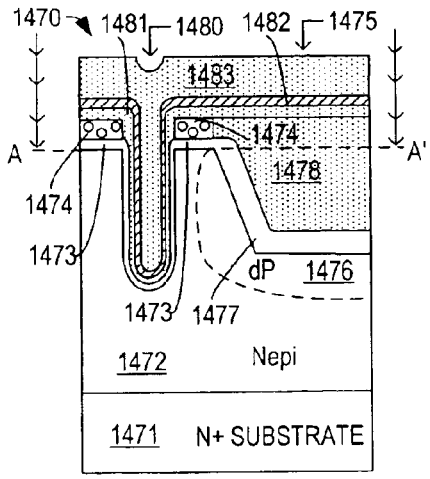

Another alternate process used to form a trench gate MOSFET 1470 in accordance with this invention is illustrated in FIGS. 21A to 21I. After wide trench 1475 shown in FIG. 21A has been formed by either trench etch or LOCOS methods, and subsequently implanted to form doped region 1476, then wide trench 1475 is oxidized to form lining oxide 1477 as shown in FIG. 21B. Lining oxide may be 1000 Å to 3000 Å in thickness. In FIG. 21C, polysilicon 1478 is deposited and planarized by etch-back or CMP as shown in FIG. 21D, where the polysilicon is contained entirely in wide trench 1475. Thereafter, in FIG. 21E, narrow trench 1480 is etched, followed by the formation of gate oxide 1485, second polysilicon 1481, high temperature metal 1482, and lastly third polysilicon 1483 in FIG. 21F.

Figure 21G:
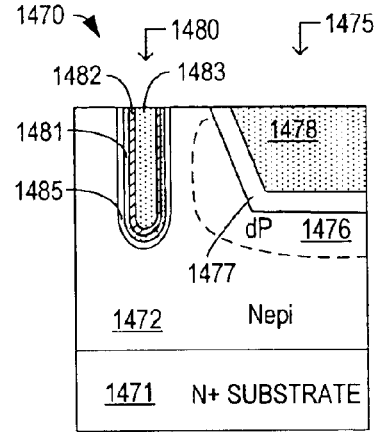
Figure 21H:
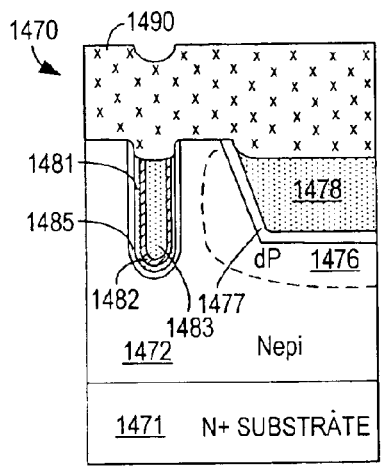
Figure 21I:
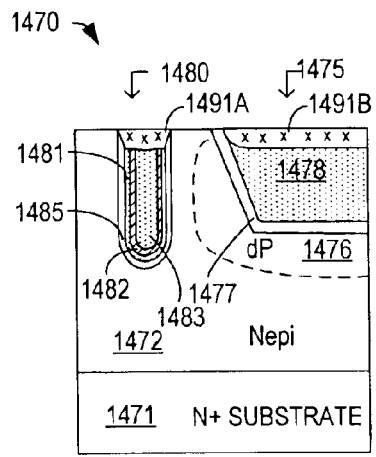

Planarization of the wafer by CMP results in the structure shown in FIG. 21G, having different polysilicon in the gate bus 1475 and narrow gate trenches 1480, where only the narrow gates contain the high temperature metal or silicide 1482. In FIG. 21H, the polysilicon is etched back into the trenches and a capping dielectric or glass is deposited and planarized to form dielectric caps 1491A on the active trench 1480 and 1491B on the gate bus trench 1475, as shown in FIG. 21I.

Figure 22A:
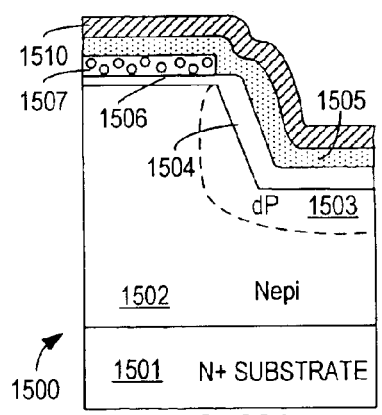
FIGS. 22A to 22L are cross sectional views illustrating alternative process steps for wide trench fill and buried polysilicon gate bus formation including embedded silicide, FIG. 22A illustrating a wide trench (bus area) after oxidation, a first polysilicon (lining) deposition, and a high temperature metal deposition, FIG. 22B illustrating a high-temperature metal etch-back, FIG. 22C illustrating a second polysilicon (sealant) deposition, FIG. 22D illustrating CMP planarization of a gate bus, FIG. 22E illustrating narrow trench mask definition and trench etching, FIG. 22F illustrating thick bottom oxide deposition, FIG. 22G illustrating a third polysilicon (narrow trench lining) deposition followed by high temperature metal deposition, FIG. 22H illustrating a high temperature metal etch-back and a fourth polysilicon deposition (narrow trench sealant), FIG. 22I illustrating CMP planarization, FIG. 22J illustrating gate etch-back and top dielectric deposition, CMP and/or etch-back planarization, and over etch, FIG. 22K illustrating nitride lift-off, and FIG. 22L illustrating a gate contact mask and etching, TiN barrier metal, Al—Cu—Si thick metal, metal mask and etching.
Figure 22B:
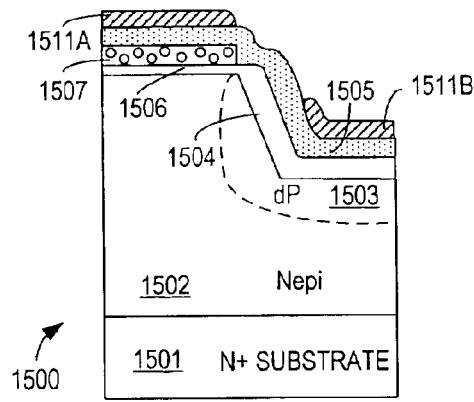
Figure 22C:
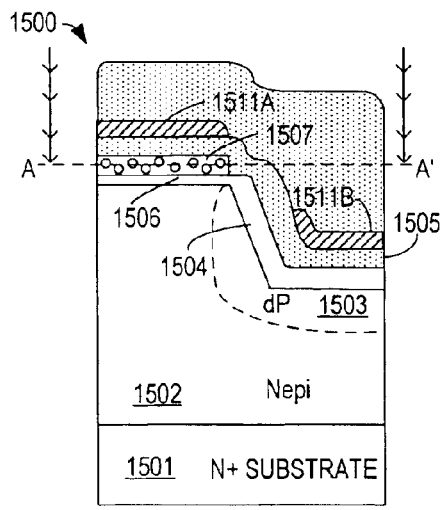
Figure 22D:
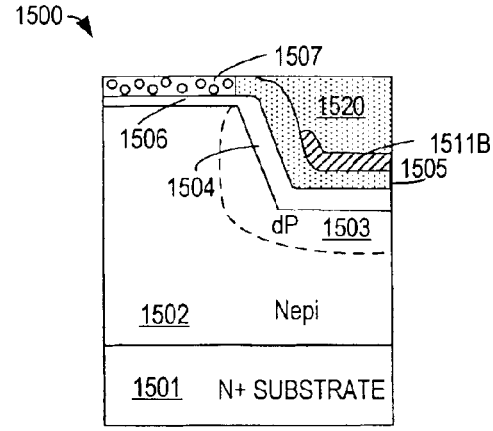

Alternatively, in device 1500 of FIG. 22A, wide gate bus trench can be oxidized to form lining oxide 1504, followed by a first polysilicon deposition 1505, and a high temperature metal deposition 1510. Metal 1510 is then dipped in acid to remove metal from the trench sidewall, leaving metal 1511B at the bottom of the trench and 1511A on the top of the structure as shown in FIG. 22B. Next a second polysilicon is deposited in FIG. 22C, followed by CMP planarization to form a planarized gate bus containing embedded high temperature metal or silicide 1511B encased by polysilicon 1505 and 1520 shown in FIG. 22D.

Figure 22E:
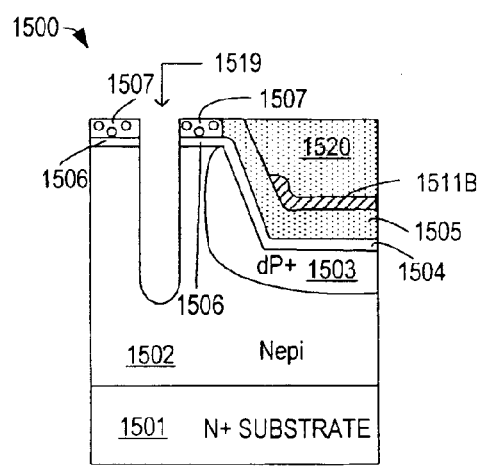
Figure 22F:
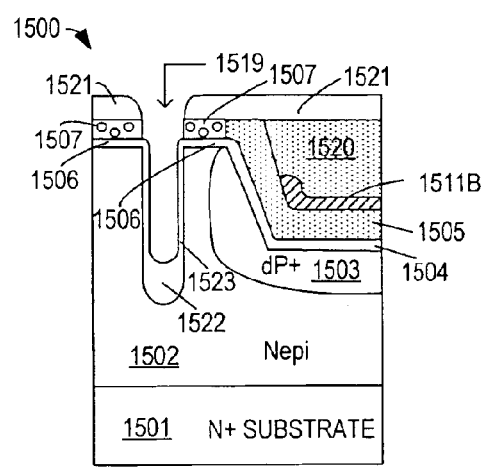
Figure 22G:
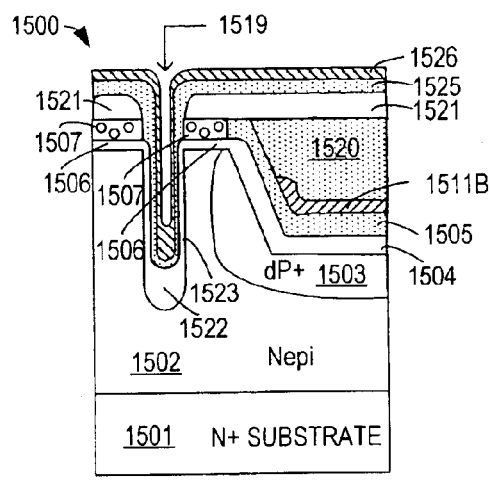
Figure 22H:
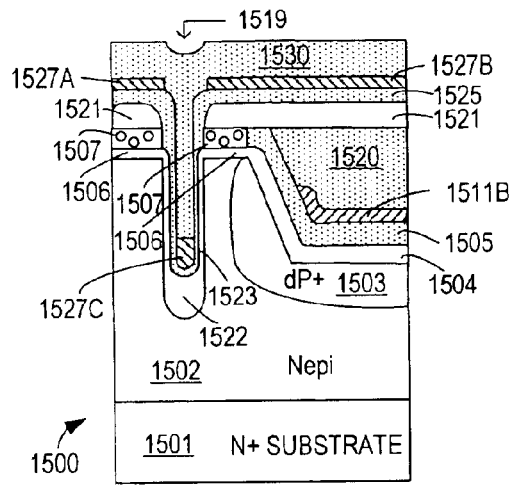
Figure 22I:
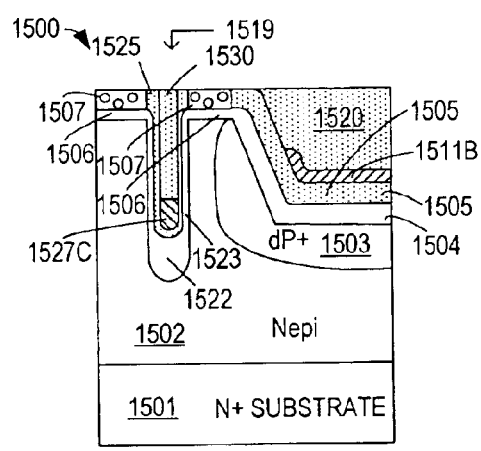
Figure 22J:
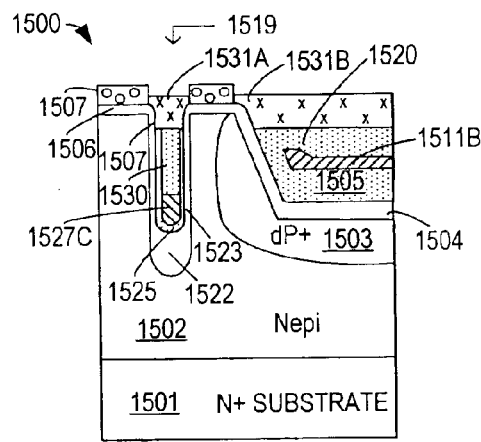
Figure 22K:
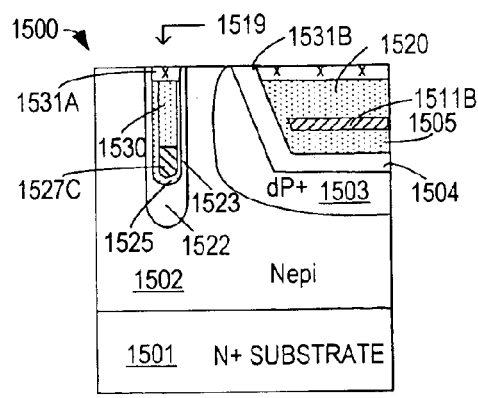
Figure 22L:
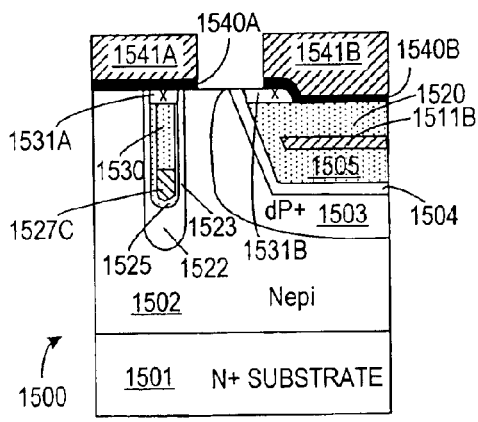

In FIG. 22E, narrow trenches 1519 are next formed, followed by thick bottom oxide 1522 formation in FIG. 22F, a third polysilicon 1525 deposition and high temperature metal 1526 deposition in FIG. 22G, and a fourth polysilicon in FIG. 22H. Planarization using CMP next occurs as shown in FIG. 22I, followed by polysilicon etch-back and dielectric capping and planarization in FIG. 22J. Silicon nitride 1507 is removed to facilitate mesa contacts in FIG. 22K. Fabrication is completed by a masked contact etch to contact the wide gate bus along with barrier metal and metal deposition and masking to produce the device shown in FIG. 22L. While complex in its fabrication and relatively expensive to make compared to the other devices described in accordance with this invention, device 1500 of FIG. 22L allows completely independent control and adjustment of the gate bus and active gate structures.

Figure 23A:
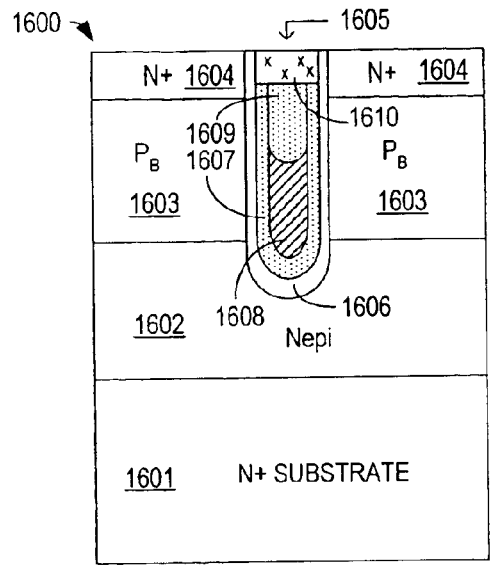
FIGS. 23A to 23H are cross sectional views of trench gated MOSFET cells having embedded silicide gate, FIG. 23A illustrating a cell without thick bottom oxide but with silicide enclosed by polysilicon, FIG. 23B illustrating a cell with thick bottom oxide in trench and silicide enclosed by polysilicon, FIG. 23C illustrating a cell without thick bottom oxide but with a gate oxide lined by polysilicon to prevent direct contact to embedded metal, FIG. 23D illustrating a cell with thick bottom oxide and gate oxide lined by polysilicon to prevent direct contact to embedded metal, FIG. 23E illustrating a cell without thick bottom oxide but with a bamboo (layered) gate with embedded metal at trench bottom, polysilicon in gate/channel region, and a dielectric cap (no polysilicon sealer to prevent direct contact to embedded metal), FIG. 23F illustrating a cell with thick bottom oxide, a bamboo (layered) gate with embedded metal at trench bottom, polysilicon in gate/channel region and dielectric cap (no polysilicon sealer to prevent direct contact to embedded metal), FIG. 23G illustrating a cell without thick bottom oxide but with an alternative bamboo (layered) gate with polysilicon in gate/channel region, embedded metal above polysilicon gate, and a dielectric cap (no polysilicon sealer to prevent direct contact to embedded metal), and FIG. 23H illustrating a cell with thick bottom oxide, the alternative bamboo (layered) gate with polysilicon in gate/channel region, embedded metal above polysilicon gate, and dielectric cap (no polysilicon sealer to prevent direct contact to embedded metal).
Figure 23B:
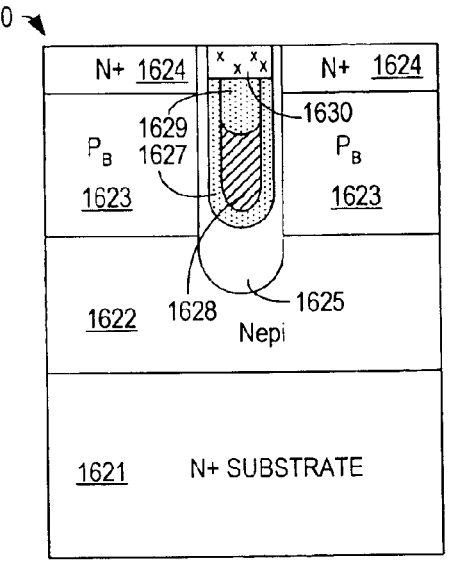

FIGS. 23A to 23H illustrate some variants of a trench gate with embedded high temperature metal or silicide. In FIG. 23A, device 1600 includes trench 1605 with uniform gate oxide 1606, embedded metal 1608 completely enclosed by polysilicon layers 1607 and 1609. This approach prevents any risk of metal contamination to gate oxide quality but requires two polysilicon depositions. In FIG. 23B, device 1620 includes a trench gate with a thick bottom oxide 1625, gate oxide 1620, and embedded metal 1628 completely enclosed by polysilicon layers 1627 and 1629. This approach also prevents any risk of metal contamination to gate oxide quality and requires two polysilicon depositions as well as a thick bottom oxide deposition.

Figure 23C:
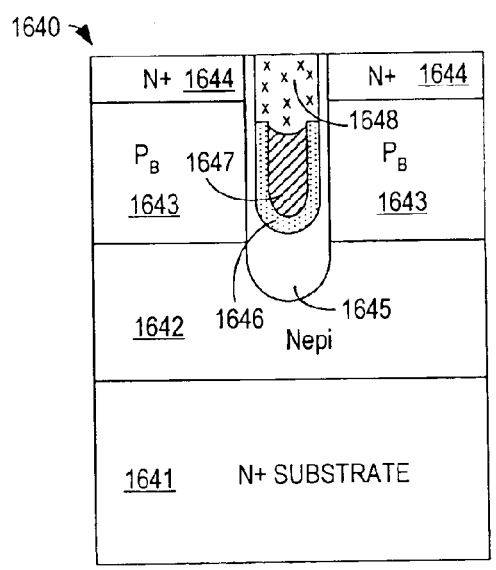
Figure 23D:
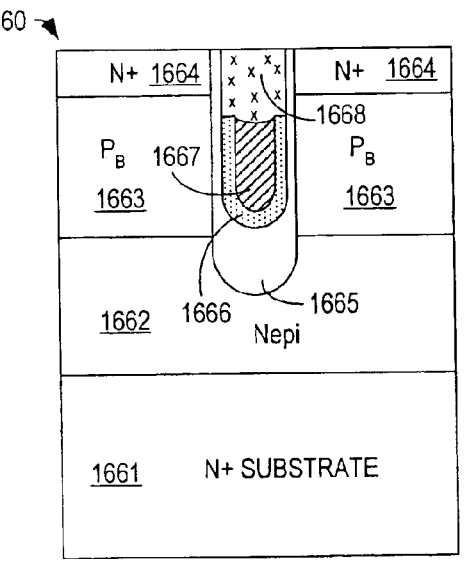

In FIG. 23C, device 1640 includes trench gate with uniform gate oxide 1645, embedded metal 1647 enclosed below by polysilicon layer 1646 but only sealed by glass 1648 on top. This approach reduces any risk of metal contamination to gate oxide quality (because of the polysilicon lining) but does not eliminate it. Device 1660 in FIG. 23D is the thick bottom oxide version of device 1640 with thick bottom oxide 1665, lining polysilicon 1666 and embedded metal 1667, but only a dielectric cap 1668 to seal the metal. This approach reduces the risk of metal contamination to gate oxide quality (because of the polysilicon lining) but does not eliminate it.

Figure 23E:
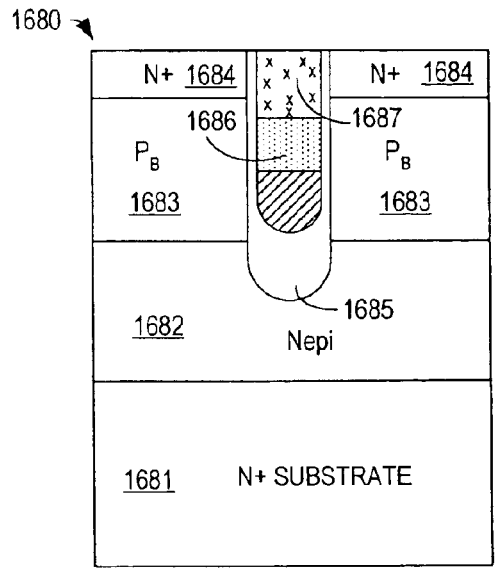

In FIG. 23E, device 1680 allows a high temperature metal or silicide to come in direct contact with the gate oxide 1685. Using this structure requires lower temperature processing in all subsequent steps to prevent metal migration into the gate oxide. The embedded metal 1688 is located at the bottom of the trench and capped by polysilicon layer 1686. The metal 1688 should not overlap the p-type body region 1683 or the threshold of the device may vary significantly (since metal has a different work function than doped polysilicon does).

Figure 23F:
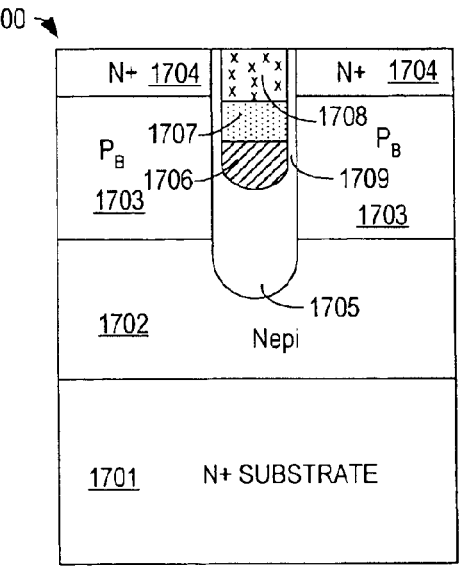

In FIG. 23F, device 1700 also allows a high temperature metal or silicide to come in direct contact with the gate oxide 1709 but not with the bottom of the trench (since thick bottom oxide 1705 protects the trench bottom). Using this structure requires lower temperature processing in all subsequent steps to prevent metal migration into the gate oxide. The embedded metal 1706 is located below the body and on top of the thick bottom oxide 1705 and is capped by polysilicon layer 1707. The metal 1706 should not overlap the p-type body region 1703 or the threshold of the device may vary significantly (since metal has a different work function than doped polysilicon does).

Figure 23G:
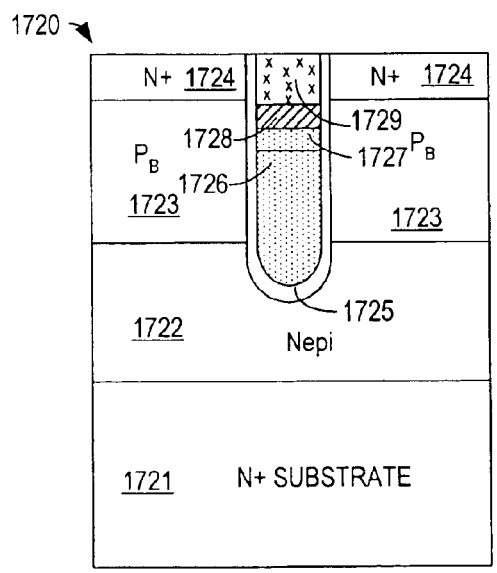
Figure 23H:
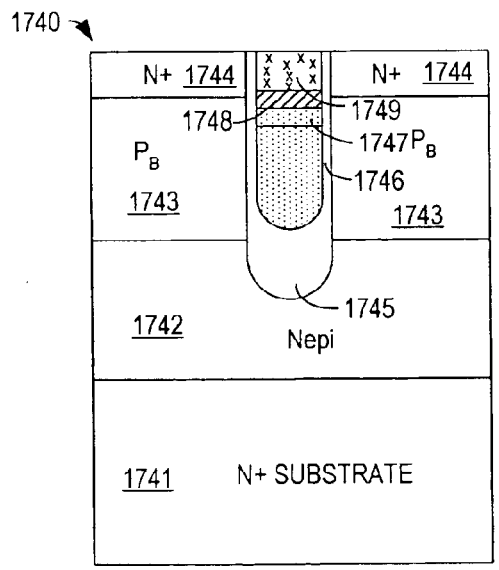

In FIG. 23G, device 1720 also allows a high temperature metal or silicide to come in direct contact with the gate oxide 1725, but only at the top of the trench. Using this structure requires lower temperature processing in all subsequent steps to prevent metal migration into the gate oxide. The embedded metal 1728 is located above the body 1723 and on top of the polysilicon gate 1727. Only dielectric layer 1729 caps the metal 1728. The metal 1728 should not overlap the p-type body region 1723 or the threshold of the device may vary significantly (since metal has a different work function than doped polysilicon does). Device 1740 in FIG. 23H is similar to device 1720 except that the trench includes thick bottom oxide 1745.

Figure 24:
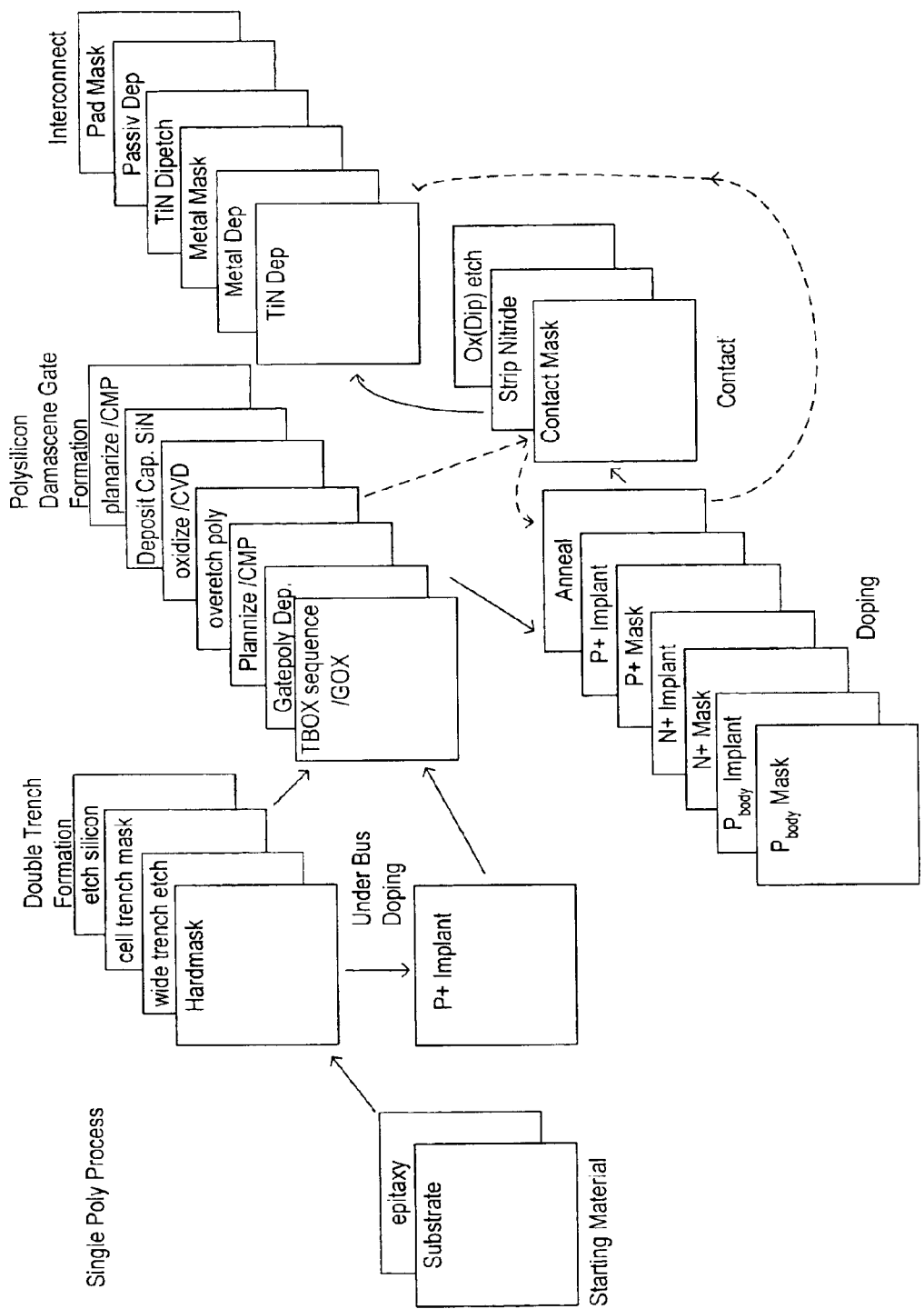
FIG. 24 is a flow chart of processes for fabrication of variants of trench gate MOSFET with a wide buried gate bus and narrow trench gates.
Figure 25:
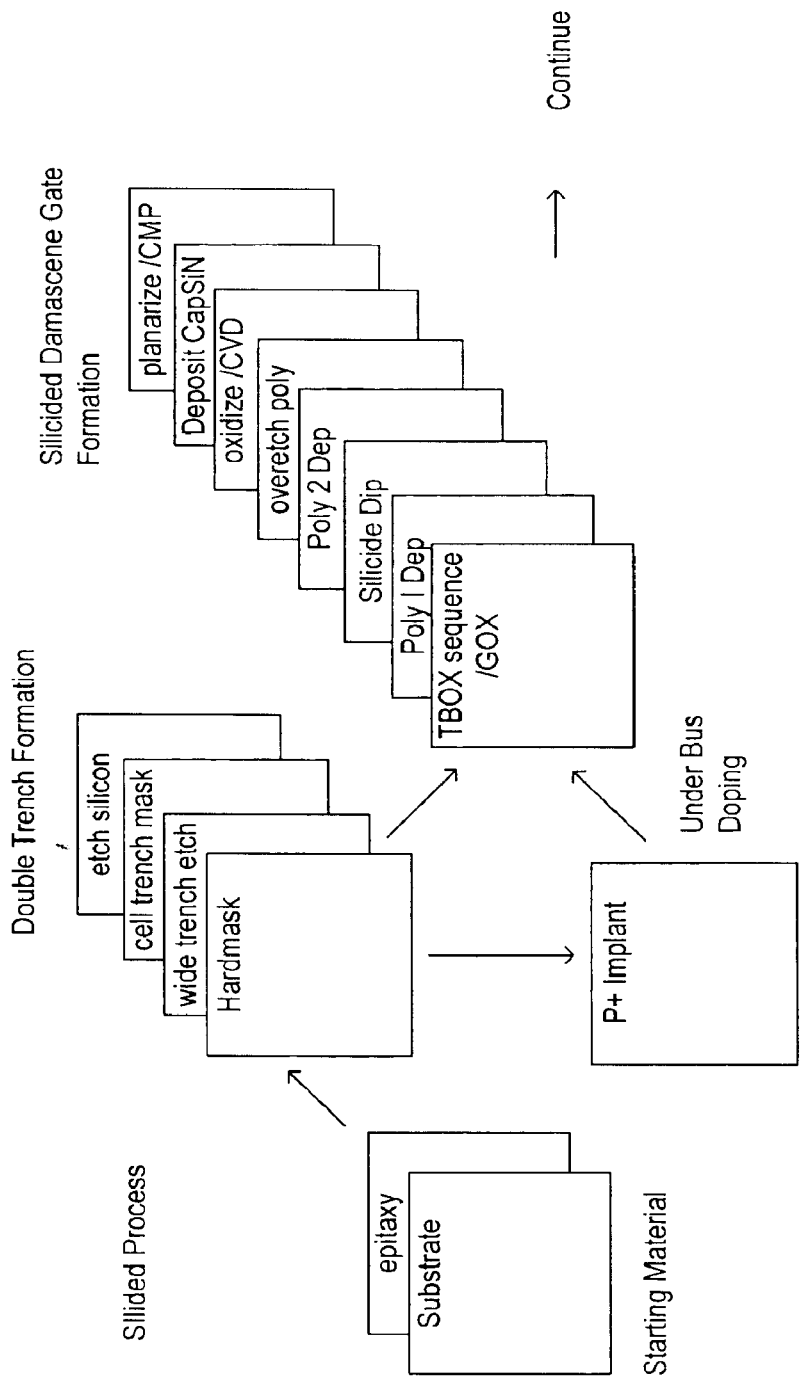
FIG. 25 is a flow chart of processes for fabrication of variants of trench gate MOSFETs with embedded silicide trench gates and/or a silicided buried gate bus.
Figure 26:
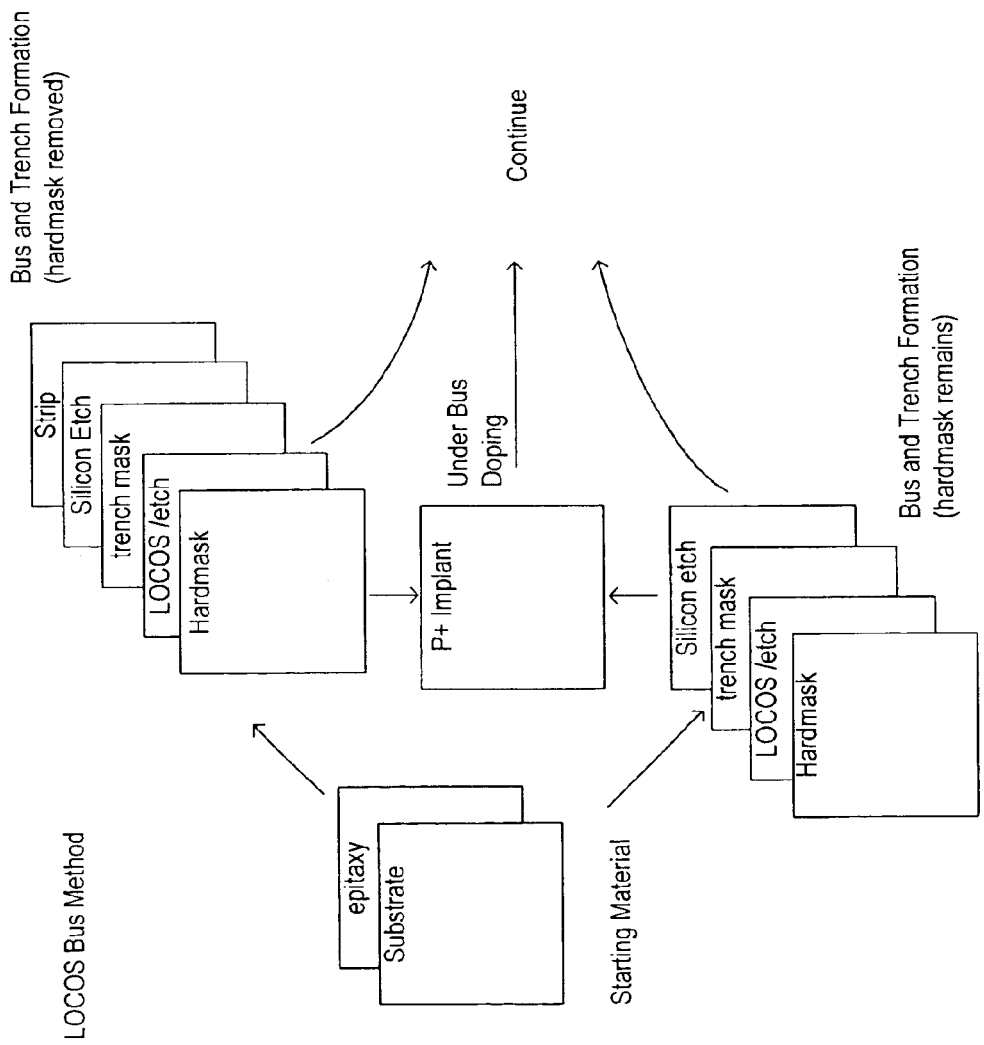
FIG. 26 is a flow chart of processes used to produce a wide buried gate bus using etched LOCOS technique.
Figure 27:
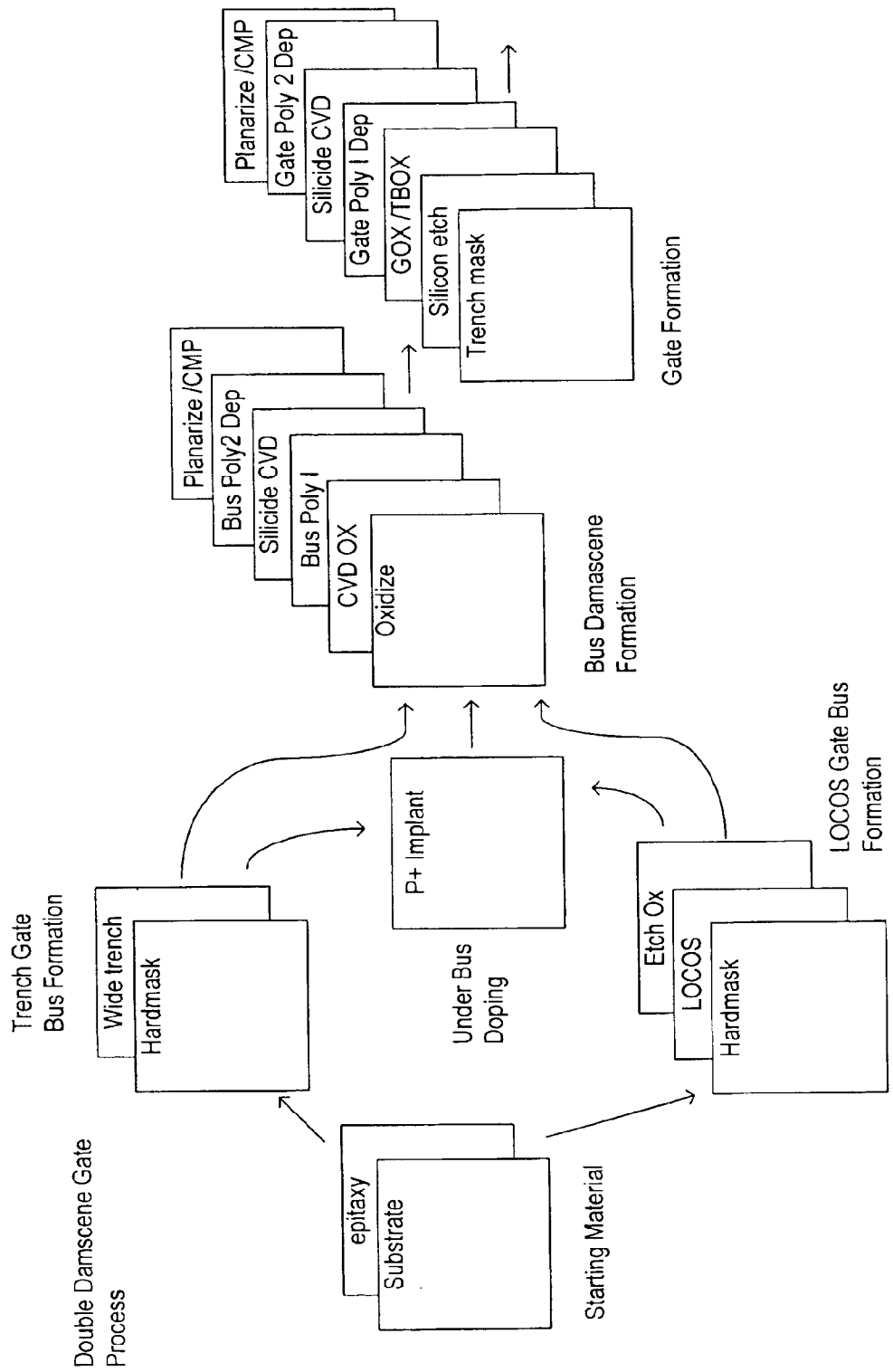
FIG. 27 is a flow chart of processes used to produce gate structures including metal/silicide to improve conductivity.

FIG. 24 illustrates some various process flow sequences used to fabricate devices shown in FIGS. 11A to 11Q, FIGS. 13A to 13G, FIGS. 14A to 14P and FIGS. 15A to 15I, and possible variants thereof. These devices do not include silicided gates. FIG. 25 illustrates the modified process flows needed to embed metal into the trench gate and gate bus structures. FIG. 26 illustrates the process flow variations used to form the shallow wide gate bus trench using LOCOS field oxidation techniques. FIG. 27 illustrates process flows for fabrication of devices having damascene gate structures including metal or silicide as illustrated in FIGS. 22A to 22L and 23A to 23H.

The processes and devices described herein are not limited to N-channel devices. To those skilled in the art, it is well known that any vertical MOSFET N-channel process can be converted to P-channel by swapping P-type and N-type dopants, and adjusting for implant range statistics with implant energies. The structures and methods of forming a trench gate MOSFET with a planarized gate bus are therefore applicable to both N-channel and P-channel devices.

What is claimed is:

1. A power MOSFET comprising:
   a substrate comprising a first trench extending from a top surface of the substrate;
   a source region, a channel region, and a drain region in the substrate and arranged vertically along at least a portion of a wall of the first trench;
   an insulating layer lining the wall of the first trench; and
   a gate structure comprising a metal/silicide region in the first trench and a silicon layer between the metal/silicide region and the insulating layer.

2. The power MOSFET of claim 1, wherein the substrate further comprises a second trench.

3. The power MOSFET of claim 2, wherein the metal/silicide region and a polysilicon region extend continuously from the second trench into the first trench.

4. The power MOSFET of claim 1, wherein the silicon layer surrounds the metal/silicide region so that the metal/silicide region is sealed at a top of the first trench and a bottom of the first trench.

5. The power MOSFET of claim 1, wherein the silicon layer comprises polysilicon.

6. A method for fabricating a power MOSFET comprising:
   forming a first trench in a substrate;
   forming an insulating layer on walls of the first trench;
   depositing a first silicon layer that lines the first trench;
   depositing a metal layer on the first silicon layer in the first trench;
   depositing a second silicon layer on the metal layer so that the first and second silicon layers surround the metal layer; and
   doping the substrate adjacent the first trench to form a source region, a channel region, and a drain region that are vertically aligned along a wall of the first trench.

7. The method of claim 6, wherein the first silicon layer comprises a conformal polysilicon layer that is between 200 Å and 2000 Å thick.

8. The method of claim 6, wherein the metal layer comprises a metal selected from a group consisting of tungsten, platinum, titanium, chromium, and cobalt.

9. The method of claim 6, wherein the metal layer is between 100 Å and 2000 Å thick.

10. The method of claim 6, further comprising removing a metal from the walls of the first trench, wherein a portion of the metal layer remains at a bottom of the first trench.

11. The method of claim 6, depositing the second silicon layer overflows the first trench.

12. The method of claim 6, further comprising chemical mechanical polishing to remove the second silicon layer where the second silicon layer overflows the first trench.

13. The method of claim 12, wherein the chemical mechanical polishing further removes portions of the metal layer outside the trench.

14. The method of claim 6, further comprising heating to react the metal layer with the first and second silicon layers to form a silicide.

15. The method of claim 6, wherein the first silicon layer and the second silicon layer comprise polysilicon.

* * * * *